US012699373B1

(12) United States Patent

Galvin

(10) Patent No.: US 12,699,373 B1
(45) Date of Patent: Aug. 4, 2026

(54) SYSTEM AND METHOD FOR ACTIVE NANOSCALE ENERGY REGULATION PANELS

(71) Applicant: AtomBeam Technologies Inc., Moraga, CA (US)

(72) Inventor: Brian Galvin, Silverdale, WA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 19/574,908

(22) Filed: Mar. 23, 2026

Related U.S. Application Data

(63) Continuation-in-part of application No. 19/458,428, filed on Jan. 23, 2026, and a continuation-in-part of application No. 19/455,832, filed on Jan. 22, 2026.

(60) Provisional application No. 63/941,632, filed on Dec. 15, 2025, provisional application No. 63/933,237, filed on Dec. 7, 2025, provisional application No. 63/933,225, filed on Dec. 7, 2025, provisional application No. 63/931,463, filed on Dec. 4, 2025, provisional application No. 63/930,614, filed on Dec. 3, 2025, provisional application No. 63/928,801, filed on Dec. 1, 2025, provisional application No. 63/927,212, filed on Nov. 28, 2025, provisional application No. 63/927,196, filed on Nov. 28, 2025, provisional application No. 63/926,413, filed on Nov. 26, 2025, provisional application No. 63/926,417, filed on Nov. 26, 2025, provisional application No. 63/926,411, filed on Nov. 26, 2025, provisional application No. 63/926,434, filed on Nov. 26, 2025, (Continued)

(51) Int. Cl.
*G05B 19/042* (2006.01)
*H05K 1/181* (2026.01)
*H05K 7/02* (2006.01)

(52) U.S. Cl.
CPC ........... *G05B 19/042* (2013.01); *H05K 1/181* (2013.01); *H05K 7/02* (2013.01); *G05B 2219/2639* (2013.01)

(58) Field of Classification Search
CPC .......... G05B 19/042; G05B 2219/2639; H05K 1/181; H05K 7/02
USPC ........................................................ 700/297
See application file for complete search history.

(56) References Cited

U.S. PATENT DOCUMENTS

| | | | | |
|---|---|---|---|---|
| 2025/0318310 A1* | 10/2025 | Sesta | ........................ | H10F 39/18 |
| 2026/0135046 A1* | 5/2026 | Timme | ................. | H01H 1/0036 |

* cited by examiner

*Primary Examiner* — Michael J Brown
(74) *Attorney, Agent, or Firm* — GALVIN PATENT LAW LLC; Brian R. Galvin; Alec L. Perry

(57) ABSTRACT

A system comprises hierarchically organized microcells arranged in zones, tiles, and panels for energy regulation applications. Each microcell includes a substrate with surface features, an opposing membrane defining a maintained nanoscale gap, activation electrodes, and gap-control elements. Zone controllers coordinate subsets of microcells. Tile controllers manage multiple zones with local electronics. Panel controllers regulate system operation through coordinated control. Fault detection isolates malfunctioning elements while maintaining system operation. Panels are configured for architectural integration into walls, ceilings, or floors. The hierarchical architecture enables scalable deployment through tile replication and modular expansion. The system operates through controlled activation of distributed microcells across maintained gaps. Specific performance depends on system configuration, operating conditions, and environmental factors.

12 Claims, 17 Drawing Sheets

Related U.S. Application Data provisional application No. 63/924,573, filed on Nov. 25, 2025, provisional application No. 63/924,600, filed on Nov. 25, 2025, provisional application No. 63/924,560, filed on Nov. 24, 2025.

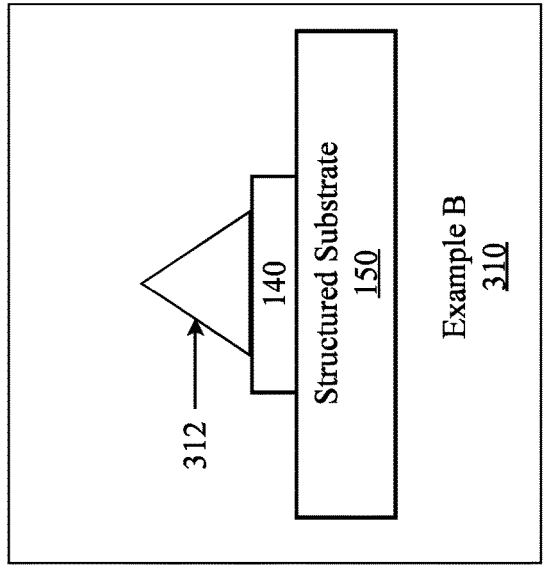
Structured Substrate
150
140
302
Example A
300
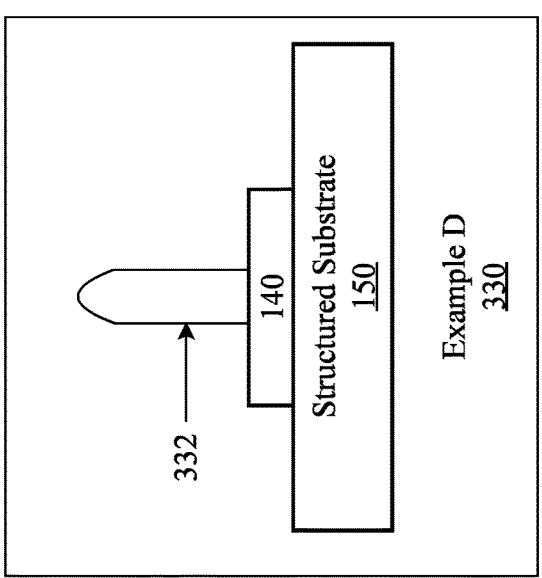
Structured Substrate
150
140
312
Example B
310
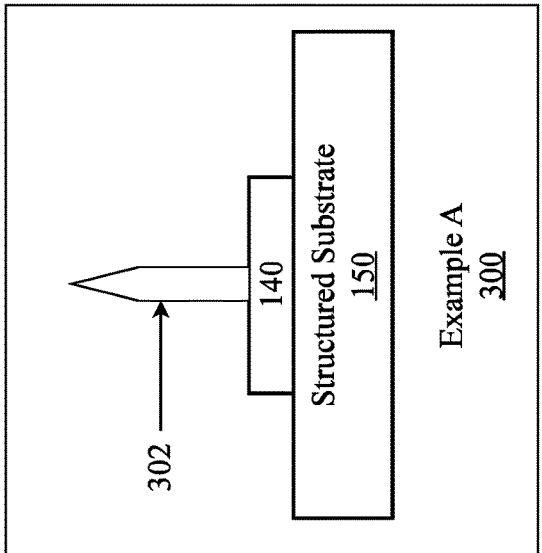
Structured Substrate
150
140
322
Example C
320
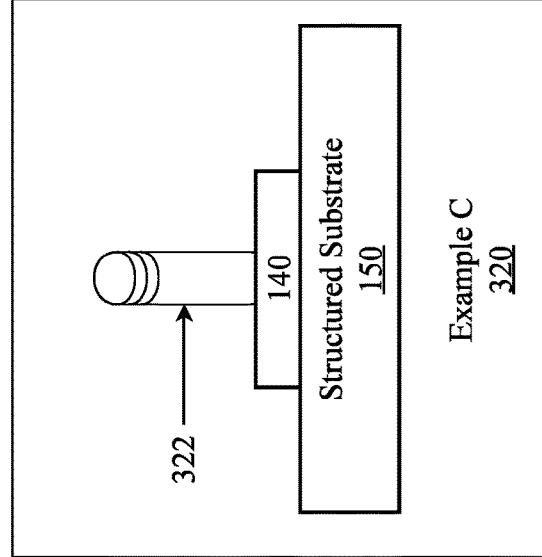
Structured Substrate
150
140
332
Example D
330
FIG. 3

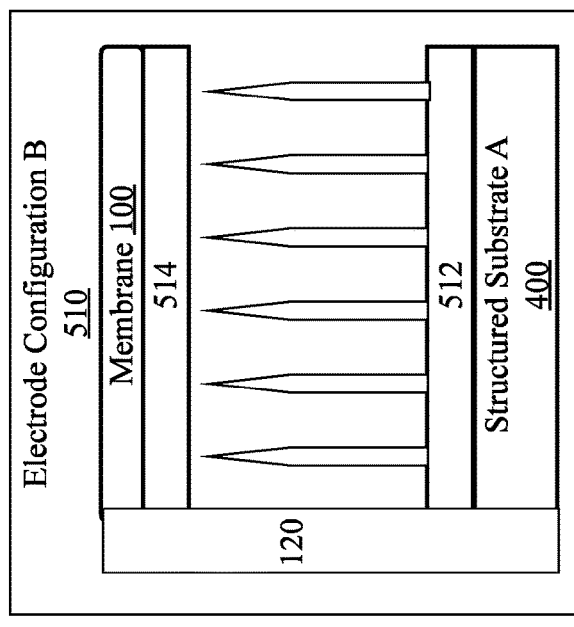
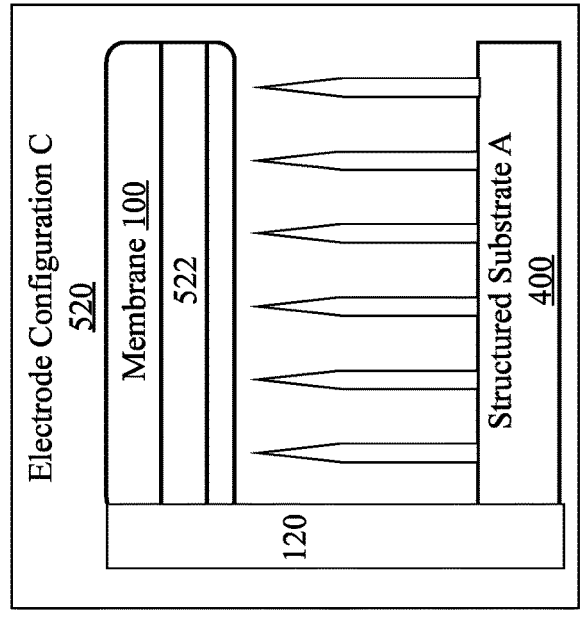
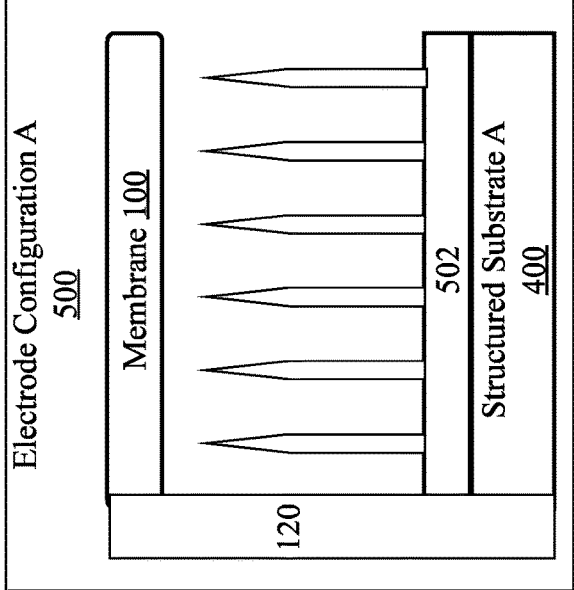
FIG. 5

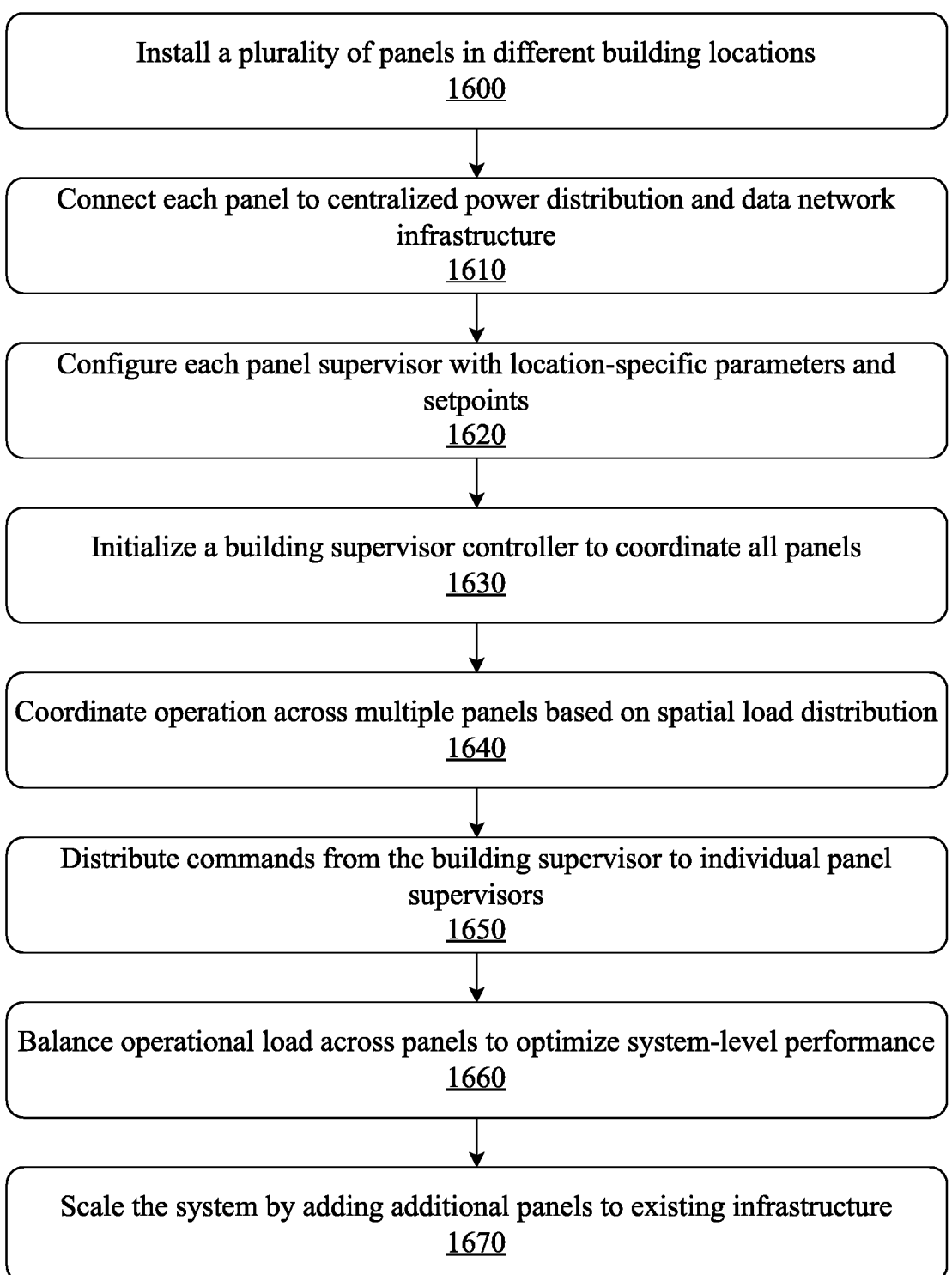

Install a plurality of panels in different building locations
1600

Connect each panel to centralized power distribution and data network infrastructure
1610

Configure each panel supervisor with location-specific parameters and setpoints
1620

Initialize a building supervisor controller to coordinate all panels
1630

Coordinate operation across multiple panels based on spatial load distribution
1640

Distribute commands from the building supervisor to individual panel supervisors
1650

Balance operational load across panels to optimize system-level performance
1660

Scale the system by adding additional panels to existing infrastructure
1670

FIG. 16

SYSTEM AND METHOD FOR ACTIVE NANOSCALE ENERGY REGULATION PANELS

CROSS-REFERENCE TO RELATED APPLICATIONS

Priority is claimed in the application data sheet to the following patents or patent applications, each of which is expressly incorporated herein by reference in its entirety:

Ser. No. 19/458,428
Ser. No. 19/455,832
63/941,632
63/933,237
63/933,225
63/930,614
63/928,801
63/927,212
63/927,196
63/926,434
63/926,417
63/926,413
63/926,411
63/924,573
63/924,600
63/924,560
63/931,463

BACKGROUND OF THE INVENTION

Field of the Art

The present invention relates to nanoscale electromechanical and electromagnetic systems, and more particularly to devices and methods for actively modulating energy exchange across a controlled nanometer-scale gap.

Discussion of the State of the Art

Modern nanoscale electromechanical and electromagnetic systems operate in environments where thermal, radiative, and near-field electromagnetic fluctuations impose fundamental limits on stability, efficiency, and device performance. Despite improvements in materials, fabrication precision, shielding, and thermal management, conventional platforms remain constrained by intrinsic electromagnetic noise, residual thermal occupation, and vacuum-level field fluctuations that cannot be eliminated through established cooling or filtering approaches. This background provides context for the disclosed nanoscale energy-exchange architectures by outlining the limitations of existing strategies and the need for new mechanisms capable of actively modulating energy flow across nanometer-scale boundaries.

Conventional approaches rely on passive structures-such as thermal interfaces, electromagnetic shields, metamaterial layers, and near-field suppressors- or active subsystems including electrostatic actuators, radiative coolers, and complex thermal management stacks. These techniques can attenuate specific classes of noise or heat but do not provide a mechanism for actively extracting energy from a confined electromagnetic or thermal environment. Their effectiveness is ultimately bounded by material losses, thermodynamic constraints, and the inherent properties of vacuum electromagnetic modes.

Even advanced cryogenic systems, high-isolation packaging, and near-zero-loss resonant structures exhibit nonzero thermal photon occupation and persistent background fluctuations at operational frequencies. Increasing cooling capacity requires progressively larger infrastructure, while more elaborate shielding architectures primarily redirect or attenuate unwanted energy rather than remove it from the local environment. As a result, nanoscale devices often operate near unavoidable noise floors that restrict performance, lifetime, efficiency, or sensitivity.

Emerging experimental results in systems featuring nanometer-scale gaps, sharp geometries, and strong near-field confinement have revealed anomalous force and energy-interaction behaviors not fully captured by standard Casimir, electrostatic, or radiative transfer models. While these observations do not establish a particular mechanism, they suggest that engineered nanoscale structures may access interaction regimes where energy exchange can be modified in ways not achievable through conventional thermal or electromagnetic techniques.

What is needed is a device architecture capable of actively modulating energy exchange using engineered geometries, controlled gaps, and applied electromagnetic fields, to reduce local energy density, redistribute unwanted energy, or condition the near-field environment.

SUMMARY OF THE INVENTION

Accordingly, the inventor has conceived and reduced to practice a system and method for active nanoscale energy regulation panels. In representative embodiments, the device includes a substrate bearing an array of engineered nanoscale features, such as but not limited to posts, pillars, cones, nanowires, or sharpened edges, positioned beneath a membrane or plate to establish a maintained nanometer-scale gap. Activation electrodes are arranged on or near the substrate or opposing surface to apply time-varying electromagnetic fields across the gap, and a gap-control subsystem comprising sensors, actuators, and control electronics maintains the separation with high precision during operation.

When activated, the applied electromagnetic fields and induced membrane motion modulate the distribution of energy within a gap region. This modulation results in a net reduction of energy density inside the confined cavity. The device achieves this effect without requiring a conventional thermal pathway, external heat sink, or refrigerant cycle, instead relying on the combination of its engineered geometry, maintained gap, and activation conditions to redistribute energy away from the target region.

The active nanoscale energy-exchange device may be implemented as a single cavity or integrated into arrays or zoned panels for larger-scale or spatially targeted energy conditioning. Multiple devices can be coordinated to achieve localized energy reduction in selected regions of an electronic, photonic, mechanical, or quantum system. System-level configurations may incorporate one or more active layers into a package, module, or enclosure to provide fine-grained control of the energy environment at specific locations.

The invention encompasses all active embodiments that utilize a maintained nanogap, engineered nanoscale feature geometry, activation electrodes, and controlled field modulation to produce a measurable reduction of energy within the nanogap region.

According to a preferred embodiment, a hierarchical energy regulation system comprising: a plurality of microcells organized into a plurality of zones, wherein each microcell comprises: a substrate with a plurality of surface features; an opposing membrane defining a gap relative to the substrate; activation electrodes configured to generate activation fields across the gap; and gap-control elements configured to maintain the gap at a target value; a plurality of zone controllers, wherein each zone controller coordinates operation of microcells within a respective zone; a plurality of tiles, each tile comprising: multiple zones under coordinated control; a tile controller in communication with zone controllers within the tile; a power interface; and a data interface; a support structure to which the plurality of tiles are mounted; and a panel supervisor controller in communication with tile controllers of the plurality of tiles, the panel supervisor controller configured to coordinate operation of all tiles within the panel; wherein control responsibilities are partitioned across hierarchical levels comprising a microcell level, a zone level, a tile level, and a panel level, each hierarchical level operating at a distinct timescale, is disclosed.

According to another preferred embodiment, a method of operating a hierarchical energy regulation system, the method comprising: organizing a plurality of microcells into a plurality of zones, wherein each microcell comprises a substrate with a plurality of surface features, an opposing membrane defining a gap relative to the substrate, activation electrodes, and gap-control elements; assembling a plurality of tiles mounted to a support structure, wherein each tile comprises multiple zones under coordinated control, a tile controller, a power interface, and a data interface; partitioning control responsibilities across hierarchical levels comprising a microcell level, a zone level, a tile level, and a panel level, wherein each hierarchical level operates at a distinct timescale; establishing target gap values for microcells within the plurality of zones; engaging gap-control elements at the microcell level to maintain gaps at the target values through feedback control; applying electrical signals to the activation electrodes to generate activation fields across the gaps; coordinating operation across the hierarchical levels by: executing microcell-level control at a first timescale; executing zone-level coordination at a second timescale slower than the first timescale; executing tile-level management at a third timescale slower than the second timescale; and executing panel-level supervision at a fourth timescale slower than the third timescale; establishing bidirectional data flow through the hierarchy, wherein measurements propagate upward from the microcell level to the panel level and commands propagate downward from the panel level to the microcell level; and maintaining system operation through coordinated control across all hierarchical levels, is disclosed.

BRIEF DESCRIPTION OF THE DRAWING FIGURES

FIG. 3 is a detailed cross-sectional illustration showing exemplary configurations of substrate posts and their relationship to activation electrodes within structured substrate.

FIG. 5 illustrates cross-sectional views of three exemplary electrode configurations demonstrating architectural options for positioning activation electrodes to generate activation fields across gap.

FIG. 16 is a flow diagram illustrating an exemplary method for deploying and operating multiple panels under building-level coordination.

DETAILED DESCRIPTION OF THE INVENTION

Figure 1:
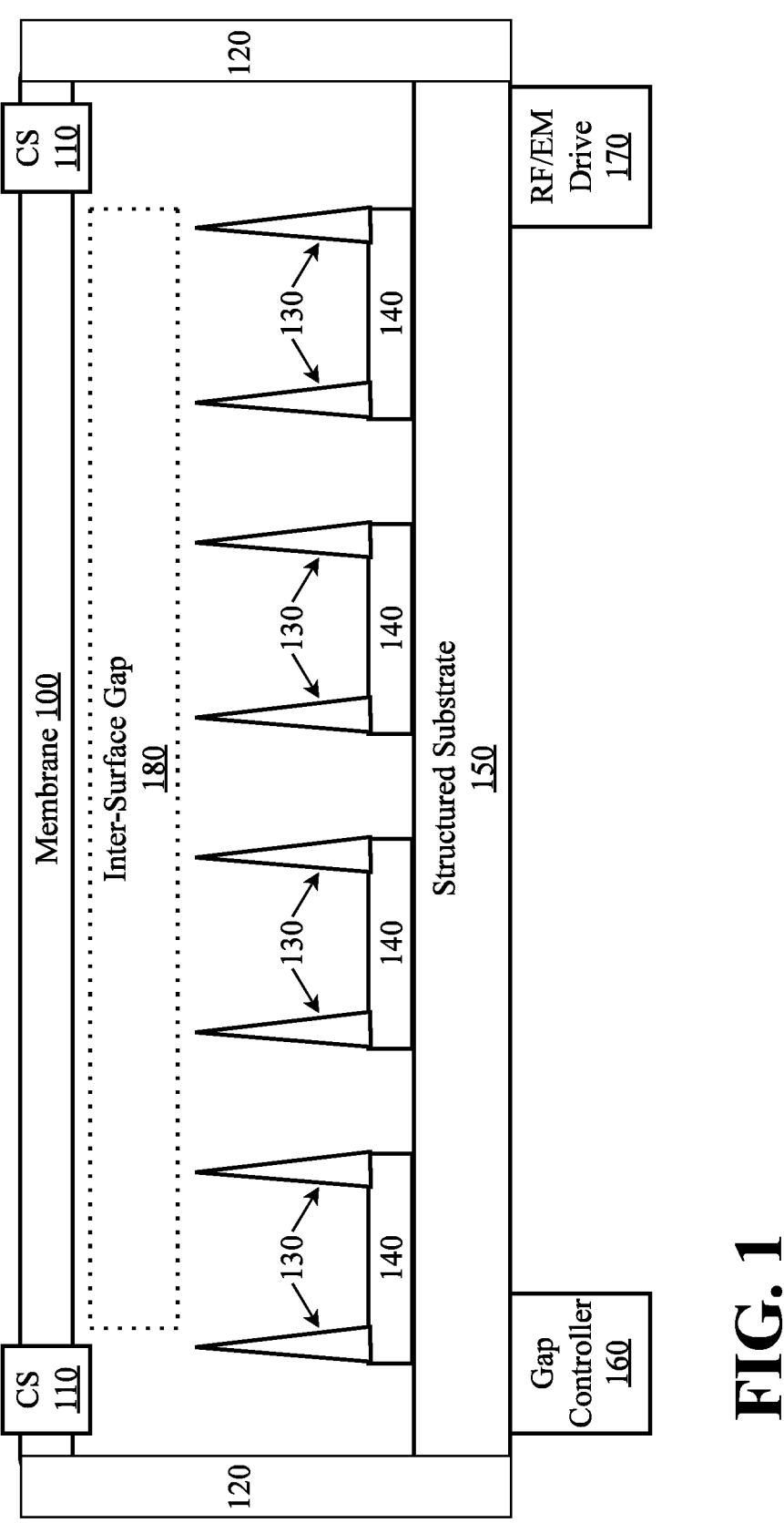
FIG. 1 is a block diagram illustrating an exemplary system architecture of an active energy-exchange device for thermal management applications.

The inventor has conceived, and reduced to practice a system and method for active nanoscale energy regulation panels. The system disclosed comprises hierarchically organized microcells arranged in zones, tiles, and panels. At the foundational level, each microcell comprises a substrate incorporating surface features, an opposing membrane positioned to define a maintained gap, activation electrodes, and gap-control elements.

The substrate includes an array of surface features with nanoscale dimensions. Surface features may include posts, pillars, cones, ridges, or other geometries extending toward the opposing membrane. Feature dimensions may range from tens of nanometers to micrometers depending on fabrication method and application requirements.

The opposing membrane is positioned above the substrate features to establish a gap. Gap spacing is maintained through active feedback control during operation. When activation electrodes are energized, electromagnetic fields are applied across the maintained gap. The system may be operated to affect thermal conditions in an adjacent environment.

In representative embodiments, the opposing membrane comprises a thin film spanning across the substrate. Membrane materials may include silicon nitride, silicon carbide, metalized films, composite laminates, or other materials providing suitable mechanical properties. Membrane thickness may range from approximately 50 nanometers to several hundred nanometers, though other thicknesses may be employed depending on structural requirements and fabrication constraints.

The gap between membrane and substrate features may range from approximately 1 nanometer to 1000 nanometers. Gap spacing may be substantially uniform across the array, intentionally varied in different regions, or graded to produce spatial variations. The specific gap value is maintained through feedback control as described below. Maintaining stable gap spacing during operation requires active feedback control. The gap-control subsystem comprises sensors, actuators, and control electronics. Sensors measure gap spacing and may include capacitive displacement sensors, optical or interferometric sensors, piezoresistive sensors, or other sensor types capable of nanometer-scale resolution. Sensor signals are provided to a controller that computes position adjustments needed to maintain the gap at a target value.

Actuators adjust the relative position between membrane and substrate in response to controller commands. Actuators may include piezoelectric actuators, electrostatic actuators, thermal actuators, magnetostrictive actuators, or other actuation mechanisms capable of nanometer-scale positioning. The controller implements feedback control algorithms such as proportional-integral-derivative (PID) control, adaptive control, or model-predictive control. Control loop rates may range from 100 Hz to 10 kHz depending on mechanical dynamics and required positioning bandwidth. Stable gap maintenance enables consistent system operation across varying conditions.

Activation electrodes are positioned on the substrate, membrane, or both surfaces to apply electromagnetic fields across the maintained gap. Electrode configurations may include continuous planar electrodes extending across the substrate area, patterned electrode arrays enabling spatial control, interdigitated electrode structures, or electrodes positioned adjacent to individual substrate features. Electrodes are connected to an electrical drive system that generates time-varying signals. Drive signals may include sinusoidal waveforms, pulsed signals, multi-frequency signals, or other waveform types. Operating frequencies may range from hundreds of hertz to tens of megahertz depending on system design and application requirements. Drive voltages may range from sub-volt to tens of volts depending on gap dimensions and desired field strength.

The drive system includes signal generation circuitry and power amplification stages to deliver signals at appropriate voltage and current levels. In systems with multiple electrode groups, the drive system may include switching or multiplexing to independently control different regions.

During operation, the gap-control subsystem maintains stable gap spacing while the drive system applies activation signals to the electrodes. Electromagnetic fields generated across the gap may induce mechanical deflection or oscillation of the membrane depending on membrane properties and activation parameters. The system operates to affect thermal conditions at surfaces adjacent to the gaps. Observable effects include changes in surface temperature, temperature gradients, or thermal response to applied loads. Specific thermal behavior depends on system configuration including gap dimensions, activation parameters, substrate and membrane materials, and environmental conditions.

Multiple microcells may be organized into zones comprising coordinated subsets operated under common control parameters. Multiple zones may be organized into tiles comprising local control electronics and physical mounting structures. Multiple tiles may be assembled into panels suitable for architectural integration. Zone-level controllers coordinate activation of microcells within a zone, implementing selective activation, parameter modulation, and fault detection. Tile-level controllers manage multiple zones, enforcing power budgets and synchronizing operation. Panel-level controllers regulate system operation to maintain environmental thermal setpoints. This hierarchical architecture enables scalable deployment from small arrays comprising tens of microcells to large panels comprising millions of microcells.

The system may be integrated into various configurations depending on application requirements. In architectural deployments, panels may be integrated into walls, ceilings, floors, or other building surfaces to provide thermal regulation of enclosed spaces. In electronic systems, smaller arrays may be positioned adjacent to heat-generating components. Panels include mounting features for attachment to support structures, electrical interfaces for power and data connectivity, and thermal interfaces positioned to affect adjacent environments. Multiple panels may be coordinated through higher-level supervisory controllers to manage thermal conditions across larger spaces or complex configurations.

The system described herein employs maintained nanoscale gaps, activation electrodes, gap-control feedback, and hierarchical organization to provide thermal management capability. The architecture enables scalable deployment through modular tile-based construction and hierarchical control. Specific thermal performance depends on system configuration, operating conditions, and environmental factors, and is subject to empirical characterization.

Definitions

As used herein, "microcell" refers to the smallest active unit in the system comprising a substrate with surface features, an opposing membrane defining a maintained gap, activation electrodes, and gap-control elements. Microcells operate as elementary contributors to aggregate thermal service when organized into larger assemblies.

As used herein, "zone" refers to a logical and physical grouping of multiple microcells that are operated together under coordinated control parameters. Zones provide an intermediate level of abstraction between individual microcells and larger structural units, enabling reduction of control complexity, spatial averaging of microcell behavior, isolation of faults, and localized thermal shaping.

As used herein, "tile" refers to a manufacturable and serviceable physical unit comprising a plurality of zones and their associated support structures. A tile may include local control electronics, power and data interfaces, and mechanical features for panel assembly. Tiles represent the primary building blocks for scaling the system to architectural dimensions.

As used herein, "panel" refers to an assembly of multiple tiles arranged to form a continuous or quasi-continuous thermal regulation surface. Panels may be integrated into walls, ceilings, floors, enclosures, or other building surfaces.

As used herein, "gap" or "maintained gap" refers to a controlled spacing between substrate features and an opposing membrane, maintained through active feedback control. The gap may be maintained in a range from approximately 1 nanometer to approximately 1000 nanometers or larger depending on application requirements.

As used herein, "substrate" or "structured substrate" refers to a substrate incorporating surface features such as posts, pillars, cones, nanowires, ridges, patterned films, or other geometries extending toward an opposing membrane. Features may have dimensions ranging from tens of nanometers to micrometers.

As used herein, "opposing surface" or "membrane" refers to a thin film, plate, or other structure positioned relative to substrate features to define the maintained gap. The opposing surface may be implemented as a suspended membrane, a rigid plate, or other configurations depending on system requirements.

As used herein, "activation electrodes" refers to conductive structures positioned on the substrate, opposing surface, or both, configured to receive electrical drive signals and generate electromagnetic fields across the maintained gap. Electrode configurations may include continuous planar electrodes, patterned electrode arrays, or interdigitated structures.

As used herein, "activation field" or "electromagnetic field" refers to time-varying electromagnetic fields generated across the maintained gap by activation electrodes. Fields may be generated using sinusoidal, pulsed, multifrequency, or other waveform types at frequencies ranging from hundreds of hertz to tens of megahertz or higher.

As used herein, "gap-control subsystem" refers to the combination of sensors, actuators, and control electronics used to maintain the gap at a target value during operation. The subsystem may include capacitive sensors, optical sensors, piezoresistive sensors, piezoelectric actuators, electrostatic actuators, or other sensing and actuation mechanisms capable of nanometer-scale positioning through feedback control.

As used herein, "zone-level controller" refers to control electronics that coordinate activation of multiple microcells within a zone, implementing selective activation, parameter modulation, and fault detection.

As used herein, "tile-level controller" refers to control electronics that manage multiple zones within a tile, enforcing power budgets, synchronizing zone operation, and aggregating sensing data.

As used herein, "panel-level controller" or "supervisory controller" refers to control electronics that regulate system operation to maintain environmental thermal setpoints, coordinate multiple tiles or panels, and interface with external systems or building management systems.

As used herein, "hierarchical control" refers to a control architecture partitioned across multiple organizational levels including microcell-level, zone-level, tile-level, and panel-level, with each level having distinct responsibilities and operating at different timescales.

Conceptual Architecture

FIG. 1 is a block diagram illustrating an exemplary system architecture of an active energy-exchange device for thermal management applications. Substrate 150 includes surface features in the form of posts 130 extending toward membrane 100. The gap 180 is maintained at a target separation through a gap-control subsystem comprising sensors 110, actuators 120, and gap controller 160.

Activation electrodes 140 are positioned on or within substrate 150 to apply electromagnetic fields across gap 180. An electrical drive system 170 provides time-varying signals to electrodes 140 with controllable frequency, amplitude, and waveform characteristics.

In operation, gap controller 160 receives measurements from sensors 110, computes position adjustments needed to maintain gap 180 at a target value, and commands actuators 120 accordingly. Drive system 170 applies activation signals across the maintained gap when the system is activated.

Posts 130 extend from the substrate surface toward membrane 100. Post geometries may include conical structures with tip radii ranging from nanometers to tens of nanometers, nanowire bundles with diameters ranging from tens to hundreds of nanometers, pyramidal structures with crystallographic facets, or mesa-type structures with flat or rounded top surfaces. The specific post geometry may be selected based on fabrication capabilities, mechanical requirements, or operational considerations.

Posts 130 are arranged in arrays across the surface of substrate 150. Pitch spacing between adjacent posts may range from tens of nanometers to tens of micrometers depending on desired array density and application requirements. Post density may be varied across the substrate surface to address non-uniform requirements. In some embodiments, posts are arranged in uniform periodic arrays with constant pitch in lateral directions. In other embodiments, spacing, height, or geometry may be intentionally varied across the surface.

Substrate 150 serves as the mechanical platform supporting posts 130 and may be fabricated from various materials. Substrate materials may include semiconductor wafers such as silicon or gallium arsenide, crystalline materials such as sapphire or quartz, ceramic materials such as alumina or aluminum nitride, or composite structures combining multiple materials. Substrate thickness may range from tens of micrometers to several millimeters depending on mechanical rigidity requirements and integration constraints.

Conductive routing networks are embedded within or on substrate 150 to distribute electrical signals from peripheral connection points to activation electrodes 140 across the active region. Routing networks may comprise metal traces patterned through photolithography, conductive vias through the substrate thickness, doped semiconductor regions, or multi-layer metallization schemes with insulating dielectric layers.

Activation electrodes 140 are conductive structures configured to receive electrical drive signals and generate electromagnetic fields across gap 180. Electrodes 140 may be configured in various architectures depending on desired field distribution and control requirements. In one configuration, electrodes 140 comprise a continuous conductive layer deposited on or within substrate 150 beneath posts 130, providing a common electrode across the active region. In another configuration, electrodes 140 are patterned as interdigitated structures with alternating electrode elements at different electrical potentials. In yet another configuration, individual electrodes 140 are positioned in correspondence with individual posts 130 or groups thereof, enabling independent electrical control of different regions. In still another configuration, electrode structures may be incorporated into or onto membrane 100 in addition to or instead of electrodes on substrate 150.

Electrodes 140 are fabricated from electrically conductive materials including metals such as gold, aluminum, copper, platinum, or titanium, conductive compounds such as titanium nitride or tantalum nitride, highly doped semiconductor materials, or transparent conductive oxides such as indium tin oxide. Electrode thickness may range from nanometers to micrometers depending on current-carrying requirements and fabrication constraints. Material selection considers electrical conductivity, chemical stability, mechanical properties, and compatibility with other materials in the device. In some embodiments, electrodes 140 may incorporate protective passivation layers or dielectric coatings to prevent electrical breakdown across gap 180.

Electrodes 140 are driven by drive system 170 that supplies electrical signals at appropriate frequencies, amplitudes, phases, and waveforms. Drive system 170 comprises signal generation circuitry and power amplification stages capable of delivering sufficient electrical power to drive the load presented by electrodes 140 and gap 180. Drive signals may include sinusoidal waveforms, pulsed signals with controlled duty cycles, multi-tone signals combining multiple frequency components, chirped signals with time-varying frequency, or digitally synthesized waveforms. Operating frequency may span a broad range from DC to kilohertz, kilohertz to megahertz, or megahertz to gigahertz depending on application requirements. Voltage amplitude may range from millivolts to kilovolts depending on gap 180 dimensions and desired field strength.

Drive system 170 connects to electrodes 140 through electrical connection pathways that may include wire bonds, solder connections, conductive adhesives, spring-loaded contacts, or other electrical interconnection methods at the device periphery. Signals are routed through the conductive network embedded within substrate 150 to reach distributed electrodes 140 across the active region. Connection pathways may incorporate impedance matching networks, filtering elements, or transmission line structures to optimize signal delivery efficiency. In embodiments where electrodes 140 are independently addressable in multiple groups, drive system 170 includes switching matrices, multiplexing circuitry, or multiple independent drive channels to selectively control different electrode groups.

The gap-control subsystem maintains gap 180 at a desired separation through continuous feedback control during operation. The gap-control subsystem comprises sensing elements, actuation mechanisms, and control electronics used to monitor and maintain gap spacing during static and dynamic operation. Without active control, numerous factors would cause uncontrolled variation in gap 180, including thermal expansion of components, mechanical vibrations from the external environment, attractive van der Waals forces between membrane 100 and substrate 150, electrostatic forces generated when electrodes 140 are energized, and long-term drift effects from material creep or environmental changes.

Capacitive sensors 110 function as sensing elements within the gap-control subsystem and are positioned at multiple locations, typically around the perimeter of the active region, to measure local gap spacing between membrane 100 and substrate 150. Sensors 110 exploit the relationship for parallel-plate capacitance where capacitance varies inversely with separation distance between conducting surfaces. As gap 180 changes, the capacitance measured by sensors 110 changes correspondingly, providing an electrical signal that can be processed to determine gap spacing. Sensors 110 comprise dedicated electrode pairs or regions distinct from activation electrodes 140, with one electrode element associated with membrane 100 and a corresponding electrode element on substrate 150. The spatial distribution of multiple sensors 110 enables determination of average gap spacing and any tilt or non-parallelism between surfaces.

Capacitive measurement typically involves applying a sensing signal, which may be an AC voltage excitation at a frequency distinct from the drive frequency used by drive system 170 to avoid interference, and measuring the resulting current or charge flow to determine capacitance. Measurement techniques may include capacitance bridge circuits, resonant frequency measurements, charge integration methods, or capacitance-to-digital converter integrated circuits. Measurement precision can reach sub-nanometer levels, limited primarily by electronic noise, mechanical vibrations, and electromagnetic interference. Signal processing techniques such as synchronous demodulation, averaging, filtering, and differential measurement can enhance measurement precision and reject interference.

In some embodiments, the gap-control subsystem may incorporate alternative or complementary sensing elements in addition to or instead of capacitive sensors 110. Optical interferometric sensors may measure gap 180 through analysis of interference patterns created by light reflecting from membrane 100 and substrate 150. Piezoresistive sensors may be integrated into actuators 120 or support structures to provide information about mechanical deflections that correlate with gap changes. Microwave displacement sensors exploiting electromagnetic resonance or phase shift can provide non-contact gap measurement.

Measurement signals from sensors 110 or other sensing elements are processed by gap controller 160 that implements feedback control algorithms to compute correction signals for maintaining gap 180 at the desired target value. Gap controller 160 may be implemented using analog electronic circuitry, digital signal processing hardware such as microcontrollers or field-programmable gate arrays (FPGAs), application-specific integrated circuits (ASICs), or combinations thereof. Gap controller 160 compares measured gap spacing against a target setpoint value and calculates an error signal representing the deviation. In an exemplary embodiment, gap controller 160 implements a proportional-integral-derivative (PID) control algorithm where controller output is computed from three terms: a proportional term responsive to instantaneous error magnitude, an integral term that accumulates error over time to eliminate steady-state offset, and a derivative term responsive to rate of error change to provide damping and improve transient response.

Gap controller 160 may implement various control strategies beyond basic PID control. Model-based control approaches such as state-space control or model predictive control may be employed when accurate dynamic models of the mechanical system are available. Adaptive control strategies may automatically adjust controller parameters based on measured system response to compensate for changing operating conditions, component aging, or operating point variations. In embodiments with multiple sensors 110 distributed spatially and multiple actuators 120 at different locations, gap controller 160 implements multi-input multi-output (MIMO) control that coordinates all sensors and actuators to control both average gap spacing and relative tilt or angular alignment between surfaces. Control loop rates typically range from hundreds of hertz to tens of kilohertz depending on mechanical resonance frequencies and desired disturbance rejection performance.

Control signals computed by gap controller 160 are sent to actuators 120, which apply mechanical forces or displacements to adjust the position of membrane 100 relative to substrate 150. Actuators 120 interface mechanically with membrane 100 through support structures, mounting points, or flexures that translate actuator output motion into position changes while maintaining proper lateral alignment and mechanical stability. The number and spatial arrangement of actuators 120 depends on the size and geometry of the device. Exemplary configurations include three actuators in a triangular pattern for kinematic determinacy, four actuators in a rectangular or square pattern for redundancy and load distribution, or larger numbers of actuators distributed around the perimeter for large devices or when fine control of surface shape or tilt is required.

Actuators 120 may be implemented using various actuation technologies. In one embodiment, actuators 120 comprise piezoelectric actuators based on the converse piezoelectric effect where applied electrical fields induce mechanical strain in piezoelectric materials such as lead zirconate titanate (PZT), lead magnesium niobate-lead titanate (PMN-PT), or other piezoelectric ceramics or single crystals. Piezoelectric actuators offer high stiffness for precise positioning under varying loads, fast mechanical response with resonant frequencies that can exceed tens of kilohertz, displacement resolution potentially reaching subnanometer levels, and relatively simple electrical drive requirements. In another embodiment, actuators 120 comprise electrostatic actuators that generate forces through electrostatic attraction between voltage-controlled electrodes, offering low power consumption, compatibility with microfabrication processes, and bidirectional operation. In yet another embodiment, actuators 120 comprise electromagnetic voice coil actuators operating on Lorentz force principles, offering smooth analog control, good linearity between current and force, and bidirectional operation. Other actuation approaches may include magnetostrictive actuators, thermal bimorphs, shape memory alloy actuators, or electroactive polymer actuators.

The gap-control subsystem comprising sensors 110, gap controller 160, and actuators 120 operates continuously during device operation, constantly measuring gap 180, computing corrections, and applying adjustments to compensate for disturbances and maintain the desired separation. The feedback system compensates for thermal drift as component temperatures change, rejecting slow variations with time constants of seconds to minutes. The gap-control subsystem also rejects faster mechanical disturbances such as vibrations with frequencies below the control bandwidth. For disturbances at frequencies well above the feedback bandwidth, passive mechanical isolation through compliant mounting, damping materials, or vibration isolation platforms may supplement active feedback control.

Attractive van der Waals forces between membrane 100 and substrate 150 create a separation-dependent load that actuators 120 must counteract to maintain gap 180. These forces arise from fluctuating electromagnetic fields and induced dipole interactions, scaling approximately inversely with the cube or fourth power of separation distance and becoming increasingly significant at small gaps. The gap-control subsystem automatically compensates for these attractive forces through gap controller 160 adjusting actuator commands to provide the necessary opposing force. Similarly, when electrodes 140 are energized by drive system 170, electromagnetic fields create electrostatic forces that produce additional attractive forces between surfaces. Gap controller 160 may incorporate feedforward compensation that anticipates the expected electrostatic force based on known drive signals, preemptively adjusting actuator commands to maintain stable gap spacing.

Substrate 150 may be positioned below membrane 100 as illustrated, with posts 130 extending upward toward membrane 100 from below. Gravitational force on membrane 100 acts downward in this orientation, contributing a constant attractive force component toward substrate 150 that must be opposed by actuators 120 but also providing a stabilizing bias force.

Alternatively, the device may be configured with substrate 150 positioned above membrane 100, with posts 130 extending downward toward membrane 100 from above. In this inverted configuration, gravitational force on membrane 100 acts as a separating force away from substrate 150, and actuators 120 must primarily counteract attractive van der Waals and electrostatic forces to maintain the gap while preventing excessive separation.

In another embodiment, the device may comprise two structured substrates each containing their own respective posts 130, positioned on opposite sides of membrane 100 to create a dual-sided configuration. In this architecture, membrane 100 is suspended between two opposing structured substrates with gaps maintained on both upper and lower sides. The dual-sided configuration may offer increased capacity by providing twice the active interface area, mechanical force balance as attractive forces from both sides partially offset each other potentially simplifying gap control requirements, and bidirectional capability. Both sets of posts and electrodes can be operated simultaneously with coordinated or independent control.

Regardless of orientation or single-versus dual-sided configuration, gap 180 is maintained through coordinated action of the gap-control subsystem comprising sensors 110, gap controller 160, and actuators 120, combined with controlled activation signals generated by electrodes 140 under control of drive system 170. By actively controlling both the geometric separation through the gap-control subsystem and the electromagnetic field characteristics through drive system 170, the device provides a platform for operating at nanoscale dimensions with controlled activation across maintained gaps.

Figure 2:
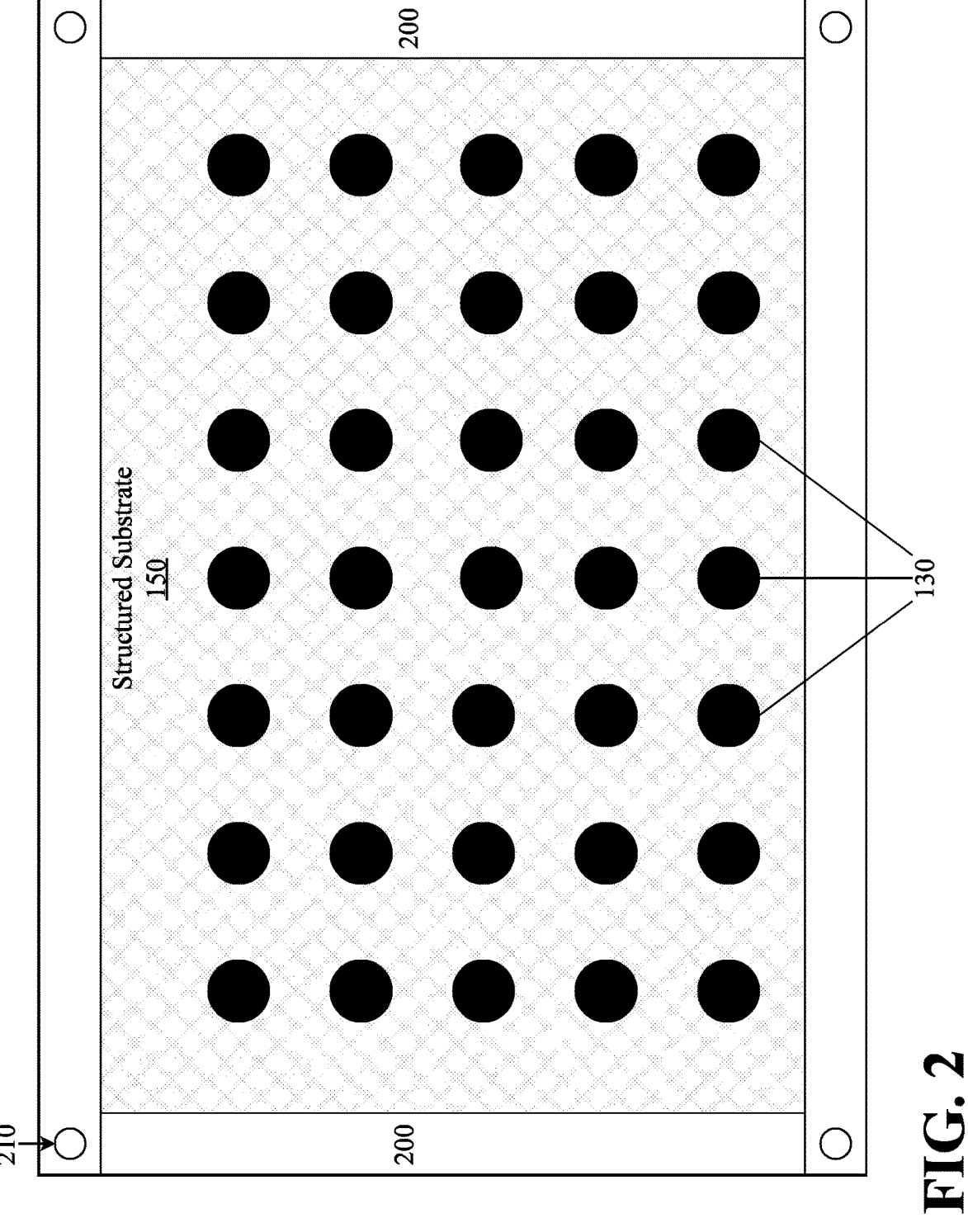
FIG. 2 illustrates a top-down view of substrate showing the spatial arrangement of posts 130 and peripheral structures including structural supports and connectors.

FIG. 2 illustrates a top-down view of substrate 150 showing the spatial arrangement of posts 130 and peripheral structures including structural supports 200 and connectors 210.

Substrate 150 forms the base platform and may be fabricated in various lateral dimensions depending on application requirements. The width and length of substrate 150 can be tailored to match the footprint of the application or available space. In exemplary embodiments, substrate 150 may have lateral dimensions ranging from micrometers for microscale implementations to millimeters for chip-scale applications, to centimeters for module-level implementations, to tens of centimeters or larger for large-area applications. The substrate may be square, rectangular, circular, or any other geometric shape optimized for the specific application, and in some embodiments may include non-rectangular features such as cutouts, notches, or curved edges to accommodate other components, mounting features, or system integration constraints.

The surface of substrate 150 includes a plurality of posts 130 distributed across the active region. Posts 130 are arranged to form an array distributed across the surface area. The array may contain from two posts to very large numbers potentially reaching thousands, millions, or even billions depending on total substrate area, desired post density, and pitch spacing between adjacent posts. In an exemplary embodiment with millimeter-scale substrate dimensions and micrometer-scale post pitch, the array might contain hundreds to thousands of posts. In another exemplary embodiment with centimeter-scale substrate dimensions and sub-micrometer post pitch, the array might contain millions of posts.

The spatial arrangement of posts 130 across the surface of substrate 150 may follow various patterns. In one arrangement, posts 130 are positioned in a regular periodic array with uniform pitch spacing in orthogonal directions, creating a rectangular or square lattice pattern that provides spatially uniform characteristics and simplified fabrication through repetitive patterning. In another arrangement, posts 130 are positioned in a hexagonal close-packed array that maximizes packing density and provides isotropic spatial characteristics. In yet another arrangement, posts 130 are positioned with intentionally non-uniform spacing where pitch varies gradually or abruptly across the substrate surface, for example with higher post density in regions corresponding to higher requirements or lower post density near edges. In still another arrangement, posts 130 may be organized in a hierarchical pattern with multiple length scales. The array pattern may also incorporate intentional randomness or quasi-periodic arrangements.

The pitch spacing between adjacent posts 130, defined as the center-to-center distance between neighboring posts, affects field distribution uniformity and effective area over which each post operates. Smaller pitch spacing creates more uniform distributions as regions from adjacent posts overlap more extensively, but requires fabrication of more total posts. Larger pitch spacing reduces the total number of posts required but creates more spatial variation with higher field strength near posts and lower strength in regions between posts. In exemplary embodiments, pitch spacing may range from tens of nanometers for densely packed nanoscale arrays to hundreds of nanometers or several micrometers for intermediate density arrays, to tens of micrometers or larger for sparse arrays where individual posts are relatively isolated. The optimal pitch spacing depends on multiple factors including the height of posts 130, the gap dimension, fabrication capabilities, and the acceptable level of non-uniformity across the active area.

While FIG. 2 shows posts 130 in a simplified schematic representation as dots or circles indicating their lateral positions, it should be understood that each post 130 has a three-dimensional structure extending vertically from the surface of substrate 150. The cross-sectional shape when viewed from above may be circular for posts formed by isotropic etching or growth processes, square or rectangular for posts defined by anisotropic etching along crystallographic planes, hexagonal for posts formed on crystal facets, or other polygonal or irregular shapes depending on fabrication method and material properties. The lateral dimensions of posts 130, meaning their width or diameter as seen in this top view, may range from nanometers to micrometers depending on fabrication capabilities. In some embodiments, the lateral dimensions of posts 130 may be uniform across the array to provide consistent geometry, while in other embodiments the dimensions may vary intentionally to create posts with different characteristics in different regions.

Around the perimeter of the active region containing posts 130, substrate 150 includes structural supports 200 that provide mechanical reinforcement and define the mounting interface for the device. Structural supports 200 are regions of substrate 150, typically near the edges or corners, that have increased mechanical stiffness or thickness compared to the central active area, or that incorporate additional structural elements attached to or integrated with the base substrate material. The function of structural supports 200 is to provide rigid reference points or surfaces against which actuators within the gap-control subsystem can react when applying forces to control the position of the opposing surface, to prevent unwanted deformation or flexing of substrate 150 itself during operation, to provide mechanical mounting points for attaching substrate 150 to a package or housing, and to distribute mechanical loads from mounting or actuation forces across a larger area to reduce stress concentrations.

Structural supports 200 may be implemented in various forms depending on the substrate material, fabrication process, and mechanical requirements. In one implementation, supports 200 comprise thickened regions of the base substrate material where the substrate has not been thinned or etched during fabrication, maintaining the full starting wafer thickness or a substantial fraction thereof while the central active region may be thinned. In another implementation, supports 200 comprise additional structural material bonded or deposited onto the base substrate, such as metal backing plates, ceramic reinforcement tiles, or polymer stiffening structures that increase local bending stiffness. In yet another implementation, supports 200 comprise integrated frame structures where the substrate is patterned to create a thick perimeter frame surrounding a thinner active region, potentially including ribs or webs that connect the frame to the active area. The mechanical design of supports 200 considers trade-offs between providing sufficient stiffness to maintain substrate flatness and dimensional stability during operation while minimizing added mass and maintaining fabrication compatibility with the processes used to create posts 130 and other features.

Also located near the perimeter of substrate 150 are connectors 210 that provide interface points where external components couple with the substrate for mechanical, electrical, or thermal connections. Connectors 210 serve multiple functions including providing mechanical attachment points where actuation mechanisms within the gap-control subsystem physically connect to substrate 150 to enable gap control, providing locations where sensing elements of the gap-control subsystem such as capacitive sensors or other gap measurement devices attach to or interface with substrate 150 for gap measurement, providing electrical connection points where signals from drive systems or gap controller control electronics are routed onto substrate 150 through wire bonds, solder connections, or other electrical interconnection methods, and potentially providing thermal connection points where external heat sinks or other thermal management components attach to substrate 150.

Connectors 210 may be implemented with various physical structures depending on the type of coupling required. For mechanical coupling with actuation mechanisms of the gap-control subsystem, connectors 210 may comprise raised pedestals or bosses that provide defined contact surfaces for actuator attachment, threaded holes or inserts that accept mounting screws or bolts, bonding pads where actuators are adhesively attached, or integrated flexure elements that provide compliant mechanical coupling while maintaining precise kinematic constraint. For electrical coupling to activation electrodes, connectors 210 may comprise metal bond pads where wire bonds are attached to route signals onto the substrate, solder pads where electrical leads are soldered, spring-loaded contact pads that mate with pogo pins or other pressure contacts, or edge connectors where metallized edge surfaces contact corresponding terminals in a socket or holder. For sensor coupling with sensing elements of the gap-control subsystem, connectors 210 may include electrodes that form part of capacitive sensors, with the connector providing both the mechanical attachment point for sensor electronics and the sensing electrode itself.

The spatial distribution of connectors 210 around the perimeter of substrate 150 is typically designed to provide symmetric or balanced coupling that minimizes induced mechanical distortions or asymmetries. In an exemplary configuration, three connectors 210 are positioned in a triangular pattern around the perimeter to provide kinematically determinate mounting where three non-collinear points fully constrain the position and orientation of a rigid body without over-constraint, enabling precise gap-control subsystem operation. In another exemplary configuration, four connectors 210 are positioned in a rectangular or square pattern to provide redundant support and balanced load distribution for the gap-control subsystem. In yet another configuration, larger numbers of connectors 210 distributed around the perimeter provide distributed actuation for large-area substrates or enable control of substrate shape in addition to rigid-body position by the gap-control subsystem. The specific locations of connectors 210 may be chosen to coincide with structural supports 200 where the substrate has maximum stiffness, to avoid regions where concentrated stresses might cause damage or deformation, and to provide convenient access for assembly and integration.

While FIG. 2 depicts substrate 150 as a planar element viewed from above, it should be understood that this represents one surface of a three-dimensional component where posts 130 extend vertically out of the plane of the illustration toward the location where the opposing surface will be positioned during device operation. The vertical extent of posts 130, the thickness of substrate 150 beneath the post base, and the gap between post tips and the opposing surface are not visible in this top-down view but are critical dimensions that together determine the operational characteristics of the device.

The overall layout shown in FIG. 2 illustrates the distributed array architecture. By distributing many posts 130 across the surface area in a controlled array pattern, the device achieves spatially extended operation that can address large-area requirements rather than being limited to point-source or small-area operation. The array architecture also provides design flexibility where the post density, spacing, and distribution can be tailored to match specific requirements or system integration needs. The peripheral structural supports 200 and connectors 210 provide the mechanical, electrical, and thermal interfaces necessary to integrate substrate 150 into a complete device system with gap-control subsystem functionality and activation signal generation.

FIG. 3 illustrates cross-sectional views of exemplary post configurations showing the relationship between posts 130 and activation electrodes 140 within substrate 150. The figure presents four examples (Example A 300, Example B 310, Example C 320, and Example D 330) demonstrating geometric variations possible for posts 130. The selection of post geometry represents a design parameter that influences operational characteristics of the device. Different post shapes and dimensions create different field distributions within the activation fields established between substrate 150 and the opposing surface.

Example A 300 illustrates posts 302 having sharp conical or pyramidal geometries that taper from a broader base where the post connects to substrate 150 to an apex point at the distal end that approaches the opposing surface. The tip radius of curvature of posts 302, meaning the radius of the rounded region at the very apex, may range from sub-nanometer dimensions to tens of nanometers for strong concentration with more robust mechanical properties, to hundreds of nanometers for moderate concentration with relaxed fabrication tolerances. The cone angle or taper angle of posts 302, defined as the angle between the post sidewall and the substrate surface, influences both operational characteristics and mechanical robustness.

The conical geometry of posts 302 may be fabricated through various processes including anisotropic wet etching of crystalline materials like silicon where etchant chemistry preferentially attacks specific crystal planes to produce naturally faceted pyramidal structures, reactive ion etching with carefully controlled etch chemistries and process parameters to create tapered profiles, focused ion beam milling to directly sculpt sharp tips through material removal, thermal oxidation sharpening where controlled oxidation and oxide removal iteratively reduces tip dimensions, or deposition and growth techniques such as vapor-liquid-solid nanowire growth that naturally produce tapered structures. The surface roughness of posts 302 also influences operational characteristics, with atomically smooth surfaces producing the most predictable and controlled distributions.

Activation electrodes 140 in example A 300 are shown positioned on or within substrate 150 in a configuration that may represent a continuous planar electrode layer beneath all posts 302, providing a common electrode that generates activation fields extending from the substrate surface through the body of posts 302 (if the posts are sufficiently conductive or dielectric) and emerging at the sharp tips.

Example B 310 illustrates posts 312 having cylindrical or pillar geometries with substantially constant cross-sectional dimensions along their vertical extent from the base at substrate 150 to the distal end approaching the opposing surface. These posts 312 offer advantages including more uniform distribution along the post height, greater mechanical robustness due to the larger cross-sectional area maintained throughout the post length, relaxed fabrication tolerances since precise tip sharpening is not required, and predictable characteristics that are less sensitive to small variations in post height or tip condition. For posts with circular cross-sections, this creates an annular enhancement region around the edge, while for posts with polygonal cross-sections such as square or hexagonal, concentration occurs preferentially at the corners.

The diameter or width of posts 312 influences both the distribution and the mechanical properties. In exemplary embodiments, posts 312 may have lateral dimensions ranging from tens of nanometers for nanowire or nanopillar configurations to hundreds of nanometers or several micrometers for micropillar configurations where mechanical stability and fabrication yield take priority. The aspect ratio of posts 312, defined as the ratio of post height to lateral dimension, can range from less than unity for short stubby posts to ten or more for tall slender posts.

Posts 312 may be fabricated through processes particularly suited to creating high-aspect-ratio cylindrical structures, including deep reactive ion etching (DRIE) techniques such as the Bosch process that alternates between etching and passivation steps to create deep vertical features with controlled sidewall profiles, metal-assisted chemical etching that uses patterned metal catalysts to direct anisotropic etching of semiconductor materials, electrochemical etching in appropriate electrolytes and applied potentials, template-assisted growth where material is deposited into porous templates or molds that define the post geometry, or various nanowire growth techniques including vapor-phase epitaxy, solution-phase synthesis, or electrodeposition. The top surface of posts 312 may be left as-fabricated with a flat top, intentionally rounded through thermal treatment or chemical etching, or further processed to sharpen the edges if enhanced concentration is desired.

Activation electrodes 140 in example B 310 are similarly positioned on or within substrate 150, generating activation fields that extend upward through or around posts 312. The relatively uniform cross-section of posts 312 means the field strength increases more gradually with height compared to conical posts, reaching maximum values at the top edge regions rather than at a sharp apex.

Example C 320 illustrates posts 322 having blunt or mesa geometries characterized by flat or broad top surfaces with abrupt sidewalls. This configuration represents an intermediate geometry between sharp tips and cylindrical posts. Posts 322 demonstrate that substantial enhancement can be achieved even without sharp points through the exploitation of edge effects at the perimeter where the flat top surface meets the vertical sidewalls. The mesa geometry offers significant practical advantages including greater mechanical robustness with reduced susceptibility to tip damage or wear during fabrication and handling, more predictable and reproducible characteristics that are less sensitive to nanometer-scale variations in top edge sharpness, larger effective area since the entire top edge perimeter contributes rather than a single point, and potentially improved heat spreading within the post structure due to the larger cross-sectional area near the membrane interface.

The lateral dimensions of posts 322 can be varied to adjust the characteristics, with smaller mesa dimensions creating higher concentration at the edges due to closer spacing between opposing edge regions, while larger mesa dimensions reduce the edge enhancement but increase the total perimeter length over which enhancement occurs. In exemplary embodiments, posts 322 may have top surface dimensions ranging from tens of nanometers to several micrometers, with aspect ratios (height to width) ranging from less than one for low-profile mesas to several or more for tall structures. The top surface of posts 322 may be nominally flat within fabrication tolerances, deliberately textured to create additional sub-features, or slightly convex or concave due to processing effects. The sharpness of the top edge corner, meaning the radius of curvature at the junction between top surface and sidewall, influences the maximum enhancement.

Fabrication of posts 322 with controlled mesa geometry may employ techniques such as plasma etching with appropriate masking and etch chemistries to create vertical sidewalls and flat top surfaces defined by the mask pattern, selective epitaxial growth where material is deposited preferentially in patterned regions to build up mesa structures, liftoff processes where sacrificial masks define the post geometry followed by material deposition and mask removal, or subtractive processes such as focused ion beam milling or laser ablation to create mesa structures through controlled material removal. Post-fabrication treatments such as thermal annealing, chemical etching, or atomic layer deposition of passivation layers can modify the edge sharpness or surface properties to fine-tune the characteristics.

Activation electrodes 140 shown beneath posts 322 in example C 320 generate activation fields that emerge from substrate 150 and concentrate at the top edges of the mesa structures. The field distribution in the gap for mesa-geometry posts exhibits enhanced field strength in annular or perimeter regions surrounding each post top corresponding to the edge locations, with relatively lower field strength in the central region directly above the post top and in the regions between adjacent posts.

Example D 330 illustrates posts 332 having multiple activation electrodes 140 integrated directly with or immediately adjacent to individual posts rather than relying solely on electrodes positioned remotely in the bulk of substrate 150. This configuration represents an advanced electrode architecture where independent electrical control of individual posts or small groups of posts enables spatial modulation of the electromagnetic field distribution across the array. In this example, posts 332 may have any of the geometries described in examples A, B, or C, or other geometries not explicitly shown, with the distinguishing feature being the electrode configuration rather than the post shape itself. The illustration shows activation electrodes 140 positioned alongside or beneath individual posts 332, representing independent electrode elements that can be separately addressed with different voltage amplitudes, frequencies, phases, or temporal waveforms to generate spatially varying activation fields.

The independently addressable electrode architecture of example D 330 provides several capabilities beyond uniform electrode configurations. Spatial modulation of field strength can be achieved by applying different voltage amplitudes to different electrode groups, creating regions of high and low enhancement across the array to match spatially varying requirements or to implement specific distribution profiles. Temporal sequencing of field activation can be implemented by energizing different electrode groups at different times in controlled patterns, potentially creating traveling wave effects, sequential activation patterns, or time-multiplexed operation that reduces peak power consumption. Phase control between electrodes enables creation of phased-array field patterns where the relative phase between adjacent electrodes determines whether activation fields add constructively or destructively. Selective activation of electrode subsets allows portions of the array to be operated while others remain inactive, providing fine-grained control of where operation occurs and enabling adaptive response to localized requirements or fault tolerance through deactivation of damaged regions.

The individual activation electrodes 140 in example D 330 may be fabricated through multilayer metallization processes where conductive electrode layers are patterned and separated by insulating dielectric layers, enabling complex routing networks that bring independent electrical signals to each electrode location while avoiding short circuits between adjacent electrodes. The electrode structures may be formed through photolithographic patterning of deposited metal films, electroplating of metals into patterned features, damascene processes where metal is deposited into etched trenches in dielectric materials, or additive printing techniques for certain applications. Electrical isolation between adjacent activation electrodes 140 requires careful design of dielectric spacing and thickness to prevent breakdown, crosstalk, or parasitic capacitance that would compromise independent control.

While FIG. 3 shows four distinct examples of post configurations, it should be understood that these represent only a subset of the possible geometries that may be employed for posts 130. Other geometries not explicitly illustrated but within the scope of the invention include tapered posts with non-circular cross-sections such as pyramidal structures with triangular or square bases, posts with complex shapes that vary along their height such as hourglass profiles or multi-stage tapers, posts incorporating surface texturing or nano-scale features superimposed on larger-scale shapes, hollow tubular posts or posts with internal cavities, composite posts combining multiple materials with different electrical or thermal properties, posts with embedded structures such as resonant cavities or waveguides, and posts with functionalized surfaces or coatings that modify characteristics.

Furthermore, a single substrate 150 may incorporate posts of different shapes, dimensions, or configurations within the same post array, rather than being limited to a single uniform post geometry, creating heterogeneous geometry across the device. This heterogeneous array architecture enables tailoring of characteristics to specific requirements through strategic placement of different post types. For example, regions of substrate 150 corresponding to high requirements might incorporate sharp conical posts 302 from Example A, while regions with lower requirements might incorporate more robust mesa posts 322 from example C for adequate performance with improved reliability. Alternatively, the array might include a mixture of post geometries distributed throughout to create a complex pattern with multiple spatial scales of variation. The array might also incorporate posts of different heights to create three-dimensional patterns with variation in the vertical dimension, or posts with different electrode configurations mixing the uniform electrodes of examples A-C with the independent electrodes of example D to provide both baseline coverage and selective enhanced control in critical regions.

The flexibility in post geometry selection and array design provides a tool for optimizing device performance for specific applications, fabrication capabilities, and operating conditions. The geometric variations illustrated in FIG. 3 demonstrate the breadth of design space available for engineering the post geometry and distribution characteristics that determine operational performance, while all embodiments share the common principle of using structured surface features to concentrate activation fields in controlled patterns. By selecting appropriate post geometries, dimensions, spacing, and distributions, the device can be tailored to achieve desired performance metrics including spatial uniformity, response time, power efficiency, fabrication yield, mechanical robustness, and operational reliability for diverse applications.

Figure 4:
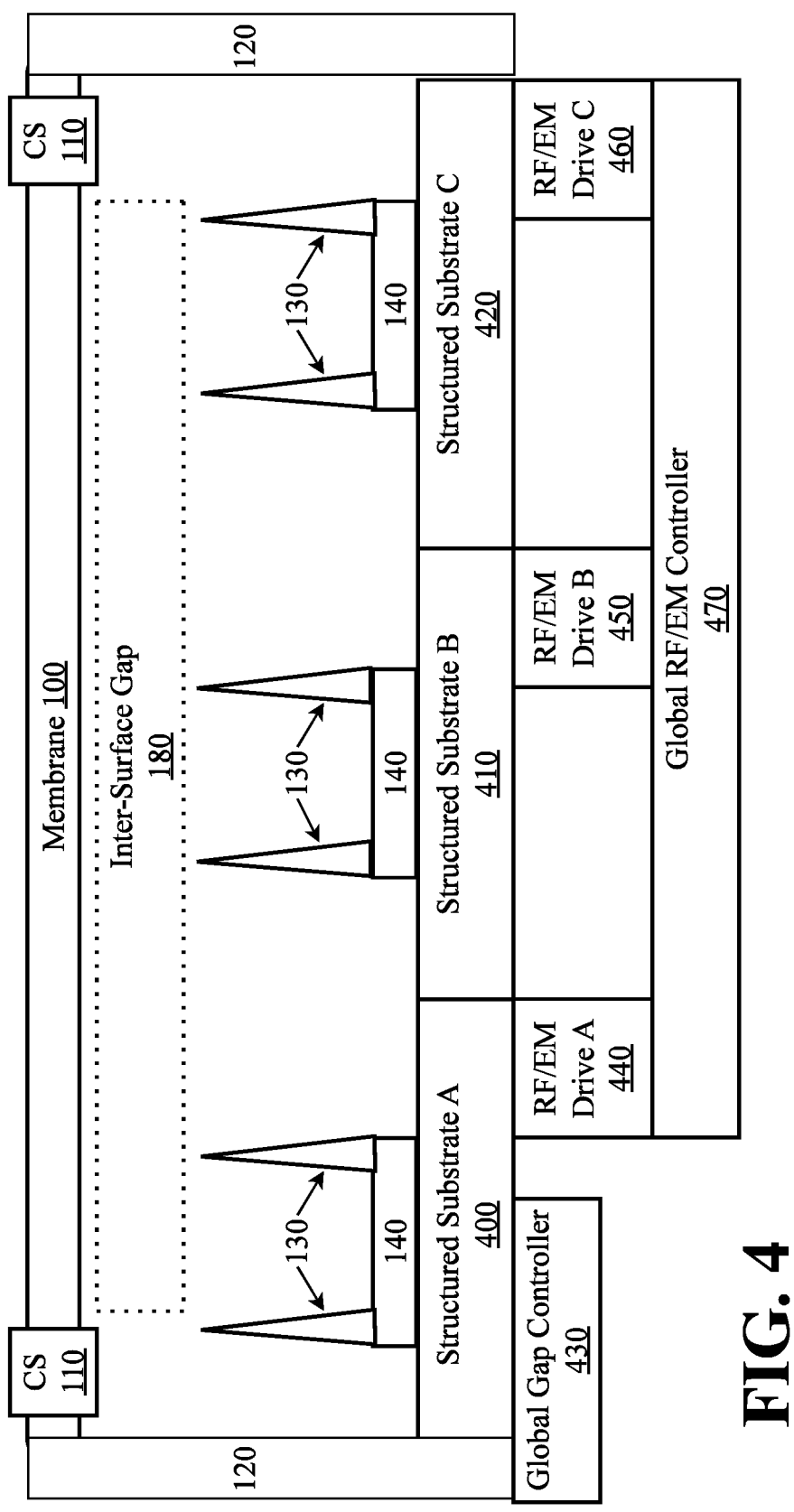
FIG. 4 illustrates a configuration wherein multiple substrates are arranged beneath a common membrane.

FIG. 4 illustrates a configuration wherein multiple substrates are arranged beneath a common membrane 100. The figure depicts three substrates (substrate A 400, substrate B 410, and substrate C 420) positioned beneath membrane 100, with each substrate incorporating its own array of posts 130, activation electrodes 140, capacitive sensors 110 as sensing elements of the gap-control subsystem, actuators 120 as actuation mechanisms of the gap-control subsystem, and gap 180. This multi-substrate architecture enables modular scaling to accommodate large-area applications, distributed requirements, or applications where requirements exceed the capacity of a single substrate module. The distributed configuration also provides system-level benefits including fault tolerance through redundancy where failure of one substrate module does not compromise the entire system, spatial optimization where different substrate modules can be independently optimized for local characteristics, and manufacturing advantages where multiple smaller substrates may be easier to fabricate with high yield compared to single large-area substrates.

Each of the substrates 400, 410, and 420 functions as an independent module, incorporating all the essential components described in previous figures. Substrate A 400 includes posts 130 distributed across its surface in an array pattern, activation electrodes 140 positioned to generate activation fields across gap 180 between the substrate and membrane 100, capacitive sensors 110 positioned as sensing elements of the gap-control subsystem to measure the local gap spacing at multiple locations around the substrate perimeter, and actuators 120 functioning as actuation mechanisms mechanically coupled to the substrate or membrane to enable gap control. Similarly, substrate B 410 and substrate C 420 each incorporate their own respective posts 130, activation electrodes 140, capacitive sensors 110, actuators 120, and gap 180, creating three parallel channels operating simultaneously beneath the shared membrane 100. The posts 130 within each substrate may have identical geometries, dimensions, and spacing to provide uniform characteristics across the entire array, or may have different characteristics tailored to the specific conditions or operational requirements at each location.

The spatial arrangement of the multiple substrates beneath membrane 100 may follow various configurations depending on the application requirements and geometric constraints. In the exemplary configuration shown, three substrates are positioned in a linear or distributed pattern beneath membrane 100, creating three distinct active regions where posts 130 approach the membrane surface to establish gaps. The gaps between adjacent substrates, meaning the lateral spacing separating the edges of neighboring substrate modules, may range from negligible separation where substrates nearly touch to create a quasi-continuous active area, to substantial spacing of millimeters or more where distinct spatial separation between active regions with independent gaps is desired. The choice of substrate spacing involves trade-offs between achieving uniform coverage across the entire membrane area versus maintaining independent thermal and mechanical isolation between substrate modules.

The individual substrates 400, 410, and 420 may have identical lateral dimensions and shapes for manufacturing simplicity and interchangeability, or may have different sizes and shapes to accommodate specific system layouts or load distributions. In one exemplary embodiment, all substrate modules are square or rectangular with identical dimensions, enabling a regular tiled array pattern that could extend to larger numbers of substrates beyond the three shown, with uniform characteristics. In another exemplary embodiment, the substrate modules have different sizes with larger substrates positioned beneath high-demand regions and smaller substrates covering lower-demand areas to optimize the distribution of capacity. In yet another exemplary embodiment, the substrate shapes are non-rectangular with contours designed to match the geometry of the application or to fit within available space in the system integration, potentially including curved edges, cutouts, or irregular perimeters.

Each substrate in the array is driven by its own dedicated drive system, providing independent control of the activation fields applied across each gap 180. Drive A 440 connects to and drives activation electrodes 140 within Substrate A 400, generating time-varying activation fields with controlled frequency, amplitude, phase, and waveform characteristics specific to that substrate module. Similarly, drive B 450 drives the activation electrodes 140 of substrate B 410, and drive C 460 drives the activation electrodes 140 of substrate C 420. This architecture where each substrate has its own drive provides several important capabilities beyond a single shared drive system. Independent power control allows the electrical power delivered to each substrate module to be adjusted based on local conditions, directing more energy to high-demand regions and less to low-demand areas for optimized overall efficiency. Independent frequency control enables each substrate to operate at different frequencies that may be optimized for the specific gap dimensions and post geometries relevant to that module, or allows frequency diversity to reduce electromagnetic interference or avoid resonances in the mechanical system. Independent phase control between substrate modules enables creation of phased field patterns across the array. Independent waveform control allows each substrate to employ different modulation schemes, pulse patterns, or burst modes suited to its operational requirements.

The dedicated drive systems 440, 450, and 460 may be physically implemented as separate electronic assemblies positioned near their respective substrates for short electrical connection paths and reduced electromagnetic interference, or may be integrated into a common chassis with independent output channels. Each drive generates its output signals through signal generation circuitry that may include oscillators, function generators, arbitrary waveform generators, or digitally synthesized waveforms, followed by power amplification stages providing sufficient current delivery to drive the capacitive load of the activation electrodes and gap. The output impedance of each drive may be designed to match the impedance of its connected activation electrode array for maximum power transfer efficiency. Electrical connections from each drive to its corresponding substrate may employ coaxial cables for radio frequency applications requiring controlled impedance and shielding, twisted pair wiring for lower frequencies where differential signaling reduces electromagnetic interference, ribbon cables or flex circuits for compact multi-conductor routing, or direct printed circuit board connections where the drive circuitry is integrated onto a board that mechanically supports the substrate.

Coordinating the operation of the multiple independent drive systems is a global drive controller 470 that provides centralized command and control of the activation field generation across all substrate modules. Global drive controller 470 receives high-level control inputs that may include load data from temperature sensors or thermal models indicating where operation should be concentrated, power budget constraints specifying total allowable electrical power consumption, performance targets defining desired rates or resistance values, and operational mode commands selecting between different control strategies or optimization objectives. Based on these inputs, global drive controller 470 computes appropriate control parameters for each individual drive system including frequency settings, amplitude levels, phase relationships, waveform types, and timing sequences. These control parameters are communicated from global drive controller 470 to the individual drives 440, 450, and 460 through digital communication interfaces that may employ serial protocols such as SPI, I2C, or UART for simple implementations, parallel buses for high-speed data transfer, or network-based communication using protocols like Ethernet or CAN bus for complex systems with many substrate modules.

Global drive controller 470 may implement various system-level control strategies that exploit the multi-substrate architecture. Spatial load balancing distributes the total demand across available substrate modules to avoid overloading any single module, potentially involving dynamic reallocation of power as load patterns change during operation. Synchronized operation coordinates the timing of field activation across all substrates to create coherent array-level effects, such as simultaneously pulsing all substrates at the same frequency and phase for maximum instantaneous field strength, or sequencing activation in temporal patterns that create traveling distributions across the array. Phase optimization adjusts the relative phase between substrate modules to produce constructive or destructive interference effects at specific locations. Frequency coordination manages the frequency assignments for each substrate to avoid unintended coupling or interference between adjacent modules, potentially using frequency hopping, spread spectrum techniques, or frequency division multiplexing to enable simultaneous operation without crosstalk. Adaptive optimization continuously monitors system performance through feedback from thermal sensors or gap-control subsystems and adjusts the drive parameters to maintain optimal operation as conditions change.

The global drive controller 470 may be implemented using various computing platforms depending on the control complexity and real-time requirements. Simple implementations may use microcontrollers with embedded firmware executing control algorithms at moderate speeds sufficient for thermal management time scales ranging from milliseconds to seconds. More sophisticated implementations may employ digital signal processors (DSPs) or field-programmable gate arrays (FPGAs) for high-speed real-time control with microsecond-level response times. Complex system-level implementations may incorporate general-purpose processors running real-time operating systems. The global drive controller 470 may be implemented as a standalone control module positioned near the substrate array, integrated into the package or housing containing the device, or implemented as a software function within a larger system controller that manages multiple subsystems.

Gap control for the multi-substrate array architecture is coordinated by a global gap controller 430 that functions as the control electronics within the distributed gap-control subsystem, monitoring and maintaining the gaps 180 for all substrate modules. The global gap controller 430 receives gap measurement signals from capacitive sensors 110 functioning as sensing elements associated with each of the substrates 400, 410, and 420, providing real-time information about the separation distance between membrane 100 and each substrate surface at multiple measurement locations across the array. Processing these distributed sensor measurements, global gap controller 430 determines not only the local gap spacing at each substrate but also the overall planarity and alignment of membrane 100 relative to the substrate array, detecting any tilt, warping, or non-uniform spacing that might compromise performance or lead to contact. Based on the measured gap data and target setpoint values, global gap controller 430 computes control signals for actuators 120 functioning as actuation mechanisms associated with each substrate module, commanding appropriate position adjustments to maintain all gaps 180 at their desired values while maintaining membrane planarity and consistent spacing across the array.

The global gap controller 430 implements control algorithms that coordinate the action of multiple actuators 120 distributed across the array to achieve both local gap control at each substrate maintaining proper gap dimensions and global objectives such as membrane flatness and thermal expansion compensation. In one control approach, each substrate module has its own local control loop within the gap-control subsystem where dedicated actuators 120 adjust the position of that substrate relative to membrane 100 based on gap measurements from capacitive sensors 110 at that location, with global gap controller 430 providing setpoint values and coordination between local controllers to maintain consistent spacing. In another control approach, global gap controller 430 implements a centralized multi-input multi-output (MIMO) control strategy that directly commands all actuators 120 based on all sensor measurements, optimizing the collective actuator action to minimize gap errors across the entire array while maintaining mechanical constraints and uniform gap characteristics. Hybrid approaches may employ local control loops for fast response to disturbances with global coordination for slower corrections of systematic errors or thermal drift.

The control algorithms within global gap controller 430 must account for mechanical coupling between substrate modules through the shared membrane 100, where position adjustment of one substrate potentially influences the gap spacing at adjacent substrates depending on membrane stiffness and boundary conditions. This mechanical coupling may be modeled and incorporated into the control algorithm to predict cross-coupling effects and preemptively compensate for interactions, or may be treated as a disturbance that the feedback control rejects through integral action. The global gap controller 430 may also implement force balancing where the collective forces applied by all actuators 120 are controlled to avoid net forces or moments on membrane 100 that would create undesirable deflections or stress concentrations, particularly important when membrane 100 is relatively compliant or when large numbers of actuators distributed across a wide area could generate significant net loads if not properly coordinated.

Similar to global drive controller 470, the global gap controller 430 may be implemented using various computing platforms including microcontrollers for simple control laws, real-time processors for complex MIMO control, or distributed architectures where local gap controllers at each substrate communicate and coordinate through a supervisory controller. The control loop execution rate for gap control typically must be higher than for drive control due to the faster mechanical dynamics and disturbances affecting gap dimensions, with exemplary loop rates ranging from hundreds of hertz to tens of kilohertz depending on actuator bandwidth and required disturbance rejection. Communication between global gap controller 430 and the distributed actuators 120 and sensors 110 comprising the gap-control subsystem may employ analog signal interfaces for direct voltage control of actuators and capacitance measurement from sensors, digital communication protocols for command and telemetry data, or mixed-signal approaches combining analog actuation and sensing with digital control processing.

The multi-substrate array architecture illustrated in FIG. 4 provides a scalable platform for extending capabilities to large areas, high power densities, or complex load distributions that exceed the capacity of single-substrate implementations. By replicating the fundamental module with its posts, activation electrodes generating activation fields, and gap-control subsystem maintaining gaps across multiple independent or coordinated substrates, the device can address challenges at system level rather than component level. The independent drive systems 440, 450, and 460 controlled through global drive controller 470 enable flexible electromagnetic field management across the array with spatial control of patterns, while the coordinated gap control through global gap controller 430 and the distributed gap-control subsystem maintains precise gaps 180 across all substrate modules despite the distributed mechanical system. This architecture can be extended beyond the three substrates shown to encompass larger arrays with tens, hundreds, or more substrate modules arranged in one-dimensional linear arrays, two-dimensional planar arrays, or even three-dimensional stacked configurations for applications requiring extreme capacity or spatial flexibility.

The modular nature of the multi-substrate array provides additional advantages including simplified manufacturing where substrate modules can be fabricated, tested, and qualified individually before array integration, maintenance and repair capabilities where failed substrate modules can be replaced without discarding the entire device, staged deployment where arrays can be initially populated with a subset of substrates and expanded later as demands increase, and custom configurations where the number, size, and arrangement of substrate modules can be tailored for specific applications without requiring redesign of the fundamental module components. The distributed control architecture with global controllers 430 and 470 provides the coordination necessary to operate the array as a cohesive system while preserving the flexibility and modularity inherent in the multi-substrate approach.

FIG. 5 illustrates cross-sectional views of three exemplary electrode configurations (configuration A 500, configuration B 510, and configuration C 520) demonstrating architectural options for positioning activation electrodes 140 to generate activation fields across gap 180. The electrode configuration represents a design choice that influences field distribution characteristics, electrical drive requirements, fabrication complexity, and operational performance of the device. Different electrode placements create different field line geometries, voltage requirements for achieving target field strengths within the gap, and coupling mechanisms between the electrical drive signals and the processes occurring within gap 180. The selection of electrode configuration depends on multiple factors including the desired field distribution uniformity or concentration, the availability of electrical access to membrane 100 versus substrate 400, the need for independent control of different field components, fabrication capabilities and material compatibility, and system integration constraints regarding where electrical connections can be routed.

The fundamental principle underlying all electrode configurations is the generation of activation fields through the application of voltage differences between conducting activation electrodes, with the resulting electric field distribution determined by the electrode geometry, spacing, and applied potentials according to the governing electromagnetic boundary conditions. When time-varying voltages are applied to the activation electrodes by drive systems, the resulting time-varying activation fields create the conditions for operation within gap 180. The field strength achievable for a given applied voltage depends critically on the electrode configuration, with configurations that position electrodes on opposite sides of gap 180 generally requiring lower voltages to achieve target field strengths compared to configurations with electrodes on the same side, though the latter may offer advantages in terms of electrical access and fabrication simplicity.

Electrode configuration A 500 illustrates an arrangement wherein activation electrode 502 is positioned on or within substrate 400 on the same side of gap 180 as the substrate posts, with no corresponding electrode structure on membrane 100. In this configuration, activation electrode 502 generates activation fields that extend from the substrate surface through the volume occupied by posts 130 and across gap 180 toward membrane 100, with the field lines terminating on membrane 100 either through capacitive coupling if membrane 100 is electrically floating, through connection to ground or a reference potential if membrane 100 is electrically connected, or through coupling to surrounding structures or space depending on the boundary conditions. The single-sided electrode configuration of configuration A 500 offers significant practical advantages including simplified electrical access since all electrode connections route through substrate 400 without requiring electrical connections to membrane 100 which may be mechanically dynamic due to gap-control subsystem actuation, reduced fabrication complexity as membrane 100 can be a simple mechanically and thermally functional component without integrated electrical structures, and greater flexibility in membrane materials since there is no requirement for membrane 100 to incorporate conductive layers or electrical isolation structures.

Activation electrode 502 in configuration A 500 may be implemented as a single substantially continuous planar electrode layer extending across substantially the entire surface area of substrate 400, creating a uniform baseline electrode that generates nominally uniform activation fields across the entire active region when energized. In this implementation, the planar electrode 502 may be positioned on the surface of substrate 400 as a thin conductive film deposited through physical vapor deposition, electroplating, or other metallization processes, with posts 130 fabricated on top of the electrode layer such that the posts either directly contact the electrode for electrical continuity or are separated by a thin dielectric layer depending on whether the posts themselves are intended to be at the electrode potential. Alternatively, planar electrode 502 may be buried within the bulk of substrate 400 below the surface from which posts 130 extend, with the electrode forming an internal conductive plane that generates activation fields extending upward through the substrate material to emerge at the surface and posts. This buried electrode configuration may be achieved through ion implantation to create a doped conductive layer in semiconductor substrates, through embedded metal layers in multilayer substrate structures, or through conductive layers sandwiched between substrate wafers in bonded assemblies.

In an alternative implementation of configuration A 500, activation electrode 502 comprises multiple separate electrode elements distributed across the surface of substrate 400 with spatial gaps or separation regions between adjacent electrode elements. These multiple electrodes may be individually addressed with independent voltages to enable spatial control of the activation field distribution, or may be electrically connected in groups or patterns to create specific field configurations. The spatial arrangement of multiple electrode elements might include interdigitated patterns where electrode fingers at different potentials alternate across the surface to create lateral field components in addition to vertical fields, concentric ring patterns where annular electrodes at progressively different potentials create radially varying field distributions, checkerboard patterns where electrode elements are arranged in a two-dimensional grid with nearest neighbors at different potentials to create complex three-dimensional field patterns, or irregular patterns where electrode placement is optimized for specific load distributions or post locations. The gaps between separate electrode elements may be filled with dielectric material to maintain substrate structural integrity and prevent electrical breakdown, or may be open spaces if the substrate material itself provides sufficient electrical isolation.

The field distribution created by activation electrode 502 in configuration A 500 exhibits characteristic patterns determined by the electrode geometry and the boundary conditions at membrane 100. For a planar electrode configuration with electrically floating or grounded membrane 100, field lines extend generally perpendicular to the substrate surface near the center of large planar regions, curving toward parallel to the surface near electrode edges where fringing fields occur. The posts 130 create local field concentrations regardless of the electrode configuration, as the geometric effects of the post structures amplify whatever baseline activation field is established by the electrode. When multiple separate electrodes are employed with different applied potentials, the field distribution includes components parallel to the substrate surface in addition to perpendicular components, with the field pattern determined by the potential distribution and spacing between electrodes.

Electrode configuration B 510 illustrates an arrangement wherein activation electrodes are positioned on both sides of gap 180, with electrode 512 positioned on or within substrate 400 and a corresponding electrode 514 positioned on the bottom surface of membrane 100 facing gap 180. This dual-sided electrode configuration creates a capacitor-like structure where membrane electrode 514 and substrate electrode 512 form opposing plates separated by gap 180, with activation fields extending between the electrodes predominantly perpendicular to the surfaces. Configuration B 510 offers several advantages including lower voltage requirements to achieve target field strengths within gap 180 since the field concentrates primarily in the gap region between closely spaced opposing electrodes rather than extending into semi-infinite space, more uniform field distribution across the gap with predominantly vertical field components except near posts 130 where geometry creates geometric enhancement, improved electrical efficiency as most of the applied voltage drops across the narrow gap 180 rather than being distributed over larger distances, and reduced electromagnetic radiation or coupling to surrounding structures since the activation field is well-confined between the opposing electrodes.

Substrate electrode 512 in configuration B 510 may be implemented similarly to electrode 502 in configuration A 500, either as a single planar electrode extending across the substrate surface or as multiple separate electrode elements depending on the desired field distribution and control granularity. The fabrication and material considerations for substrate electrode 512 are essentially identical to those described for configuration A, with the electrode positioned on or within substrate 400 using standard metallization or doping techniques compatible with the substrate material and fabrication process flow.

Membrane electrode 514 in configuration B 510 requires integration of conductive structures onto or into membrane 100, which introduces additional fabrication considerations and design constraints beyond the simpler membrane structure in configuration A 500. Membrane electrode 514 may be implemented as a continuous thin conductive film deposited on the surface of membrane 100 facing substrate 400, with exemplary materials including metals such as gold, aluminum, or copper deposited through sputtering, evaporation, or electroplating to thicknesses ranging from nanometers to micrometers depending on electrical resistance requirements and membrane mass constraints. The conductive film forming membrane electrode 514 must be sufficiently thin to avoid adding excessive mass that would burden actuation mechanisms within the gap-control subsystem or alter membrane mechanical dynamics, yet thick enough to provide adequate electrical conductivity for uniform potential distribution across the electrode area. For large-area membranes, the sheet resistance of thin electrode films may require multiple electrical connection points around the perimeter to maintain voltage uniformity and consistent activation field generation, or may necessitate use of thicker films or lower-resistivity materials despite the mass penalty.

Alternative implementations of membrane electrode 514 may employ transparent conductive materials such as indium tin oxide (ITO) or other transparent conducting oxides if optical transparency is required for applications involving light transmission through membrane 100, conductive polymers or organic conductors for flexible membrane implementations where metal films might crack under mechanical deformation during gap-control subsystem operation, or composite structures combining metal grids for low resistance with transparent or flexible matrix materials for mechanical compliance. The membrane electrode 514 must maintain electrical continuity during operation despite any flexing, vibration, or deflection of membrane 100 that occurs during gap control by the gap-control subsystem or due to environmental disturbances, requiring careful selection of electrode materials and structures that can accommodate the expected mechanical strains without fracture or delamination that would compromise activation field generation.

Electrical connection to membrane electrode 514 presents practical challenges since membrane 100 is typically mechanically dynamic, moving vertically under control of actuators within the gap-control subsystem to maintain gap 180, and potentially vibrating or deflecting due to disturbances or electrostatic forces from activation fields. The electrical connection must provide reliable low-resistance contact while accommodating membrane motion without generating mechanical forces that would interfere with gap control or introduce positional hysteresis. Exemplary connection approaches include but are not limited to flexible wire bonds that can flex during membrane motion, spring-loaded contacts such as pogo pins that maintain pressure contact while allowing linear displacement, sliding contacts where conductive elements maintain physical contact during relative motion with designed friction characteristics, or capacitive coupling where electrical signals are transferred wirelessly across small gaps using alternating fields rather than direct galvanic contact.

Similar to Configuration A 500, the electrodes in configuration B 510 may be implemented as single planar elements or as multiple separate electrode elements. In dual-sided configurations, the substrate electrode 512 and membrane electrode 514 may both be single continuous planes creating a simple parallel-plate capacitor structure, or one or both electrodes may be patterned into multiple elements enabling more complex field distributions and spatially varying patterns. Interdigitated configurations where substrate electrode 512 comprises multiple elements at different potentials while membrane electrode 514 remains a single ground plane or vice versa combine aspects of lateral field generation with perpendicular field components. Fully addressable configurations where both substrate electrode 512 and membrane electrode 514 comprise multiple independently controlled elements enable three-dimensional field shaping with unprecedented flexibility, though at the cost of significantly increased electrical routing complexity and number of electrical connections required.

The field distribution in configuration B 510 with dual-sided electrodes exhibits predominantly vertical field components extending between opposing electrodes across gap 180, with field strength in the gap region typically much higher than in configuration A for equivalent applied voltages due to the short electrode spacing equal to the gap dimension. The presence of posts 130 between the electrodes creates local field perturbations where field lines concentrate at post tips and edges, producing the geometric effects. The activation field outside gap 180 in regions beyond the electrode edges or between membrane 100 and surrounding structures remains relatively weak in configuration B compared to configuration A, reducing parasitic coupling and electromagnetic interference while concentrating the field energy where it contributes to useful operation through confinement in the gap.

Electrode configuration C 520 illustrates an arrangement wherein activation electrode 522 is integrated into the body or structure of membrane 100 rather than being positioned as a surface layer. In this configuration, electrode 522 forms an internal conductive element or layer embedded within membrane 100, with the electrode potentially positioned at various depths ranging from just below the surface facing gap 180 to near the opposite surface of membrane 100, or potentially spanning substantial membrane thickness as a three-dimensional electrode structure. Configuration C 520 offers unique advantages including direct electromagnetic coupling between the electrode and the material of membrane 100, mechanical protection of the electrode since the conductive element is encapsulated within membrane 100 rather than exposed on surfaces where it could be damaged or contaminated, potential for creating field gradients within the membrane thickness if multiple electrodes at different depths are incorporated, and opportunities for multifunctional membrane designs where the embedded electrode serves additional purposes such as heating, sensing, or electromagnetic shielding in addition to activation field generation.

The integrated electrode 522 in configuration C 520 may be fabricated through various approaches depending on the membrane material and structure. For membranes fabricated from layered materials, electrode 522 may comprise a metal film or patterned conductor layer deposited during layer-by-layer assembly, with subsequent membrane layers deposited or bonded on top to encapsulate the electrode. For membranes fabricated from bulk materials, electrode 522 may be created through ion implantation to create conductive doped regions at controlled depths, through laser processing to create localized conductive paths or regions within the material, through embedding of conductive particles or fibers within a matrix material during membrane formation, or through microfabrication processes involving selective etching of cavities or trenches followed by metal deposition and planarization to create buried electrodes. The membrane material surrounding electrode 522 must provide both mechanical support and electrical isolation, requiring dielectric properties sufficient to prevent current leakage while maintaining membrane mechanical integrity under operating stresses imposed during gap-control subsystem operation.

Electrical connection to integrated electrode 522 requires access points where the embedded electrode is brought to a membrane surface or edge for electrical contact. These access points or vias may be positioned at membrane edges or corners where connection to external electrical systems generating activation fields is convenient, potentially using the same connection techniques described for membrane electrode 514 in configuration B including flexible wires, spring contacts, or capacitive coupling. The depth of electrode 522 within membrane 100 and the distance from embedded electrode to connection points influences the electrical resistance and capacitance of the connection path, with implications for signal integrity particularly at higher radio frequencies where inductance and distributed capacitance become significant for activation field generation.

The field distribution created by integrated electrode 522 in configuration C 520 depends on the electrode depth within membrane 100 and the dielectric properties of the membrane material. If electrode 522 is positioned near the surface facing gap 180, separated from the gap by only a thin dielectric layer of membrane material, the field distribution closely approximates that of configuration B with surface electrodes, with activation fields extending from the embedded electrode through the thin dielectric layer and across gap 180 toward substrate 400 with similar characteristics. If electrode 522 is positioned deeper within membrane 100, the activation fields must penetrate a thicker layer of membrane material before reaching gap 180, with the membrane dielectric constant determining the field strength distribution through this region. Higher dielectric constant membrane materials concentrate more of the voltage drop within the membrane thickness, potentially reducing the field strength available in gap 180 for a given applied voltage, while lower dielectric constant materials more closely approach the field distribution of vacuum or air gaps.

Configuration C 520 enables sophisticated multi-layer electrode architectures where multiple integrated electrodes 522 at different depths within membrane 100 create complex three-dimensional field patterns. Multiple electrodes driven with different voltages, frequencies, or phases enable field shaping within the membrane volume and across gap 180 that would be impossible with single-layer electrode configurations. Such multilayer structures might implement field gradients designed to drive directional energy flow, resonant cavity structures where electrode spacing corresponds to electromagnetic wavelength fractions creating standing wave patterns, or phased array configurations where relative phases between depth-distributed electrodes create beam steering or focusing effects that concentrate activation fields in specific regions of the gap.

Across all three configurations shown in FIG. 5, the fundamental principle remains that activation electrodes create time-varying activation fields within gap 180 that, in combination with the geometry of posts 130, enable device operation. The choice among configuration A 500 with substrate-side electrodes only, configuration B 510 with dual-sided electrodes, and configuration C 520 with membrane-integrated electrodes involves design trade-offs considering electrical access and connection complexity, fabrication process compatibility and yield, field strength and uniformity requirements, voltage and power supply constraints, membrane mass and mechanical dynamics considerations for the gap-control subsystem, and system integration factors such as where electrical routing is most convenient or where different components are manufactured and assembled. In some embodiments, hybrid configurations combining aspects of multiple configurations may be employed, such as substrate-side electrodes for baseline activation field generation complemented by membrane-integrated electrodes for field modulation, or asymmetric configurations where different regions of the device employ different electrode architectures optimized for local requirements.

Furthermore, any of the electrode configurations shown in FIG. 5 may be implemented with the substrate electrode 502, 512, or corresponding substrate-side elements being either single continuous planar electrodes extending across substantially the entire substrate area, or multiple separate electrode elements with spatial gaps between them creating patterned electrode arrays. Similarly, membrane electrodes 514 or 522 when present may be single continuous elements or multiple separate elements depending on whether spatial control of the activation field distribution is desired. The flexibility in electrode configuration enables optimization of the electromagnetic field characteristics for specific applications, load patterns, or operational requirements while maintaining the core functionality of generating controlled time-varying activation fields within gap 180 to enable operation between membrane 100 and substrate 400.

Figure 6:
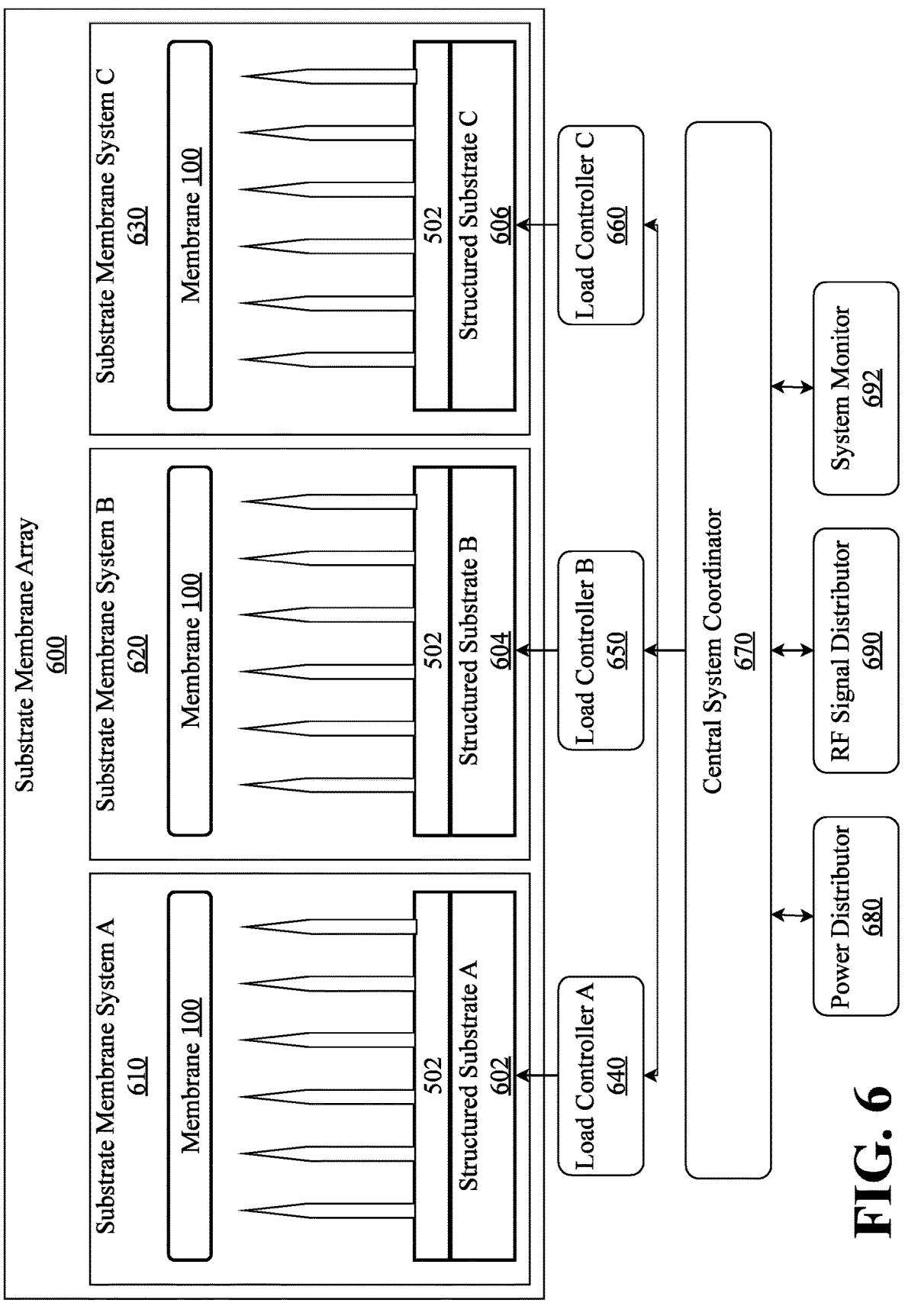
FIG. 6 illustrates a system-level architecture wherein multiple substrate-membrane systems are integrated into a coordinated array with centralized control and distribution infrastructure.

FIG. 6 illustrates a system-level architecture wherein multiple substrate-membrane systems are integrated into a coordinated array 600 with centralized control and distribution infrastructure. The figure depicts three substrate-membrane systems (substrate membrane system A 610, substrate membrane system B 620, and substrate membrane system C 630), each comprising a dedicated membrane 100 paired with its corresponding substrate (substrate A 602, substrate B 604, and substrate C 606 respectively). This architecture represents a scaling approach beyond the shared-membrane multi-substrate configuration shown in FIG. 4, wherein each substrate module has its own independent opposing surface rather than multiple substrates sharing a common opposing surface, providing even greater modularity, thermal isolation between modules, and flexibility in system configuration. The substrate-membrane array 600 enables deployment across very large areas, distributed spatial regions, or complex three-dimensional geometries where multiple independent units must operate in coordination to address system-level requirements through distributed gaps and activation field generation.

Each substrate-membrane system 610, 620, and 630 functions as a complete independent module incorporating all the essential components previously described for single-substrate implementations. Substrate membrane system A 610 comprises membrane 100 positioned above substrate A 602, with a gap maintained between them through gap-control subsystem mechanisms, substrate posts extending from the substrate toward the membrane, and activation electrode 502 positioned on or within the substrate to generate activation fields. Similarly, substrate membrane system B 620 and substrate membrane system C 630 each comprise their own dedicated membrane 100 and substrate 604 and 606 respectively, with corresponding substrate posts, electrodes 502 generating activation fields, and gap-control subsystem components maintaining gaps. The use of dedicated opposing surfaces for each substrate module provides complete thermal isolation between modules where heat conducted into one membrane does not directly spread to adjacent membranes unless they are deliberately thermally coupled through external structures, mechanical independence where position control by the gap-control subsystem or dynamics of one membrane does not directly affect others except through possible coupling via support structures, and the ability to operate modules at different temperatures or under different load conditions without cross-influence while maintaining independent operation in each gap.

The spatial arrangement of the three substrate-membrane systems shown may represent various physical configurations depending on the application requirements. In one exemplary arrangement, the three systems are positioned side-by-side in a linear array or two-dimensional grid pattern, creating an extended area of capability with distributed gaps where each module addresses a specific spatial region of a distributed load through its own activation fields. The spacing between adjacent substrate-membrane systems may range from close proximity where modules nearly touch to create continuous spatial coverage with overlapping regions, to substantial separation where modules address thermally isolated regions or where intervening space accommodates other system components. In another exemplary arrangement, the substrate-membrane systems may be positioned at different vertical levels in a stacked configuration, enabling three-dimensional operation where sources at multiple elevations each have dedicated modules with independent gaps. In yet another arrangement, the systems may be positioned on different faces or surfaces of a complex three-dimensional structure such as an electronics enclosure, distributing capability around the perimeter or across multiple exposed surfaces.

Each of the substrates 602, 604, and 606 incorporates posts 130 and activation electrodes 502 as described in previous figures, with the substrate posts creating geometries and the electrodes generating the activation fields necessary for operation within their respective gaps. The activation electrodes 502 shown in each substrate represent any of the electrode configurations previously described, including substrate-side only electrodes as in configuration A of FIG. 5, dual-sided configurations with electrodes on both substrate and opposing surface membrane, or membrane-integrated electrodes as in configuration C. The specific electrode configuration may be identical across all three substrate-membrane systems for uniformity and manufacturing simplicity, or may vary between systems to optimize each module for its particular operating conditions, load characteristics, or desired patterns. Similarly, the substrate posts within each substrate 602, 604, and 606 may have identical geometries and distributions across all modules to provide uniform characteristics, or may be tailored with different post shapes, dimensions, densities, or arrangements to match local requirements and create spatially optimized distributions as described in FIG. 3.

Coordinating and controlling the operation of the substrate-membrane array 600 is a hierarchical control architecture comprising local controllers for individual modules and system-level controllers for array coordination. Load controller A 640, load controller B 650, and load controller C 660 provide localized control for substrate membrane system A 610, system B 620, and system C 630 respectively. Each load controller manages the operation of its associated substrate-membrane system including gap-control subsystem functions such as reading capacitive sensors or other gap measurement devices functioning as sensing elements to determine gap spacing, computing control signals through feedback algorithms such as PID control to maintain target gap dimensions, and commanding actuators functioning as actuation mechanisms to adjust membrane position relative to the substrate. The load controllers also manage drive functions including generating or controlling the waveforms applied to activation electrodes 502, setting frequency, amplitude, and phase parameters for activation fields based on local requirements or commands from higher-level controllers, monitoring electrical parameters such as drive current or reflected power to assess system state and field generation, and implementing protection functions to prevent electrical breakdown or component damage. Additionally, load controllers may monitor thermal conditions through temperature sensors positioned on the opposing surface membrane, substrate, or adjacent components, providing feedback on effectiveness, and enabling closed-loop thermal control where the drive parameters generating activation fields are adjusted to achieve target temperatures or heat transfer rates.

The load controllers 640, 650, and 660 may be implemented as dedicated electronic assemblies positioned in close proximity to their respective substrate-membrane systems for short signal paths and reduced noise susceptibility, integrated directly onto the structured substrates as part of the device packaging, or implemented as software/firmware functions within a larger distributed control system. Each load controller contains the necessary signal processing, control computation, and drive circuitry to independently operate its substrate-membrane system including gap-control subsystem management and activation field generation, providing autonomous functionality where the module can maintain gap control ensuring proper gap dimensions and continue operation even if communication with higher-level controllers is interrupted. This distributed control architecture enhances system reliability through graceful degradation where failure of one load controller or substrate-membrane system does not compromise operation of other modules maintaining their gaps, enables parallel processing where control computations for different modules execute simultaneously rather than sequentially on a centralized processor, and reduces communication bandwidth requirements since only high-level commands and status information need to flow between load controllers and system-level coordinators rather than low-level sensor data and actuator commands from the gap-control subsystems.

Overseeing the operation of the entire substrate-membrane array 600 and coordinating the activities of the local load controllers is a central system coordinator 670 that implements system-level control strategies and optimization across all gaps and activation field patterns. Central system coordinator 670 receives system-level inputs including overall thermal load information indicating the total heat to be managed and its spatial distribution across the array, power budget constraints specifying the maximum electrical power available for the entire system or limits on power consumption by individual modules, performance targets defining desired metrics such as maximum component temperatures, thermal response times, or energy efficiency through optimized operation, and operational mode commands selecting between different control strategies such as maximum performance, energy efficiency optimization, or balanced operation. Based on these system-level requirements and real-time feedback from load controllers 640, 650, and 660, central system coordinator 670 computes appropriate setpoints, parameters, and commands for each module to achieve coordinated array operation that optimizes system-level objectives rather than simply maximizing individual module performance, considering gap dimensions, activation field characteristics, and effectiveness across all modules.

Central system coordinator 670 implements various system-level optimization and coordination functions. Thermal load balancing distributes the total demand across available substrate-membrane systems to avoid overloading any single module, accounting for the varying thermal loads at different physical locations and dynamically adjusting power allocation, gap dimensions, and activation field strength as thermal patterns change during operation. Power optimization determines the most energy-efficient distribution of electrical power across modules to achieve required thermal performance with minimum total power consumption, potentially reducing power to modules experiencing lower thermal loads while maintaining full activation field power to high-demand regions. Predictive control anticipates future thermal load changes based on historical patterns, sensor trends, or external information about system activities, preemptively adjusting parameters including gap spacing and activation field characteristics to minimize temperature excursions when loads change. Fault management detects failures or degradation in individual substrate-membrane systems through monitoring of sensor data, performance metrics, or diagnostic checks related to gap-control subsystem operation or activation field generation, and reconfigures the array operation to compensate by redistributing load to healthy modules maintaining proper gaps and potentially shutting down or isolating failed units. Maintenance scheduling tracks operating hours, thermal cycles, or other wear indicators for each module to predict maintenance requirements and optimize maintenance intervals across the array to minimize system downtime.

The central system coordinator 670 communicates with local load controllers 640, 650, and 660 through bidirectional data links that may employ various communication protocols depending on system complexity and performance requirements. The communication architecture may be centralized star topology where central system coordinator 670 directly connects to each load controller, distributed bus topology where all controllers share a common communication medium, or hierarchical networks with intermediate aggregation layers for large arrays with many substrate-membrane systems maintaining distributed gaps.

Central system coordinator 670 may be implemented using various computing platforms depending on the scale and complexity of the substrate-membrane array 600. Small arrays with a few substrate-membrane systems may employ microcontroller-based coordinators executing supervisory control functions at moderate rates sufficient for thermal management time scales. Medium-scale arrays may utilize embedded computers running real-time operating systems, providing greater computational resources for optimization algorithms, data logging, and communication interfaces. Large-scale arrays or systems requiring advanced control may employ industrial PCs, programmable logic controllers (PLCs), or distributed computing architectures with multiple processors sharing coordination responsibilities. The central system coordinator 670 may include human-machine interface (HMI) capabilities providing graphical displays of system status including gap dimensions, activation field parameters, and thermal performance across all modules, configuration tools for setup and parameter adjustment, and diagnostic features for troubleshooting and maintenance. Integration with higher-level system management platforms through standard industrial communication protocols or IT interfaces enables the substrate-membrane array 600 to function as a managed subsystem within larger facility control systems.

Supporting the distributed substrate-membrane systems are centralized infrastructure components that provide electrical power and signal distribution across the array. Power distributor 680 receives input power from external sources such as AC mains, DC power supplies, or energy storage systems, and distributes electrical power to the individual load controllers 640, 650, and 660 and their associated substrate-membrane systems including gap-control subsystems and activation field generation systems. Power distributor 680 may implement various power distribution functions including voltage regulation to provide stable DC voltages at required levels for control electronics, gap-control subsystem actuation mechanisms, and drive systems generating activation fields, power conversion to transform input power to appropriate voltage and current characteristics for system components, power monitoring measuring current and voltage at individual outputs to track power consumption by each module, circuit protection providing overcurrent protection, short circuit protection, and fault isolation to prevent failures in one module from affecting others, and power sequencing controlling the startup and shutdown order of different system sections to prevent inrush currents or voltage instabilities. The power distribution architecture may employ centralized conversion where power distributor 680 provides final regulated voltages distributed to all modules, distributed conversion where power distributor 680 provides intermediate bus voltages with local converters at each load controller performing final regulation, or hybrid approaches combining centralized distribution of some power rails with distributed conversion of others.

RF signal distributor 690 generates and distributes reference signals, clock signals, or RF carrier signals that are used by the individual load controllers 640, 650, and 660 in generating the activation fields applied to activation electrodes 502 within each gap. In systems where all substrate-membrane systems operate at the same fundamental frequency with controlled phase relationships to create coordinated patterns across the array, RF signal distributor 690 may provide a master clock or carrier signal that propagates to all load controllers ensuring frequency coherence and enabling precise phase control for array-level field coordination. The distributed signals may include sinusoidal RF carriers at the operating frequency, digital clock signals that are multiplied or processed locally to generate drive waveforms for activation fields, or digital communication streams carrying frequency and phase commands that local synthesizers translate into drive signals. RF signal distributor 690 may incorporate signal generation circuitry such as crystal oscillators, frequency synthesizers, or direct digital synthesis (DDS) systems to produce stable accurate signals, signal conditioning including amplification, filtering, and impedance matching to ensure signal integrity across distribution paths, and signal splitting or buffering to provide multiple outputs driving different load controllers without mutual coupling or loading effects.

In some embodiments, RF signal distributor 690 may be omitted if each load controller 640, 650, and 660 contains independent signal generation capability for activation fields and phase-coherent operation coordinating operation across multiple gaps is not required, or if the central system coordinator 670 provides frequency and timing commands through the digital communication interface rather than distributing analog RF signals. In other embodiments requiring tight synchronization or precise phase relationships between substrate-membrane systems to create coordinated patterns across the array, RF signal distributor 690 may provide multiple synchronized signals at different frequencies or phases, or may distribute a common reference clock with each load controller implementing local synthesizers that derive their operating frequencies for activation fields from the reference with precisely controlled phase offsets commanded by central system coordinator 670.

System monitor 692 provides array-level monitoring, data acquisition, and diagnostic functions that complement the control functions of central system coordinator 670. System monitor 692 may collect data from sensors distributed throughout substrate-membrane array 600 including temperature sensors measuring opposing surface membrane, substrate, or ambient temperatures at multiple locations, thermal load sensors such as heat flux sensors or power monitors tracking energy flow into and out of the system, environmental sensors measuring ambient conditions like pressure, humidity, or vibration that might affect operation of gap-control subsystems or gaps, and electrical sensors monitoring voltages, currents, or RF power at various points in the system generating activation fields. This collected sensor data is processed by system monitor 692 to compute derived quantities such as thermal resistance values indicating effectiveness, thermal response times characterizing dynamic performance, power efficiency metrics quantifying electrical input power versus thermal power managed, and performance trends showing how system characteristics change over time due to aging or operating condition variations affecting gap stability or activation field generation.

System monitor 692 implements diagnostic and condition monitoring functions that detect anomalies, predict failures, or assess system health across all gap-control subsystems and activation field generation systems. Anomaly detection algorithms compare sensor readings against expected ranges or patterns to identify out-of-specification conditions that might indicate problems developing with gap maintenance, activation field generation, or effectiveness. Performance trending analyzes historical data to identify gradual degradation in effectiveness, gap-control subsystem stability, or electrical efficiency that could indicate fouling of surfaces, degradation of actuators or sensors within gap-control subsystems, or other age-related changes requiring maintenance. Predictive maintenance models estimate remaining useful life of components based on operating hours under various stress conditions, thermal cycles, or other accumulated damage mechanisms. Fault diagnostics correlate symptoms such as increased gap control error affecting gap dimensions, reduced effectiveness, or abnormal electrical characteristics in activation field generation with likely failure modes to guide troubleshooting and repair activities. The monitoring data and diagnostic results are communicated to central system coordinator 670 for use in control decisions, logged to non-volatile storage for historical analysis and compliance documentation, and optionally transmitted to external systems through network interfaces for remote monitoring or integration with facility-wide maintenance management systems.

The substrate-membrane array 600 architecture illustrated in FIG. 6 represents a highly scalable and flexible approach to implementing large-scale systems through distributed devices. By replicating complete substrate-membrane systems as independent modules with dedicated opposing surfaces rather than sharing opposing surfaces as in the configuration of FIG. 4, this architecture achieves maximum modularity where each module is a self-contained functional unit with its own gap, activation field generation, and gap-control subsystem that can be independently designed, manufactured, tested, installed, operated, maintained, and replaced. The hierarchical control architecture with local load controllers 640, 650, 660 providing autonomous module operation of gap-control subsystems and activation field generation, and central system coordinator 670 implementing array-level optimization of patterns and distribution, balances the benefits of distributed control for reliability and parallel processing with centralized coordination for system-level efficiency and performance. The supporting infrastructure of power distributor 680, RF signal distributor 690, and system monitor 692 provides the essential electrical power, signal distribution for activation field generation, and monitoring capabilities required for coordinated array operation across multiple gaps.

This architecture readily extends to arrays containing many more substrate-membrane systems than the three shown, potentially scaling to tens, hundreds, or even thousands of independent modules for applications requiring very large area coverage, distributed spatial deployment, or extremely high total capacity through distributed operation. The modular architecture enables flexible system configurations where substrate-membrane systems can be positioned in one-dimensional linear arrays, two-dimensional planar arrays, three-dimensional space-filling arrangements, or irregular configurations matching the geometry of the thermal load or available space, with each module maintaining its own gap. The independent opposing surface approach provides complete thermal isolation between modules allowing different regions to operate at different temperatures or under different thermal load conditions without thermal coupling, and enables sequential installation where an initial array is deployed and additional substrate-membrane systems with their gaps are added later as thermal demands increase without modifying existing modules. This scalable, modular, and flexible architecture enables practical implementation for demanding thermal management applications across diverse industries including large-scale electronics cooling for data centers or supercomputers where distributed operation addresses complex thermal loads, distributed thermal management for vehicles or aircraft, industrial process temperature control across extended equipment, and building climate control systems requiring zoned temperature management across large areas through distributed operation in multiple gaps.

Figure 7:
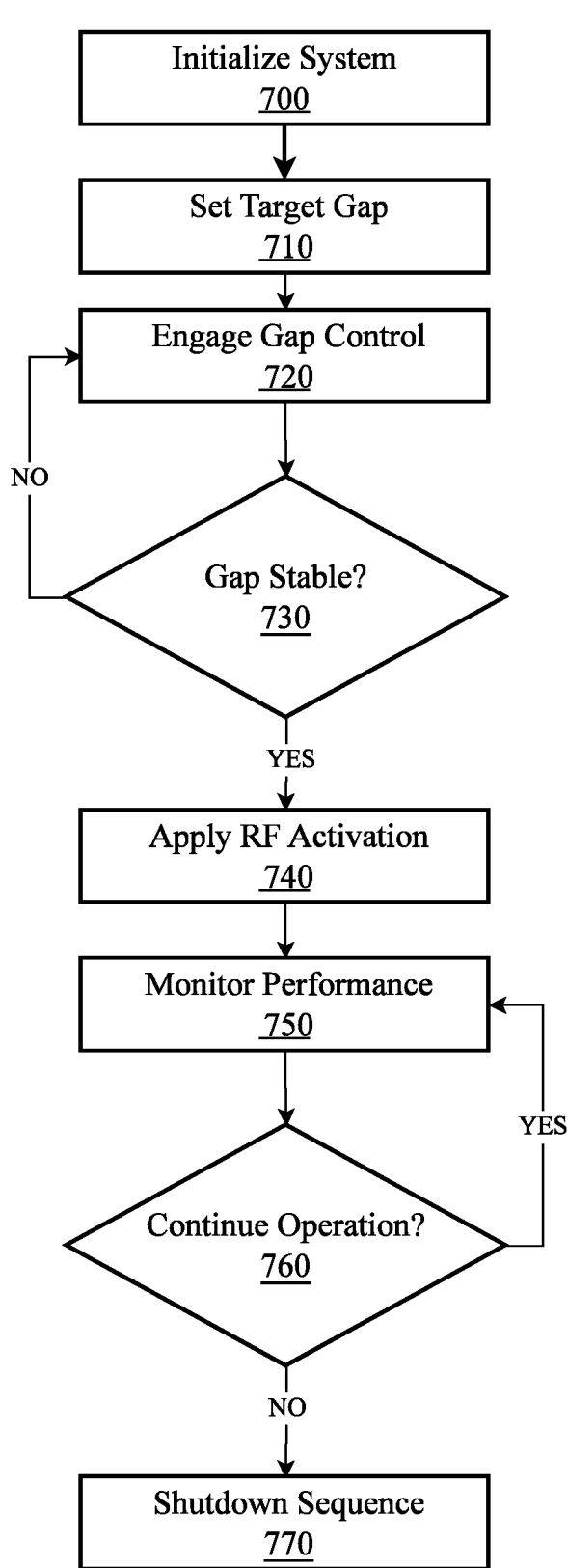
FIG. 7 illustrates a flowchart for an exemplary method of operating the device through controlled electromagnetic field generation across a precisely maintained gap.

FIG. 7 illustrates a flowchart for an exemplary method of operating the device through controlled electromagnetic field generation across a precisely maintained gap. The method provides a systematic operational framework that ensures proper sequencing of critical functions including system initialization, gap establishment and stabilization, electromagnetic field activation, performance monitoring, and controlled shutdown. This operational method applies broadly to any device configuration previously described, encompassing single substrate-membrane systems, multi-substrate arrays sharing a common membrane, or distributed arrays with independent substrate-membrane modules. The method emphasizes the fundamental principle that gap control must be established and stabilized before electromagnetic field activation occurs, preventing surface contact or gap instability that could result from electrostatic forces acting on an uncontrolled or improperly positioned membrane.

In a first step 700, the system is initialized to prepare all subsystems for operation. System initialization brings electronic, mechanical, and control subsystems from powered-down or standby states to operational readiness. Power is applied to gap controllers, drive systems, sensor circuits, and processors, allowing these components to complete startup sequences and stabilize. Self-test routines verify functionality of actuators, sensors, and communication links, confirming that critical components respond properly before attempting operational movements or field generation. Initial position acquisition determines the starting gap separation between membrane and substrate, which may be at a large safe standby spacing or approximately at the operational gap depending on system design. Calibration data including sensor sensitivities, actuator gains, and compensation coefficients are loaded to account for device-specific characteristics. System initialization establishes the baseline operational state from which subsequent control actions proceed.

In a step 710, a target gap value is established to define the desired separation for operation. The target gap specification determines the nanometer-scale spacing that will be maintained during operation, balancing effectiveness against gap control stability and mechanical robustness. Target gap values may range from a few nanometers to tens or hundreds of nanometers for applications prioritizing robust operation. The target may be a uniform setpoint across the entire membrane area or multiple values for different regions accommodating non-uniform conditions. Target gaps may be predetermined optimal values identified during characterization, computed in real-time based on load conditions and optimization objectives, commanded by higher-level controllers based on application requirements, or selected based on operational mode such as high-performance, efficiency, or standby modes. The target gap setting provides the reference value against which subsequent gap control operations regulate the actual spacing.

In a step 720, active gap control is engaged to begin regulating the separation toward the target value. Gap control engagement initiates the continuous feedback control loop that measures the current gap through capacitive sensors or alternative sensing mechanisms, computes position error by comparing measured values against the target setpoint, executes control algorithms such as PID control to determine appropriate actuator commands based on the error, and drives actuators to generate forces or displacements adjusting membrane position. The feedback loop operates at rates from hundreds of hertz to tens of kilohertz, continuously updating measurements and actuator commands to drive the gap toward its target value. During initial engagement, the control system transitions from whatever initial spacing exists to the target gap using controlled approach trajectories that prevent excessive overshoot or mechanical shock. Rate limiting and gain scheduling may be employed to ensure stable convergence. Multiple actuators are coordinated to maintain membrane planarity throughout the positioning process. Gap control engagement represents the critical transition from open-loop positioning to closed-loop regulation that enables precise nanometer-scale gap maintenance.

In a step 730, the system evaluates whether the gap has stabilized at the target value within acceptable tolerances. Gap stability assessment examines multiple criteria to determine readiness for electromagnetic field activation. The magnitude of gap error is evaluated to confirm that measured spacing deviates from target by less than specified tolerance, typically sub-nanometer or a small percentage of target gap. Error settling is assessed by examining whether the error has converged and stopped changing or oscillating, potentially requiring sustained compliance for a minimum duration. Actuator commands are checked to verify they remain within normal operating range without saturation, confirming the target is achievable with available control authority. Additional assessments may include membrane planarity verification across multiple measurement locations, oscillation detection to identify any control instability or resonances, and multi-module coordination in arrays to ensure all gaps have stabilized simultaneously. If stability criteria are not met, the method continues gap control engagement, allowing additional convergence time. If criteria are satisfied, the method proceeds to field activation. Timeout mechanisms may detect prolonged failure to stabilize, indicating faults requiring intervention.

In a step 740, electromagnetic fields are generated across the gap by energizing the activation electrodes. Activation applies time-varying electrical signals from drive systems to activation electrodes, creating electromagnetic fields within the stabilized gap. The drive system generates waveforms with specified frequency, amplitude, phase, and modulation characteristics appropriate for the device configuration and operating conditions. Field activation may employ various turn-on profiles including gradual ramp-up to avoid transient disturbances, step turn-on for fastest activation, or burst-mode activation with progressively increasing duty cycle. During activation, gap control continues operating to compensate for electrostatic forces that attract the membrane toward the substrate when fields are present. These field-induced forces can be significant at high field strengths, requiring the gap controller to automatically adjust actuator commands maintaining the target gap despite the additional loading. Activation transitions the device from mechanical setup to active operation where electromagnetic fields create the conditions for operation.

In a step 750, device performance is continuously monitored to assess operational effectiveness and system health. Performance monitoring encompasses multiple parallel measurement and analysis activities throughout operation. Thermal monitoring measures temperatures at membrane, substrate, heat load, and heat sink locations, computes thermal resistance or conductance metrics, and tracks spatial temperature distribution and temporal stability. Electrical monitoring measures drive voltage, current, and power consumption, assesses waveform quality, detects impedance changes indicating component degradation, and computes power efficiency. Mechanical monitoring tracks gap spacing continuously, evaluates actuator command levels and saturation margins, detects vibrations or oscillations, and assesses membrane planarity. Collected performance data serves multiple functions including real-time control feedback for adaptive optimization, fault detection identifying anomalies requiring corrective action, data logging for historical analysis and documentation, and external reporting to system controllers or operators. Performance monitoring provides the ongoing assessment necessary to verify successful operation and detect conditions requiring intervention.

In a step 760, a determination is made whether to continue active operation or proceed to shutdown. The continue operation decision evaluates multiple conditions and inputs determining the appropriate operational state. External commands from controllers or operators may directly specify whether operation should continue based on application logic or manual intervention. Thermal load status indicates whether thermal management function remains necessary, with shutdown appropriate if heat loads have been removed or target temperatures achieved. Performance adequacy assesses whether the device successfully meets objectives, potentially triggering shutdown if degradation or failures compromise effectiveness. Fault conditions detected during monitoring may mandate immediate shutdown to prevent damage. Operational limits such as accumulated operating hours, component temperatures approaching ratings, or power budget constraints may necessitate shutdown. In arrays, system-level considerations may influence individual module decisions. If conditions indicate operation should continue, the method loops back to performance monitoring, maintaining active operation indefinitely. If conditions indicate shutdown is appropriate, the method proceeds to termination sequence.

In a step 770, the device is safely transitioned from active operation to powered-down or standby state through a coordinated shutdown sequence. Shutdown proceeds in reverse order from startup to ensure safe transition without component damage or membrane contact risk. Deactivation first ceases electromagnetic field generation by commanding drive systems to stop supplying signals to electrodes, potentially using gradual ramp-down to avoid transients. With fields removed, electrostatic forces on the membrane return to zero, reducing actuator loading. Gap release then increases separation from operational gap to a larger safe gap providing clearance against accidental contact during remaining shutdown or while powered off. Gap control commands actuators in a controlled manner to open the gap to safe spacing, potentially several times larger than operational gap. System depowering sequentially removes power from subsystems in safe order, with control electronics remaining powered briefly to complete data logging and status reporting before actuators are depowered once safe gap is confirmed. Optional position locking may engage mechanical locks maintaining safe gap during powered-down periods. Final diagnostics and status reporting confirm successful shutdown completion before main power removal returns the device to fully depowered state.

The method illustrated in FIG. 7 provides a comprehensive operational framework ensuring that devices transition through necessary operational states in appropriate sequence with proper safeguards. The method prioritizes establishment of stable gap control before field activation, recognizing that precise spacing maintenance is prerequisite for safe and effective electromagnetic field generation. Continuous performance monitoring during operation enables detection of anomalies and adaptive optimization of parameters. The orderly shutdown sequence ensures safe termination of operation when thermal management function is no longer required. This operational method enables reliable deployment across diverse thermal management applications, providing the procedural structure necessary while maintaining safety and performance throughout operational cycles.

Figure 8:
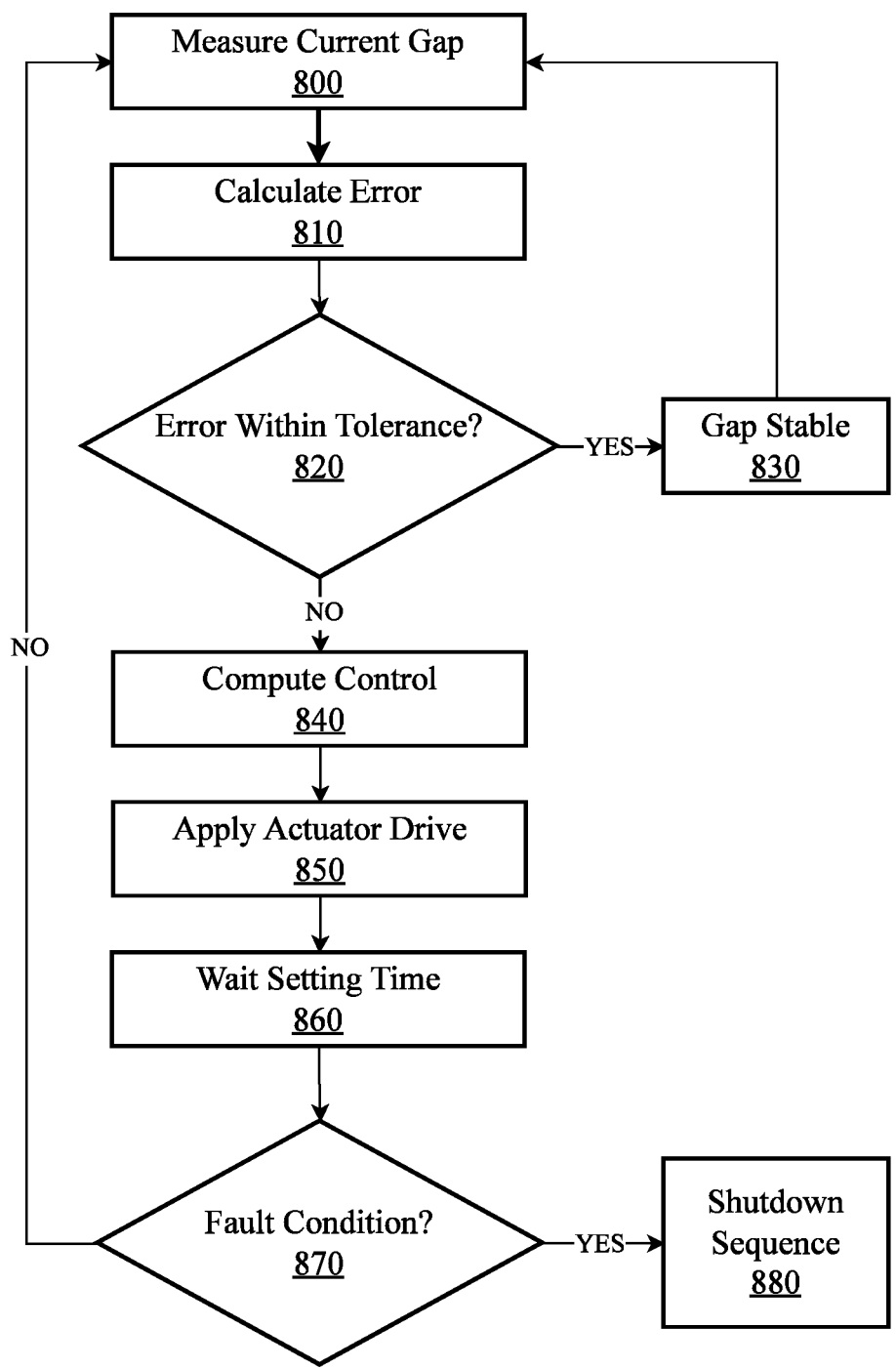
FIG. 8 illustrates a flowchart for an exemplary method of maintaining a fixed gap between a membrane and substrate through continuous closed-loop feedback control.

FIG. 8 illustrates a flowchart for an exemplary method of maintaining a fixed gap between a membrane and substrate through continuous closed-loop feedback control. The method depicts the fundamental control loop that operates continuously during device operation to regulate the nanometer-scale separation despite disturbances from thermal drift, vibrations, attractive forces between surfaces, and electrostatic forces generated when electromagnetic fields are active. This gap maintenance method represents the core feedback control function that executes repeatedly at high rates, typically hundreds of hertz to tens of kilohertz, providing the rapid corrective action necessary to maintain sub-nanometer gap precision required for consistent performance. The method illustrates the essential elements of feedback control including continuous gap measurement, error computation relative to target setpoint, control signal generation through algorithms such as PID control, actuator command application, and fault detection with appropriate response pathways. This control loop operates in parallel with electromagnetic field generation and thermal management functions, continuously working to maintain the geometric conditions necessary for operation regardless of varying operating conditions or external disturbances.

In a first step 800, the current gap is measured to determine the actual separation between membrane and substrate. Gap measurement typically employs capacitive sensing where the capacitance between electrodes on the membrane and substrate varies inversely with separation distance, providing an electrical signal that reflects gap spacing with sub-nanometer sensitivity. The measurement process applies an AC excitation signal to the sense capacitor at a frequency distinct from drive frequencies to avoid interference, then measures the resulting current or charge flow using techniques such as capacitance bridge circuits, resonant frequency measurement where sense capacitance affects an LC oscillator, or capacitance-to-digital conversion. Alternative or complementary sensing modalities may include optical interferometry measuring interference patterns from reflections at the two surfaces, strain gauges detecting actuator deflections correlated with gap changes, or tunneling current sensors exploiting quantum mechanical electron tunneling at very small gaps. Multiple sensors distributed spatially around the membrane perimeter provide measurements at different locations, enabling determination of both average gap spacing and any tilt or non-parallelism between surfaces. Signal processing techniques including synchronous demodulation, filtering, and averaging enhance measurement precision and reject electromagnetic interference. The current gap measurement provides the fundamental input to the feedback control algorithm, representing the actual system state that must be regulated toward the desired target value.

In a step 810, the gap error is calculated by comparing the measured gap value against the target setpoint. Error computation determines the deviation between desired and actual spacing, producing an error signal that quantifies how far the system is from its target state and in which direction correction is needed. For single-measurement systems, the error is simply the difference between target setpoint and measured gap value, with sign convention typically defining positive error as gap larger than target and negative error as gap smaller than target. For multi-sensor systems with measurements at multiple locations, error computation may involve calculating individual errors at each measurement point, computing an average error representing overall gap deviation, and potentially computing tilt or planarity errors representing non-uniform spacing requiring differential actuator commands. The calculated error and its time history are stored for use in subsequent control computations, particularly for derivative and integral terms that require knowledge of how error changes over time and cumulative error over extended periods. Error calculation may include bounds checking to detect excessively large errors indicating sensor failure, loss of position control, or physical contact between surfaces requiring immediate protective action. The error signal forms the fundamental input to the control algorithm that determines appropriate corrective action.

In a step 820, the system evaluates whether the calculated gap error falls within acceptable tolerance limits. Error tolerance assessment determines if the current gap spacing is sufficiently close to the target value that the system can be considered stable and performing adequately, or whether active correction continues to be necessary. The tolerance band represents the maximum acceptable deviation from target, typically specified as an absolute distance such as ±0.5 nanometers or as a percentage of target gap such as ±5%, reflecting the precision required for consistent device performance. If the absolute value of the error is less than the tolerance threshold, the gap is deemed acceptably close to target. If error exceeds tolerance, active correction is required. The tolerance evaluation may consider not only instantaneous error magnitude but also error trends, requiring that error remain within tolerance for a minimum duration before declaring stability to avoid premature declarations during transient disturbances. Multiple error metrics in multi-sensor systems may all be required to meet tolerance criteria simultaneously, ensuring both proper average spacing and acceptable planarity. If error is within tolerance, the method branches to a stable monitoring state where gap is maintained with minimal adjustment. If error exceeds tolerance, the method proceeds to compute corrective control actions.

In a step 830, when error is within tolerance, the gap is maintained in a stable state with continued monitoring. Gap stability represents the desired operating condition where spacing is at or very near the target value, requiring minimal actuator effort to maintain against slow disturbances. During stable operation, the control loop continues executing at its normal rate, continuously measuring gap, calculating error, and applying small corrective actuator commands as needed to compensate for gradual thermal drift or low-frequency disturbances. The control action during stable operation primarily involves integral control accumulating small errors over time and making gradual adjustments to eliminate steady-state offset, with proportional and derivative terms contributing minimal correction since errors are small and not changing rapidly. Actuator commands during stable gap maintenance typically occupy a mid-range position with substantial margin to saturation limits in either direction, providing reserve authority to respond to larger disturbances if they occur. The stable gap condition enables consistent electromagnetic field distribution and reliable performance, fulfilling the fundamental objective of the gap control system. From the stable state, the method loops back to continue gap measurement, perpetually monitoring to detect any developing deviations requiring correction.

In a step 840, when error exceeds tolerance, a control signal is computed to determine the appropriate actuator command for correcting the gap deviation. Control computation implements feedback control algorithms, most commonly PID control, that translate gap error into actuator drive commands designed to reduce the error and restore the gap to its target value. The PID control algorithm computes output as the sum of three terms: a proportional term equal to a proportional gain Kp multiplied by the current error, responding immediately to error magnitude with correction strength proportional to deviation size; an integral term equal to an integral gain Ki multiplied by the accumulated sum of error over time, eliminating steady-state offset by continuously adjusting output until average error becomes zero; and a derivative term equal to a derivative gain Kd multiplied by the rate of error change, providing damping that resists rapid error changes and improves stability by anticipating trends. The three gains are tuned based on system mechanical dynamics to achieve desired response characteristics including fast settling time without excessive overshoot, adequate disturbance rejection across relevant frequency ranges, and robust stability margins tolerating parameter variations and modeling uncertainties. Alternative control strategies beyond basic PID may include model-based control exploiting known system dynamics, adaptive control adjusting parameters based on measured response, or multi-input multi-output control coordinating multiple actuators based on multiple sensor measurements. For multi-actuator systems, control computation generates individual commands for each actuator, potentially using decoupling algorithms that compensate for mechanical coupling between actuators through the shared membrane. The computed control signal represents the commanded actuator state that should drive the gap error toward zero.

In a step 850, the computed control signal is applied to actuators to generate mechanical forces or displacements adjusting membrane position. Actuator drive involves converting the digital or analog control signal from the controller into appropriate electrical signals for driving piezoelectric actuators, electrostatic actuators, or other actuation mechanisms employed in the specific implementation. For piezoelectric actuators, drive signals are typically voltages ranging from zero to hundreds of volts, with displacement proportional to applied voltage through the piezoelectric coefficient. Drive amplifiers provide current capacity to drive the actuator capacitance, particularly important when driving signals change rapidly or operate at high frequencies. For electrostatic actuators, drive voltages create electric fields generating forces through electrostatic attraction, with force proportional to voltage squared. For electromagnetic actuators, drive currents flowing through coils generate magnetic forces. The actuator drive circuitry may include safety limits preventing commands exceeding actuator voltage or displacement ratings, compensation for actuator nonlinearities such as hysteresis or creep in piezoelectric materials, and coordination logic ensuring multiple actuators move in concert to maintain membrane alignment. Application of actuator drive translates the abstract control computation into physical mechanical action that adjusts the gap, closing the feedback loop by causing the measured gap to change in response to the control action based on the gap error.

In a step 860, the system waits for a settling time allowing the membrane to mechanically respond to the applied actuator commands before taking new measurements. Settling time accounts for the finite response speed of the mechanical system, recognizing that membrane position does not instantaneously follow actuator commands but rather changes over some characteristic time determined by mechanical inertia, actuator bandwidth, and structural compliance. Waiting an appropriate settling time before remeasuring the gap ensures that measurements reflect the effect of the most recent control action rather than capturing the system during transient motion that has not yet completed. Settling time duration depends on system mechanical characteristics, with typical values ranging from fractions of a millisecond for small stiff membranes with high-bandwidth actuators to several milliseconds for larger more compliant systems or lower-bandwidth actuation. The settling time may be a fixed delay in simple implementations, or may be dynamically adjusted based on the magnitude of the commanded position change, with larger corrections requiring longer settling. Too short settling time results in measurements during transient motion that may trigger excessive control corrections, while too long settling time reduces the effective control loop bandwidth and slows response to disturbances. The settling wait ensures proper timing in the control loop sequence, allowing physical reality to catch up with commanded actions before proceeding to evaluate the results.

In a step 870, the system checks for fault conditions that might indicate control failure, hardware problems, or unsafe operating states requiring immediate protective action. Fault detection examines various system parameters and behaviors to identify abnormal conditions. Gap error magnitude is checked against fault thresholds significantly larger than normal tolerance bands, with sustained large errors potentially indicating sensor failure providing incorrect readings, actuator failure unable to generate required forces, mechanical obstruction preventing proper gap adjustment, or control algorithm failure with incorrect gain settings. Actuator saturation is monitored, with sustained saturation at maximum or minimum command limits indicating insufficient actuator authority to maintain the gap against disturbances or attractive forces, potentially because target gap is unachievable or disturbance loads exceed design capacity. Oscillations or instability are detected by analyzing frequency content of gap measurements or actuator commands, identifying limit cycles, growing oscillations, or resonant behavior indicating control instability from excessive gain, insufficient damping, or interaction with structural resonances. Sensor anomalies such as implausible measurement values, discontinuous jumps, or loss of signal may indicate sensor degradation or failure. Multiple sequential fault checks failing to achieve stable gap within reasonable time constitute a fault condition. If fault conditions are detected, immediate protective action is required. If no faults are detected, normal operation continues.

In a step 880, when a fault condition is detected, an emergency shutdown sequence is initiated to safely terminate operation and prevent damage. Shutdown in response to faults differs from normal operational shutdown in that it must execute rapidly to protect hardware while possibly lacking full system functionality if the fault involves control system failures. The emergency shutdown sequence typically includes immediately ceasing electromagnetic field generation to eliminate electrostatic forces that might contribute to gap instability or surface contact, commanding actuators to maximum gap opening position if actuator control remains functional, attempting to rapidly increase separation to prevent or terminate any surface contact. If actuator control is compromised or ineffective, passive mechanical stops or compliance may limit contact forces. Power may be removed from potentially problematic systems while maintaining power to monitoring and logging functions that record the fault event for subsequent analysis. Fault status is communicated to operators or system controllers through alarm signals, status messages, or indicator lights, alerting human supervision to the problem requiring intervention. Data logging captures system state immediately before and during the fault, recording gap measurements, actuator commands, error signals, and any other parameters that might assist in diagnosing the root cause. The system enters a safe state where no further automatic operation attempts occur until the fault is investigated, root cause identified, any necessary repairs completed, and manual reset authorization provided.

Following either the stable gap monitoring path 830 or the actuator drive and settling sequence 850, 860, and fault check 870, the method loops back to measure the current gap 800, continuing the perpetual control cycle. This continuous iterative loop executes at the control loop rate, typically 1-10 kilohertz depending on system dynamics and required performance, with each iteration measuring current state, computing corrections if needed, applying those corrections, and checking for proper operation. The closed-loop nature of the control provides automatic compensation for any disturbances or changes in operating conditions, with the feedback continuously working to null out errors regardless of their source. Attractive van der Waals forces between surfaces, electrostatic forces from electromagnetic fields, thermal expansion of components, mechanical vibrations from the environment, and long-term drift effects are all automatically rejected by the feedback control without requiring explicit modeling or feedforward compensation, as long as the disturbances fall within the control system's authority and bandwidth capabilities.

The gap maintenance method illustrated in FIG. 8 provides the fundamental control function enabling precise nanometer-scale gap regulation essential for device operation. By continuously measuring, comparing against target, computing corrections, applying actuator commands, and monitoring for faults, this method maintains the geometric conditions necessary for consistent electromagnetic operation despite the numerous factors that would otherwise cause uncontrolled gap variation. The high execution rate and closed-loop nature provide robust operation across varying conditions, while fault detection and emergency shutdown capabilities protect against damage when control cannot be maintained. This gap control method operates transparently in parallel with electromagnetic field generation and thermal management functions, providing the stable mechanical platform upon which operation can reliably occur throughout extended operational periods.

Figure 9:
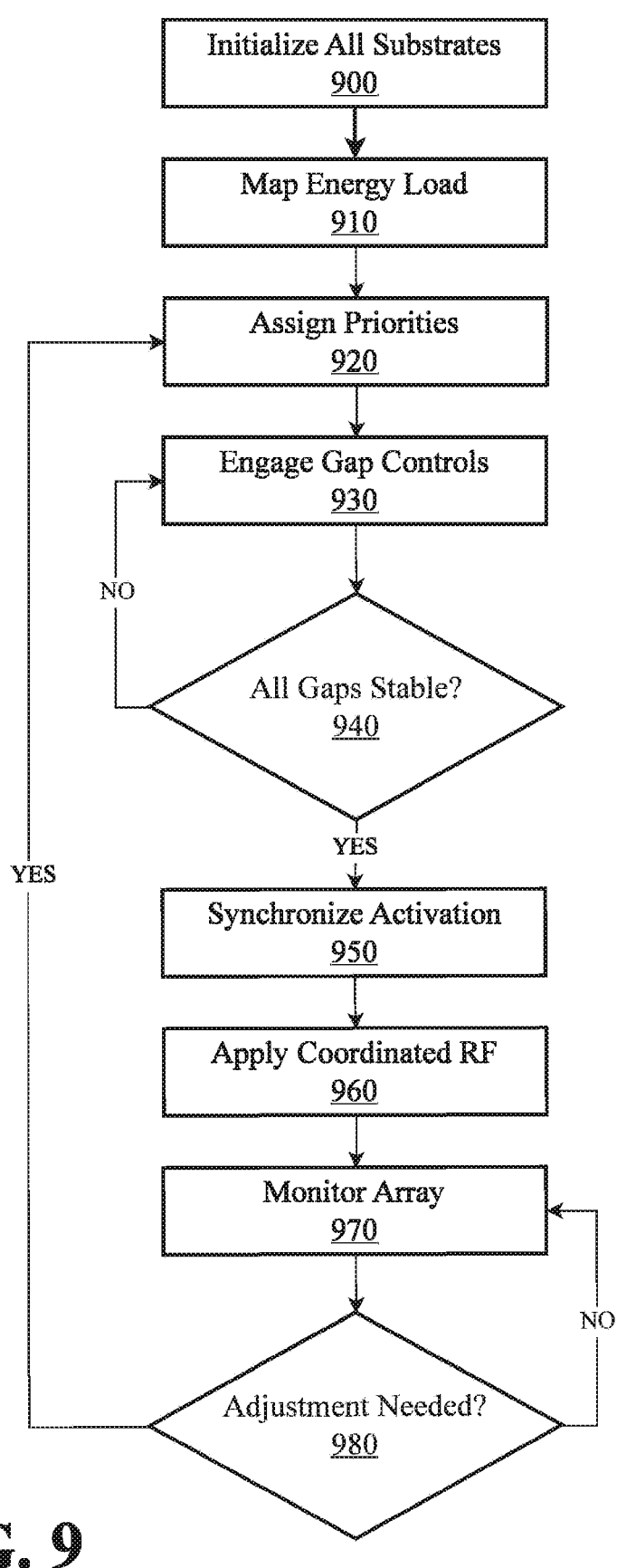
FIG. 9 illustrates a flowchart for an exemplary method of coordinating operation of a multi-substrate array wherein multiple substrates operate collectively beneath one or more membranes to provide distributed capacity across extended areas or complex load patterns.

FIG. 9 illustrates a flowchart for an exemplary method of coordinating operation of a multi-substrate array wherein multiple substrates operate collectively beneath one or more membranes to provide distributed capacity across extended areas or complex load patterns. The method depicts the system-level coordination required to manage arrays containing multiple substrate modules, each with its own substrate posts, activation electrodes, gap control systems, and drive systems, working together as an integrated thermal management system. This array coordination method addresses challenges beyond single-substrate operation including spatial distribution of effort matching non-uniform load patterns, synchronization of electromagnetic field activation across multiple modules to avoid interference or enable coherent array-level effects, load balancing to prevent overloading individual modules while underutilizing others, and coordinated gap control ensuring all gaps achieve stable regulation before field activation commences. The method provides the supervisory control framework that enables multi-substrate arrays to function as cohesive systems rather than collections of independent modules, optimizing overall thermal management effectiveness through intelligent coordination of distributed resources.

In a first step 900, all substrate modules in the array are initialized to prepare the distributed system for coordinated operation. Array initialization extends the single-system initialization concept to multiple modules, ensuring that all substrates and their associated control systems, actuators, sensors, and drive electronics are properly powered, configured, and ready for operation. Power is applied to each substrate module's local controllers, gap control systems, and drive systems, allowing distributed electronics to complete startup sequences and stabilize. Communication links between individual substrate modules and the central array coordinator are established and verified, ensuring reliable bidirectional data flow for commands from coordinator to modules and telemetry from modules to coordinator. Self-test routines execute at each module, verifying actuator response, sensor functionality, and local control system operation independently at each location. Initial positions are acquired for all membranes and substrates, determining starting gap spacings which may be at large safe standby values or approximately at operational spacings depending on system design. Module identification and configuration data are exchanged, with the central coordinator learning which modules are present, their capabilities, and their physical locations within the array. Calibration parameters specific to each module are loaded into local controllers, accounting for manufacturing variations in sensor sensitivities, actuator gains, or geometric dimensions. Array initialization establishes baseline readiness across all modules, ensuring the distributed system is prepared for coordinated operation.

In a step 910, the spatial distribution of thermal load across the array coverage area is mapped to understand demand at different locations. Load mapping determines where thermal energy must be extracted and at what rates, providing the fundamental information needed to allocate resources appropriately across the available substrate modules. Load mapping may employ various approaches depending on available instrumentation and system complexity. Direct temperature measurement using thermal sensors distributed across the membrane surfaces, substrate surfaces, or heat source interfaces provides empirical data on thermal conditions at multiple spatial locations, with higher temperatures or larger temperature gradients indicating regions of higher thermal load. Heat flux sensors measuring energy flow rates directly quantify thermal power density at specific locations. Thermal imaging using infrared cameras or distributed temperature sensor arrays captures two-dimensional thermal maps showing spatial temperature distribution across large areas. Electrical power monitoring of heat-generating components such as processors, power amplifiers, or other electronics provides indirect indication of thermal load based on electrical power dissipation, which must ultimately be removed as heat. Computational thermal models may predict thermal load distribution based on known heat source characteristics, geometric configuration, and material properties, providing load estimates when direct measurement is limited. Historical patterns or learned behaviors from previous operation may inform expected load distributions for recurring thermal scenarios. The mapped load information quantifies where effort should be concentrated and guides subsequent priority assignment across the substrate array.

In a step 920, operational priorities are assigned to individual substrate modules based on the mapped load distribution and available resources. Priority assignment determines how total available capacity and electrical power budget are allocated across substrate modules to optimally address the thermal management requirements. Modules positioned beneath high thermal load regions are assigned higher priorities, receiving greater drive power, more aggressive gap control setpoints, or preferential resource allocation when power or capacity constraints limit simultaneous full operation of all modules. Modules beneath lower thermal load regions receive lower priorities, potentially operating at reduced power levels, larger gap spacings requiring less precise control, or being placed in standby mode if thermal demand is sufficiently low. Priority assignment may implement various optimization objectives including thermal performance maximization where substrate power distribution minimizes peak temperatures across the array, power efficiency optimization where total electrical power consumption is minimized subject to achieving adequate thermal performance, balanced operation where all modules contribute proportionally to avoid overloading any single module, or adaptive strategies that continuously adjust priorities as thermal load patterns change during operation. Priority levels translate into specific operational parameter settings for each module including target gap spacing, drive frequency and amplitude, control loop gains, and power limits. The assigned priorities provide each substrate module's local controller with the information needed to operate appropriately for current system-level objectives.

In a step 930, gap control systems are engaged at all substrate modules to begin regulating gaps toward assigned target values. Engaging gap controls across the array initiates feedback control loops at each module, with local controllers measuring gaps through capacitive sensors or other mechanisms, computing position errors relative to targets, executing control algorithms generating actuator commands, and driving actuators to adjust membrane positions. Gap control engagement occurs either simultaneously across all modules or sequentially in controlled patterns, depending on whether mechanical coupling between modules through shared membranes or support structures requires coordinated motion to avoid fighting between adjacent actuators. For arrays with independent membranes per substrate, gap controls can engage independently and in parallel. For arrays sharing common membranes, engagement may sequence from center outward, edges inward, or other patterns that minimize mechanical interference during the approach phase. Each module's gap control system works to bring its local gap from initial spacing to the assigned target value appropriate for that module's priority level. Higher priority modules may target smaller gaps while lower priority modules target larger gaps adequate for reduced requirements. The distributed gap control engagement represents the critical transition from unpowered or open-loop positioning to active closed-loop regulation across the entire array, establishing the mechanical precision necessary for subsequent electromagnetic field activation.

In a step 940, the system evaluates whether all substrate modules have achieved stable gap control at their respective target values. Array gap stability assessment extends single-module stability criteria to require simultaneous stability across all modules before proceeding to field activation, ensuring coordinated readiness rather than allowing individual modules to independently activate as they achieve stability. Each module's gap control status is evaluated against stability criteria including error magnitude within tolerance, error settling without continued change or oscillation, actuator commands within normal operating range, and proper membrane planarity or alignment. Module-level stability indicators are communicated from local controllers to the central array coordinator through the communication network established during initialization. The coordinator aggregates stability status from all modules, determining whether the collective array has achieved the readiness state required for electromagnetic field activation. In some implementations, the stability requirement may be relaxed to allow field activation when a threshold fraction of modules have stabilized rather than requiring absolute unanimity, enabling operation with degraded but acceptable capacity if individual modules experience difficulties. If all required modules report stable gaps, the array proceeds toward field activation. If any critical modules report unstable gaps, the array continues gap control engagement across all modules, waiting for the slower modules to converge while faster modules maintain their already-achieved stable gaps. Timeout mechanisms may detect prolonged failure of modules to stabilize, triggering fault handling that might attempt alternative control strategies, bypass problematic modules while proceeding with remaining functional modules, or abort the operation if critical modules cannot achieve stability.

In a step 950, when all gaps are confirmed stable, field activation timing is synchronized across substrate modules to coordinate electromagnetic field turn-on. Activation synchronization establishes the temporal relationship between field generation at different substrate modules, implementing coordination strategies that may range from simultaneous turn-on across all modules to carefully sequenced activation patterns. Synchronization approaches include simultaneous activation where all substrate drive systems energize their electrodes at the same instant, creating instantaneous array-level field distribution with coherent phases across modules if phase relationships are controlled; sequential activation where modules turn on in spatial or temporal patterns such as center-to-edge sequences, edge-to-center sequences, or progressive waves across the array, potentially managing inrush power demands or thermal transients by spreading activation over time; phased activation where modules turn on with controlled relative timing or phase offsets, creating traveling wave patterns or interference effects at the array level; and independent activation where modules turn on based on local conditions without tight temporal coordination, appropriate when module fields do not significantly interact. The synchronization commands are distributed from the central coordinator to module local controllers through the communication network, with timing precision depending on the synchronization approach, ranging from millisecond-level coordination adequate for sequential activation to microsecond-level precision necessary for phase-coherent simultaneous activation. Time synchronization protocols may employ techniques such as common clock distribution, network time protocol synchronization, or hardware trigger signals propagating to all modules. Activation synchronization establishes the coordinated timing framework for the subsequent field application.

In a step 960, coordinated electromagnetic fields are applied across all substrate modules according to the synchronized activation plan. Applying coordinated fields involves commanding each module's drive system to energize its activation electrodes with waveforms at specified frequencies, amplitudes, phases, and timing determined by the synchronization plan and priority assignments. Modules assigned higher priorities during the priority assignment step receive drive parameters emphasizing maximum effectiveness such as higher voltages for stronger fields, frequencies optimized for their specific gap dimensions and post geometries, or continuous operation without duty cycle reduction. Lower priority modules receive parameters appropriate for their reduced requirements such as lower voltages, suboptimal but adequate frequencies, or pulsed operation with reduced duty cycles conserving electrical power. The drive systems at each module generate the specified waveforms and apply them to their respective activation electrodes, creating electromagnetic fields in each gap concentrated by the substrate posts according to the mechanisms inherent in the post geometries. At the array level, the collective electromagnetic field distribution reflects the coordinated operation of all modules, with field patterns ranging from substantially uniform if all modules operate identically to highly non-uniform with concentrated activity in high-priority regions if modules operate at diverse power levels matching thermal load variations. During field application, gap control systems continue operating at all modules, compensating for electrostatic forces generated by the fields to maintain stable gaps. The coordinated application establishes the electromagnetic conditions enabling operation across the entire array coverage area.

In a step 970, array performance is continuously monitored to assess effectiveness of the coordinated operation and detect conditions requiring adjustment. Array monitoring extends single-module performance monitoring to system level, collecting and analyzing data from all substrate modules to evaluate collective thermal management effectiveness. Thermal performance data including temperatures at multiple locations across membranes and substrates, computed thermal resistances or conductances for individual modules, and spatial temperature distributions across the array indicate whether thermal objectives are being met and where hotspots or inadequate cooling exist. Electrical performance data including power consumption by individual modules, total array power draw, and electrical anomalies at any module assess power efficiency and identify potential electrical problems. Mechanical performance data including gap spacings, actuator command levels, and gap control stability across all modules verify continued proper mechanical operation. Module-level performance metrics are communicated from local controllers to the central coordinator, which aggregates data to compute array-level metrics such as total thermal power managed, maximum temperature across the array, average or total electrical power consumption, and spatial uniformity of thermal performance. Monitoring data is processed to detect anomalies such as individual modules showing degraded performance, emerging imbalances in load distribution, modules approaching operational limits, or changes in thermal load patterns requiring reallocation of resources. Fault detection identifies failed or failing modules that should be disabled or bypassed. Performance trending analyzes how array behavior evolves over time, identifying gradual changes that might indicate aging, fouling, or changing operating conditions. The continuous array monitoring provides the real-time feedback necessary to assess whether the current operational configuration remains appropriate or whether adjustments are needed to maintain optimal performance.

In a step 980, based on monitored performance data, a determination is made whether operational parameters should be adjusted to improve array effectiveness. The adjustment decision evaluates whether the current allocation of resources across substrate modules, the drive parameters at individual modules, or other operational settings remain optimal for prevailing conditions, or whether changes would better serve thermal management objectives. Adjustment may be needed for various reasons including thermal load redistribution where the spatial pattern of heat generation has changed since initial mapping, requiring reallocation of effort to new high-load locations; performance degradation where one or more modules show reduced effectiveness requiring increased drive power or assistance from neighboring modules; power optimization opportunities where improved efficiency can be achieved by redistributing power allocation based on observed thermal response; load balancing where some modules approach operational limits while others have unused capacity, requiring redistribution to avoid overload; or fault accommodation where module failures require compensatory action by remaining functional modules. If monitoring indicates current operation is satisfactory with thermal performance meeting objectives, power consumption within budget, all modules operating within normal ranges, and no adverse trends developing, the adjustment decision concludes that no changes are needed and operation continues with current parameters. If monitoring indicates problems or opportunities for improvement, the adjustment decision determines that parameter changes are warranted. When adjustments are needed, the method loops back to earlier steps to implement changes, potentially returning to map load if thermal patterns have significantly changed, to assign priorities for resource reallocation, or to modify drive parameters without gap control changes if mechanical configuration remains appropriate. When no adjustments are needed, the method continues monitoring, maintaining stable coordinated operation until conditions change requiring intervention.

The array coordination method illustrated in FIG. 9 provides the supervisory control framework enabling multiple substrate modules to function as an integrated system addressing complex thermal management requirements beyond single-module capabilities. By systematically initializing all modules, mapping thermal load distribution, assigning priorities for resource allocation, coordinating gap control establishment, synchronizing field activation, applying coordinated drive, and continuously monitoring with adaptive adjustment, this method ensures that multi-substrate arrays operate effectively as cohesive systems rather than collections of independent devices. The method accommodates spatial variations in thermal load through priority-based resource allocation, ensures mechanical readiness through coordinated gap stabilization before field activation, provides flexibility in field activation strategies through synchronization options, and maintains optimal operation through continuous monitoring and adaptive parameter adjustment. This coordination approach enables practical deployment of large-scale systems for applications requiring thermal management across extended areas, distributed spatial regions, or complex three-dimensional geometries where single-substrate implementations would be inadequate, providing the system-level intelligence necessary to orchestrate distributed resources toward common thermal management objectives with optimized effectiveness and efficiency.

Figure 10:
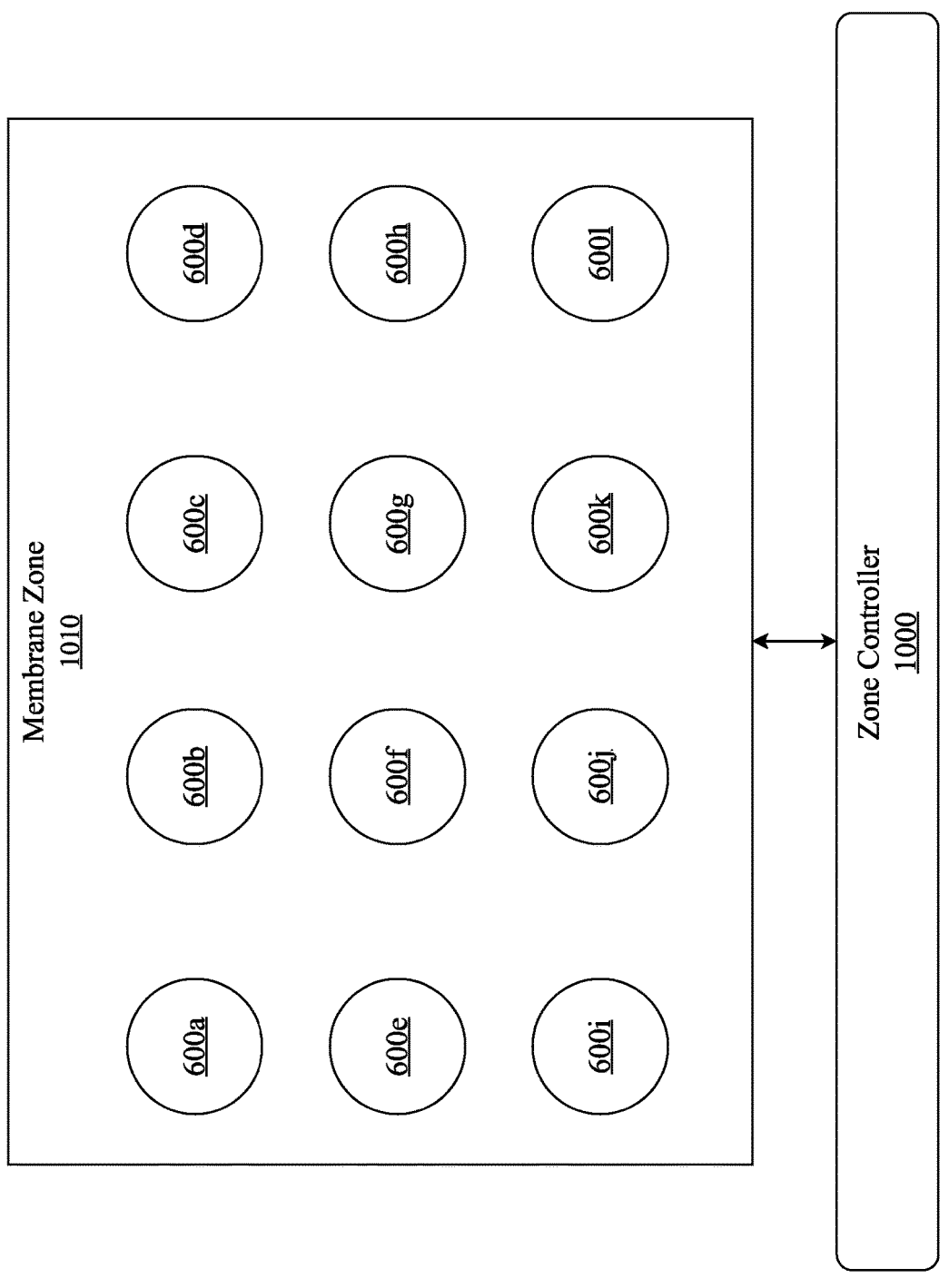
FIG. 10 is a block diagram illustrating a zone organization showing how multiple microcells are grouped under coordinated control.

FIG. 10 is a block diagram illustrating a zone organization showing how multiple microcells are grouped under coordinated control. Zone 1010 comprises microcells 600*a* through 6001, each including a substrate with surface features, an opposing membrane defining a maintained gap, activation electrodes, and gap-control elements. The microcells within zone 1010 are electrically connected and receive coordinated activation signals from zone controller 1000.

Zone controller 1000 manages operation of all microcells within the zone, providing coordinated activation parameters, gap control setpoints, and selective control of individual microcells when needed. Controller 1000 receives commands from a higher-level tile controller and translates these commands into specific activation signals for the microcells within its zone. In some embodiments, zone controller 1000 may independently address individual microcells within the zone for selective activation, fault isolation, or spatially modulated operation.

Membrane zone 1010 represents the region where opposing membranes 100 for all microcells within the zone are mechanically coupled or integrated into a continuous structure. This shared membrane configuration enables coordinated gap control across multiple microcells while reducing mechanical complexity compared to independent membranes for each microcell. The membrane zone may span the entire zone or may comprise discrete membrane segments corresponding to subsets of microcells.

The microcells 600*a*-6001 represent a subset of the total microcells within a typical zone. A zone may comprise thousands of microcells depending on tile size, microcell dimensions, and control granularity. In exemplary embodiments, a zone with lateral dimensions of 2-5 cm might contain 100 to 1,000 microcells with individual microcell dimensions of 100-500 μm. The specific number of microcells per zone depends on fabrication capabilities, electrical routing constraints, and the desired balance between control granularity and system complexity.

The spatial arrangement of microcells within zone 1010 may follow regular patterns such as rectangular arrays, hexagonal close-packed arrays, or irregular arrangements optimized for specific applications. Microcells may be uniformly spaced or may have varying densities across the zone to match spatial variations in operational requirements. In some embodiments, microcells at zone boundaries may overlap with adjacent zones to provide continuous coverage without gaps.

Zone controller 1000 executes control functions at timescales of approximately 10-100 Hz, intermediate between the fast microcell-level gap control (1-10 kHz) and slower tile-level management (1-10 Hz). This intermediate timescale enables zone controller 1000 to coordinate activation across multiple microcells, implement fault detection and isolation within the zone, modulate activation parameters based on local conditions, and aggregate status information from microcells for reporting to the tile level.

Electrical connections between zone controller 1000 and the individual microcells may be implemented through various architectures. In one implementation, a shared bus distributes power and control signals to all microcells, with each microcell receiving the same activation waveform. In another implementation, individual signal lines enable independent control of each microcell, allowing selective activation and spatially modulated operation. In a hybrid implementation, microcells are organized into subgroups within the zone, with each subgroup receiving distinct control signals while microcells within a subgroup operate identically.

The zone architecture provides an organizational layer that bridges individual microcells and complete tiles. By grouping microcells into zones, the system achieves several benefits including reduced wiring complexity by routing signals through zone controllers rather than directly from tile controllers to individual microcells, simplified fault isolation by detecting and isolating faults at the zone level rather than requiring tile-level monitoring of every microcell, scalable control architecture where adding microcells within a zone does not increase tile controller complexity, and modular testing where zones can be fabricated and tested independently before tile assembly.

Zone controller 1000 may be implemented using various electronic platforms depending on control complexity and performance requirements. Simple implementations may use microcontrollers executing control algorithms for activation signal generation and status monitoring. More sophisticated implementations may employ field-programmable gate arrays (FPGAs) for high-speed signal processing and parallel control of multiple microcells. The controller may be positioned adjacent to the zone, integrated onto the same substrate as the microcells, or located remotely with electrical connections through flex circuits or cable assemblies.

Figure 11:
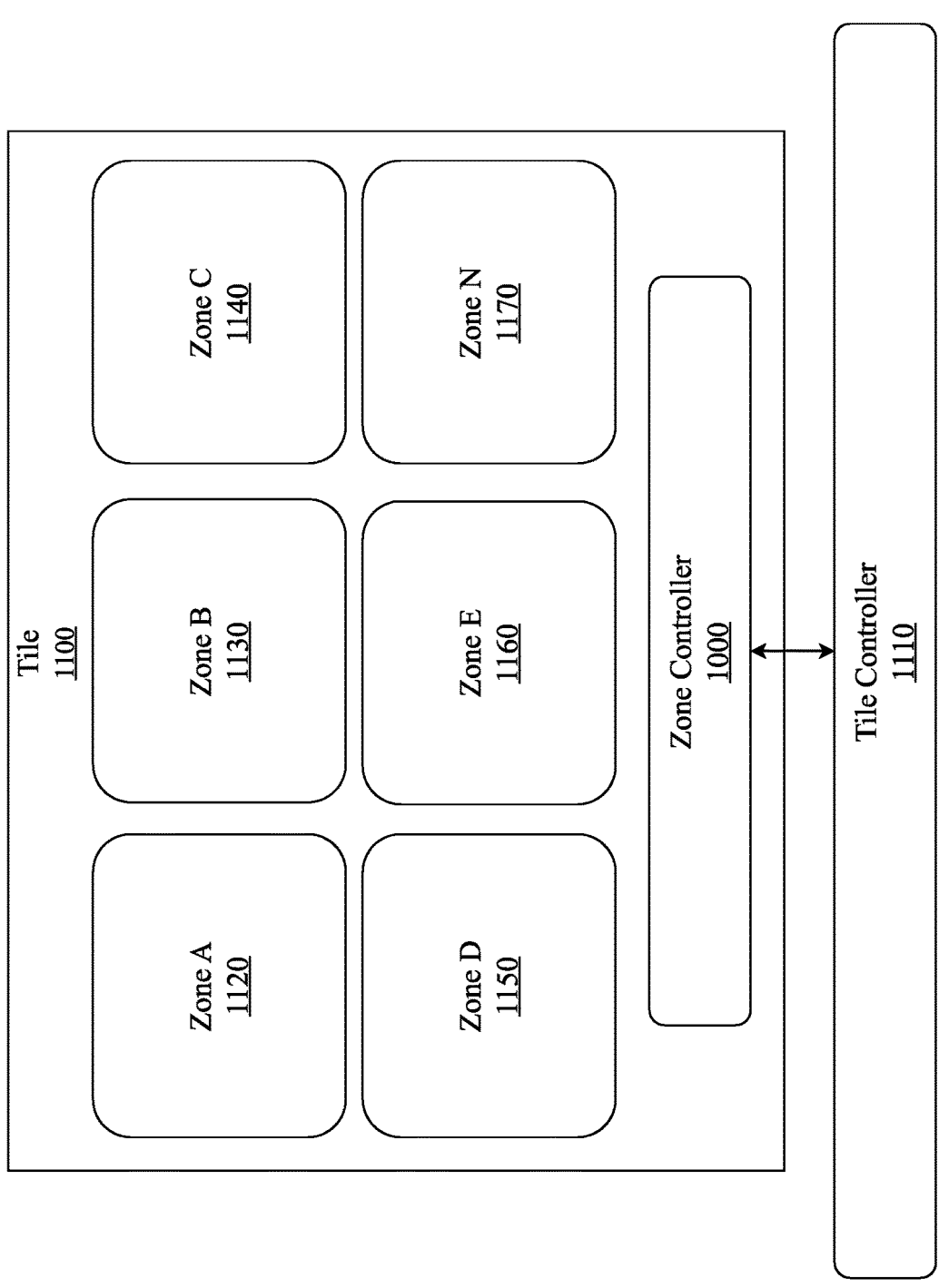
FIG. 11 is a block diagram illustrating a tile structure showing how multiple zones are assembled into a modular unit under coordinated control.

Multiple zones such as zone 1010 are assembled into tiles as described in FIG. 11, with each tile containing multiple zones under coordinated control by a tile controller. The hierarchical organization from microcells to zones to tiles to panels enables scalable deployment of the system for applications ranging from small single-tile implementations to large multi-panel building installations.

FIG. 11 is a block diagram illustrating a tile structure showing how multiple zones are assembled into a modular unit under coordinated control. Tile 1100 comprises zones 1120, 1130, 1140, 1150, 1160, through 1170 (Zone N), each containing multiple microcells as described in FIG. 10. Tile controller 1110 manages operation of all zones within the tile, coordinating their activities and providing the interface to higher-level panel controllers.

Tile controller 1110 receives operational commands from a panel supervisor and translates these into zone-specific parameters distributed to the individual zone controllers 1000 within each zone. The tile controller manages multiple functions including power budget allocation across zones, synchronization of activation timing between zones, data aggregation from zone controllers for reporting to the panel level, and fault management within the tile. Tile controller 1110 operates at timescales of approximately 1-10 Hz, slower than the zone-level control (10-100 Hz) but faster than panel-level regulation (0.1-1 Hz).

The zones within tile 1100 are labeled Zone A 1120 through Zone N 1170, where "N" represents that the tile may contain a variable number of zones depending on tile size and design requirements. In exemplary embodiments, a tile may contain from 2 to 100 zones, with typical implementations having 4 to 20 zones. A tile with lateral dimensions of 5-20 cm might contain 6-12 zones, each zone having dimensions of 2-5 cm. The specific number of zones per tile depends on manufacturing constraints, electrical routing capabilities, thermal management requirements, and the desired control granularity.

Each zone within the tile (Zones A-N) includes its own zone controller 1000 as illustrated in FIG. 10. These zone controllers operate semi-independently, managing the microcells within their respective zones while receiving coordination and setpoint commands from tile controller 1110. The zone controllers report status information, performance metrics, and fault conditions upward to the tile controller, which aggregates this information for tile-level decision making and reporting to the panel supervisor.

Tile 1100 serves as a manufacturable modular unit that can be fabricated, tested, and qualified independently before assembly into panels. The tile includes not only the zones and their microcells but also supporting infrastructure including local control electronics integrated into or adjacent to the tile, power distribution networks that route electrical power from tile-level interfaces to individual zones, data communication pathways enabling bidirectional communication between the tile controller and zone controllers, and mechanical mounting features around the tile perimeter for assembly into panel structures.

The tile architecture provides several advantages in system design and manufacturing. Tiles enable modular fabrication where individual tiles are manufactured and tested separately, improving yield and simplifying quality control. Failed tiles can be replaced without discarding entire panels, facilitating maintenance and repair. The tile size represents a balance between integration benefits (fewer interfaces, simpler assembly) and practical constraints (fabrication yield, thermal management, mechanical handling). Tiles provide natural boundaries for power distribution and data routing, simplifying electrical architecture.

Power distribution within tile 1100 may be implemented through various architectures. In one implementation, tile controller 1110 includes integrated power conditioning circuitry that receives power from panel-level distribution and provides regulated voltages to zone controllers and microcell arrays. In another implementation, power is distributed directly to zones with each zone controller performing local regulation. Power delivery must support both the low-power control electronics and the potentially higher-power activation systems, with typical tile power consumption ranging from milliwatts for control to watts or tens of watts for activation depending on operational mode and microcell count.

Data communication between tile controller 1110 and the zone controllers 1000 may employ various protocols and physical interfaces. Serial communication protocols such as SPI, I2C, or UART provide simple interfaces suitable for moderate data rates. Parallel buses enable higher bandwidth for tiles with many zones or high control update rates. In some embodiments, the tile controller and zone controllers share a common communication bus with addressing schemes to route commands and data to appropriate controllers. The communication architecture must support both downward command flow from tile controller to zone controllers and upward telemetry flow from zone controllers to tile controller.

Tile controller 1110 implements coordination functions that exploit the multi-zone architecture. Load balancing distributes activation power across zones to prevent overloading individual zones while underutilizing others, optimizing overall tile performance. Synchronized operation coordinates timing between zones to enable coherent activation patterns or to sequence activation for power management. Fault management detects zone-level failures and isolates failed zones while maintaining operation of healthy zones. Performance optimization adjusts zone-level parameters based on aggregated performance metrics to maximize tile-level effectiveness.

The tile may include additional components beyond the zones and controllers. Mounting features 1180 (shown conceptually) around the tile perimeter enable mechanical attachment to panel support structures and alignment with adjacent tiles. These mounting features may include threaded inserts, alignment pins, snap-fit features, or bonding surfaces depending on panel assembly methods. Power and data interfaces at tile edges provide standardized connections to panel-level infrastructure, enabling tiles to be connected in arrays without custom wiring for each tile.

Figure 12:
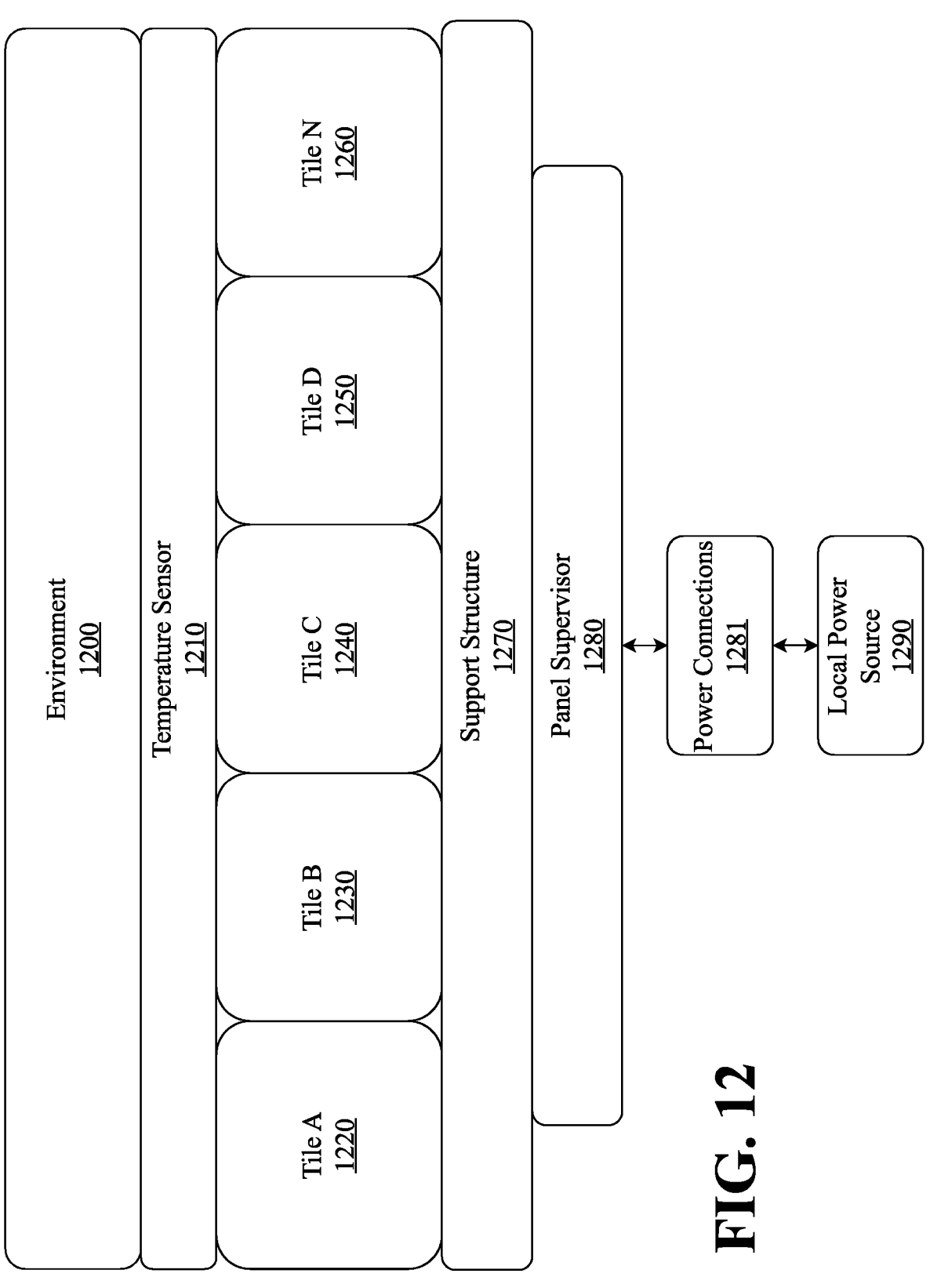
FIG. 12 is a block diagram illustrating a panel assembly showing how multiple tiles are integrated into a complete system for architectural deployment.

Tiles such as tile 1100 are assembled into panels as described in FIG. 12, with multiple tiles arranged in one-dimensional or two-dimensional arrays to form large-area regulation surfaces. The standardized tile interface enables flexible panel configurations where different numbers and arrangements of tiles can be deployed depending on application requirements, with all tiles using common mounting, power, and communication interfaces.

Tile controller 1110 may be implemented using various computing platforms depending on control complexity. Microcontroller implementations provide sufficient performance for basic coordination and data aggregation with moderate cost and power consumption. Digital signal processor (DSP) or FPGA implementations enable more sophisticated control algorithms, real-time optimization, or advanced synchronization between zones. The controller may be implemented as a discrete module attached to the tile, integrated onto a printed circuit board that forms part of the tile structure, or embedded within the substrate structure containing the microcells and zones.

The tile architecture bridges the zone level and panel level in the hierarchical control structure, providing an intermediate organizational layer that enables scalable system deployment. By organizing zones into tiles, the system achieves practical manufacturing units, simplified panel assembly, modular replacement and maintenance, and manageable electrical and control interfaces between organizational levels.

FIG. 12 is a block diagram illustrating a panel assembly showing how multiple tiles are integrated into a complete system for architectural deployment. The panel comprises tiles 1220 (Tile A), 1230 (Tile B), 1240 (Tile C), 1250 (Tile D), through 1260 (Tile N) mounted to support structure 1270. Panel supervisor 1280 coordinates operation of all tiles within the panel. The panel interfaces with environment 1200 through its exposed surface, with temperature sensor 1210 providing environmental feedback. Local power source 1290 supplies electrical power through power connections 1281 to the panel supervisor and tiles.

Support structure 1270 provides mechanical mounting for the tiles and structural integration into building surfaces such as walls, ceilings, or floors. The support structure may be fabricated from various materials including metals such as aluminum or steel for structural rigidity and thermal conductivity, polymers or composites for lightweight implementations or electrical isolation, or wood or engineered wood products for integration with standard building construction. Support structure 1270 includes mounting features that align with the mounting features on individual tiles, enabling secure attachment while maintaining thermal and electrical connections between tiles and panel-level systems.

The tiles within the panel are labeled Tile A 1220 through Tile N 1260, where "N" indicates that panels may contain different numbers of tiles depending on panel size and application requirements. In exemplary embodiments, a panel may contain from 2 to 100 tiles, with typical implementations having 4 to 20 tiles. A panel with dimensions of approximately 1-2 meters on a side might contain 9-16 tiles arranged in a 3×3 or 4×4 array. Smaller panels for localized applications might contain only 2-4 tiles, while larger panels for room-scale deployment might contain 20-50 tiles. The modular tile architecture enables flexible panel sizing without redesigning individual tiles.

Each tile within the panel operates under control of its respective tile controller as described in FIG. 11, with these tile controllers receiving coordination commands from panel supervisor 1280. The panel supervisor operates at the slowest timescale in the control hierarchy, approximately 0.1-1 Hz, enabling regulation of environmental conditions based on setpoints and measured feedback while coordinating the faster tile-level (1-10 Hz), zone-level (10-100 Hz), and microcell-level (1-10 kHz) control functions.

Panel supervisor 1280 implements system-level control strategies including environmental regulation where the supervisor adjusts overall panel operation to maintain environmental conditions at desired setpoints based on feedback from temperature sensor 1210 and other sensors, power management where total panel power consumption is controlled to remain within available power budgets while optimizing performance, tile coordination where activation is balanced across tiles to prevent overloading individual tiles and ensure spatially uniform operation, and fault management where tile-level failures are detected and system operation adjusted to maintain functionality despite degraded capacity.

Environment 1200 represents the space whose conditions are being regulated by the panel, such as a room, enclosure, or other volume. The panel surface facing the environment serves as the interface through which the panel affects environmental conditions. In typical architectural installations, the panel is integrated into a wall, ceiling, or floor with one surface exposed to the interior space. The panel may be installed as a retrofit into existing structures or integrated during new construction.

Temperature sensor 1210 measures environmental conditions and provides feedback to panel supervisor 1280 for closed-loop control. The sensor may be positioned on the panel surface, embedded within the environment at a distance from the panel, or distributed as multiple sensors at different locations to characterize spatial temperature distributions. In addition to temperature, other sensors may measure humidity, air flow, occupancy, or other parameters relevant to environmental regulation. Sensor data is communicated to panel supervisor 1280 through wired or wireless interfaces.

Local power source 1290 provides electrical power to the panel through power connections 1281. The power source may be building electrical systems providing AC power that is converted to DC voltages required by the panel, dedicated DC power supplies, battery systems for portable or backup operation, or energy harvesting systems for autonomous operation. Power connections 1281 route power from the source to panel supervisor 1280, which distributes power to individual tiles either directly or through intermediate power distribution networks within the panel.

Power distribution within the panel must support both control electronics and activation systems across all tiles. Control electronics typically require low-voltage DC power (3.3V, 5V, 12V) with relatively modest current requirements, while activation systems may require higher voltages and substantial power delivery depending on the number of active microcells and their operating parameters. Panel supervisor 1280 or dedicated power distribution modules regulate and condition power from local power source 1290 to provide stable voltages despite load variations as tiles activate and deactivate.

Support structure 1270 may incorporate additional functionality beyond mechanical mounting. Thermal management features such as heat spreading layers or cooling channels may be integrated into the support structure to manage heat generated by panel operation. Electrical routing for power distribution and data communication between tiles and the panel supervisor may be embedded within the support structure. Acoustic damping materials may be included to reduce noise transmission through the panel. The support structure may also provide environmental sealing to prevent moisture or contaminant ingress.

Panel supervisor 1280 may be implemented using various computing platforms. Microcontroller implementations provide sufficient performance for basic environmental regulation with low cost and power consumption. More sophisticated implementations may employ embedded computers running real-time operating systems, enabling advanced control algorithms, data logging, network communication with building management systems, and user interfaces for configuration and monitoring. The panel supervisor may be housed in a separate enclosure attached to the panel, integrated into the support structure, or distributed across multiple controller modules for redundancy.

Communication between panel supervisor 1280 and tile controllers may employ various protocols and network topologies. Serial protocols provide simple point-to-point connections suitable for panels with few tiles. Shared bus architectures enable multiple tiles to communicate over common wiring with addressing to route messages. Network protocols such as CAN bus, Ethernet, or wireless communication enable more complex panel configurations and integration with building-wide systems. The communication must support downward command flow from panel supervisor to tiles and upward telemetry flow from tiles to panel supervisor.

The panel architecture enables architectural integration where panels are installed in building surfaces to provide distributed environmental regulation. Panels may be mounted on interior walls adjacent to occupied spaces, integrated into ceilings for overhead deployment, installed in floors for underfloor systems, or deployed in enclosures or furniture for localized control. Multiple panels may be coordinated within a building as described in FIG. 15, with a building supervisor controller managing multiple panel supervisors.

Panel dimensions may vary widely depending on application. Small panels of 0.1-0.5 m$^2$ might be used for localized control in equipment enclosures or workstation environments. Medium panels of 0.5-2 m$^2$ are suitable for room-scale deployment where one or a few panels regulate a small room or office. Large panels of 2-10 m$^2$ or more enable whole-room coverage with a single panel in large spaces such as conference rooms or open offices. The modular tile architecture allows the same tile designs to be deployed in panels of different sizes.

Installation of panels into building structures requires appropriate mounting hardware, electrical connections, and environmental sealing. Mounting hardware secures the support structure to building framing members such as wall studs or ceiling joists. Electrical connections route power and control wiring from building systems to panel connections. Environmental sealing around panel edges prevents air leakage and maintains proper panel operation. The panel may be installed as a complete assembly or built up by installing the support structure first and then mounting tiles individually.

The panel represents the primary deployable unit for architectural applications, providing a complete system that interfaces with building infrastructure and environmental spaces. By organizing tiles into panels, the system achieves sizes appropriate for room-scale deployment, integrated support structures for mechanical mounting, centralized control through the panel supervisor, and standardized interfaces to building systems for power and data.

Figure 13:
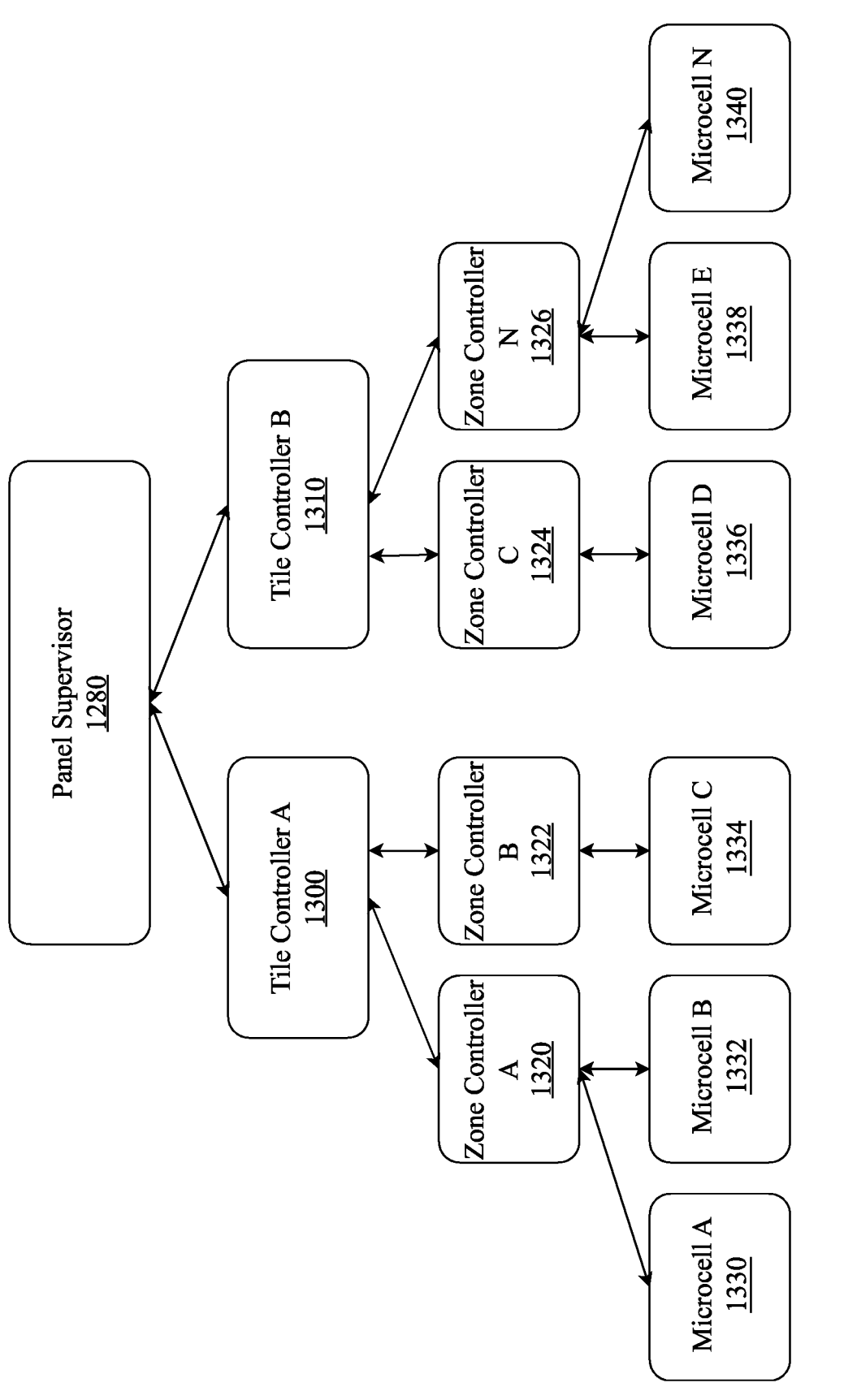
FIG. 13 is a block diagram illustrating the hierarchical control architecture showing the four organizational levels and their relationships within the system.

FIG. 13 is a block diagram illustrating the hierarchical control architecture showing the four organizational levels and their relationships within the system. Panel supervisor 1280 resides at the top level, coordinating tile controllers 1300 (Tile Controller A) and 1310 (Tile Controller B). Each tile controller manages multiple zone controllers including zone controllers 1320 (Zone Controller A), 1322 (Zone Controller B), 1324 (Zone Controller C), through 1326 (Zone Controller N). Each zone controller coordinates multiple microcells including microcells 1330 (Microcell A), 1332 (Microcell B), 1334 (Microcell C), 1336 (Microcell D), 1338 (Microcell E), through 1340 (Microcell N). The hierarchical structure partitions control responsibilities across levels with distinct timescales and functional roles.

The four hierarchical levels shown in FIG. 13 are: Level 1 (microcell level) comprising individual microcells with their gap-control subsystems and activation elements operating at 1-10 kHz timescales for fast mechanical control; Level 2 (zone level) comprising zone controllers that coordinate groups of microcells operating at 10-100 Hz timescales for activation coordination and fault detection; Level 3 (tile level) comprising tile controllers that manage multiple zones operating at 1-10 Hz timescales for power management and data aggregation; and Level 4 (panel level) comprising the panel supervisor that regulates environmental conditions operating at 0.1-1 Hz timescales for setpoint regulation and system coordination.

Panel supervisor 1280 at Level 4 implements the highest-level control functions. The panel supervisor receives environmental setpoints defining target conditions for the space being regulated, sensor data from temperature sensors and other environmental monitors, and power budget constraints specifying available electrical power. Based on these inputs, the panel supervisor computes system-wide operational strategies and distributes commands to tile controllers. The panel supervisor operates at the slowest timescale (0.1-1 Hz) because environmental conditions change gradually compared to mechanical or electrical dynamics at lower levels.

Tile controllers 1300 and 1310 at Level 3 receive commands from panel supervisor 1280 and translate these into tile-specific operational parameters. Each tile controller manages the zones within its tile, allocating power budgets across zones, synchronizing activation timing, aggregating performance data from zone controllers, and detecting tile-level faults. Tile controllers operate at 1-10 Hz timescales, fast enough to respond to changing conditions within the tile but slower than the zone-level control that coordinates individual microcells. While FIG. 13 shows two tile controllers for clarity, a panel may contain many tile controllers as indicated in FIG. 12.

Zone controllers at Level 2, including zone controllers 1320, 1322, 1324, and 1326, receive commands from their respective tile controllers and manage the microcells within their zones. Each zone controller distributes activation signals to microcells, sets gap control setpoints, monitors microcell status, and detects zone-level faults. Zone controllers operate at 10-100 Hz timescales, enabling coordination of microcell activation while allowing the fast microcell-level gap control loops to operate independently. The "N" designation on zone controller 1326 indicates that tiles typically contain multiple zone controllers beyond those explicitly shown.

Microcells at Level 1, including microcells 1330, 1332, 1334, 1336, 1338, and 1340, represent the lowest level of the hierarchy. Each microcell comprises a substrate with surface features, an opposing membrane defining a maintained gap, activation electrodes, and gap-control elements as described in FIG. 1. Microcell-level controllers execute fast feedback control loops (1-10 kHz) that maintain gap stability through continuous measurement, error computation, and actuator command generation. These fast control loops operate largely autonomously, receiving setpoints from zone controllers but not requiring continuous communication during normal operation. The "N" designation on microcell 1340 indicates that zones typically contain many microcells beyond those explicitly shown.

The bidirectional data flow through the hierarchy is indicated by the connections between levels. Downward flow (from panel supervisor toward microcells) carries commands, setpoints, and operational parameters. Panel supervisor 1280 sends commands to tile controllers 1300 and 1310, which translate these into zone-specific commands for zone controllers 1320-1326, which in turn set parameters for microcells 1330-1340. This cascading command structure allows high-level objectives to be translated into specific low-level actions while preserving the separation of timescales.

Upward flow (from microcells toward panel supervisor) carries measurements, status information, and performance data. Microcells 1330-1340 report gap spacing, activation status, and fault conditions to their zone controllers 1320-1326. Zone controllers aggregate this information and report zone-level status to tile controllers 1300 and 1310. Tile controllers further aggregate data and report tile-level performance to panel supervisor 1280. This hierarchical aggregation reduces communication bandwidth requirements and enables each level to make decisions based on appropriately summarized information.

The separation of timescales across levels is fundamental to stable hierarchical control. Fast dynamics at lower levels (gap control at 1-10 kHz) settle quickly relative to the update rates of higher levels, allowing higher levels to treat lower levels as quasi-static when making decisions. Conversely, slow dynamics at higher levels (environmental regulation at 0.1-1 Hz) change gradually relative to lower-level response times, allowing lower levels to track upper-level commands without instability. This timescale separation is a key principle enabling the hierarchical architecture to function effectively.

The functional responsibilities at each level are distinct and complementary. Microcell-level controllers focus on fast mechanical control maintaining gap stability. Zone-level controllers coordinate activation across multiple microcells and implement fault detection within zones. Tile-level controllers manage resources (power, communication bandwidth) across zones and aggregate performance data. Panel-level supervisors regulate environmental conditions based on setpoints and sensor feedback. This partitioning of responsibilities prevents any single controller from being overwhelmed by the complexity of controlling thousands or millions of microcells directly.

The hierarchical architecture provides several system-level benefits. Scalability is achieved because adding microcells, zones, or tiles does not fundamentally change the control structure-new elements are integrated at the appropriate hierarchical level. Modularity enables each level to be designed, tested, and optimized independently. Fault tolerance is enhanced because faults can be isolated at the lowest level where they occur without propagating upward. Maintainability is improved because faulty elements at any level can be identified and replaced without disrupting other parts of the hierarchy.

The communication requirements between levels vary depending on the data being exchanged. Downward command flow requires relatively low bandwidth because commands change infrequently (at the timescale of the sending level) and typically consist of simple setpoint values or mode commands. Upward telemetry flow requires higher bandwidth because status information from many lower-level elements must be communicated to fewer higher-level controllers, though aggregation at each level reduces the total bandwidth. Fault signals require high priority but low average bandwidth, as faults are (ideally) infrequent events requiring immediate attention.

The implementation of controllers at each level may use different technologies appropriate to their requirements. Microcell-level control often uses analog circuits or simple digital controllers for fast, low-latency gap control. Zone-level controllers typically use microcontrollers providing sufficient computational capability for coordination algorithms. Tile-level controllers may use more powerful microcontrollers or digital signal processors to handle multiple zones. Panel-level supervisors may use embedded computers or PLCs providing networking capabilities and sophisticated control algorithms.

The hierarchical control architecture illustrated in FIG. 13 enables the system to scale from small single-tile implementations with hundreds of microcells to large multi-panel building installations with millions of microcells, while maintaining manageable control complexity at each level through appropriate partitioning of responsibilities and separation of timescales. This architecture forms the foundation for all operational methods described herein, including system initialization, fault isolation, and multi-panel coordination.

Figure 14:
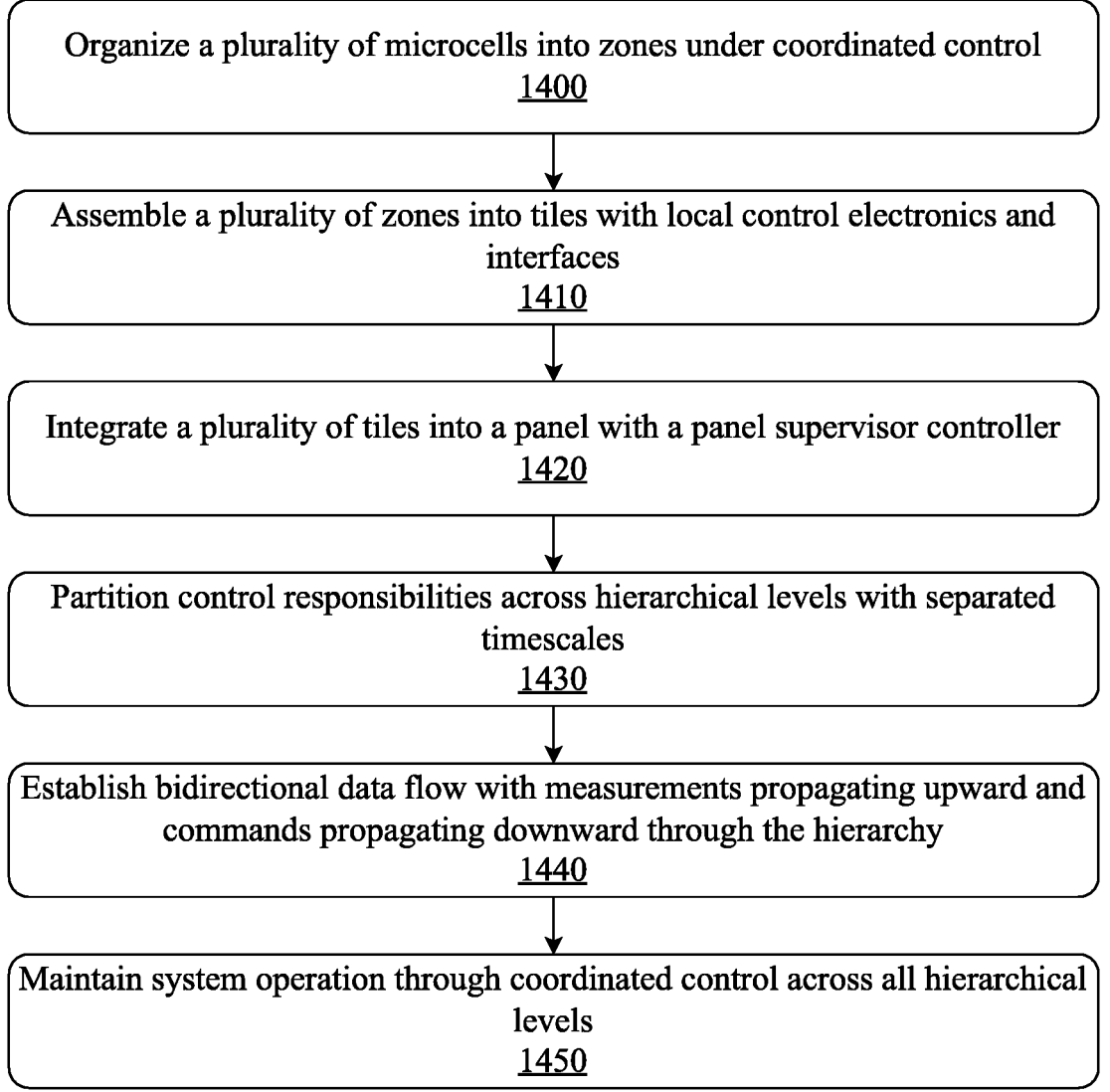
FIG. 14 is a flow diagram illustrating an exemplary method for establishing and operating a hierarchical control architecture for energy regulation systems.

FIG. 14 is a flow diagram illustrating an exemplary method for establishing and operating a hierarchical control architecture for energy regulation systems. In a first step 1400, a plurality of microcells are organized into zones under coordinated control. Each microcell comprises a substrate with surface features, an opposing membrane defining a maintained gap, activation electrodes, and gap-control elements. Organizing microcells into zones creates logical groupings that enable coordinated operation of multiple microcells rather than requiring independent control of each individual unit. The number of microcells per zone depends on the desired control granularity, with typical zones containing tens to thousands of microcells. Microcells within a zone may be electrically connected through shared buses or routed through a zone-level controller that distributes activation signals and collects status information. The zone organization reduces wiring complexity and enables fault isolation at the zone level.

In a step 1410, a plurality of zones are assembled into tiles with local control electronics and interfaces. Tiles serve as manufacturable modular units that can be fabricated, tested, and qualified independently before integration into larger assemblies. Each tile includes multiple zones along with tile-level control electronics that coordinate the zones, power interfaces that connect to external power sources, and data interfaces that enable communication with higher-level controllers. The tile represents a practical size for handling during manufacturing and assembly, balancing integration benefits against fabrication yield and mechanical constraints. Tiles provide standardized interfaces that enable flexible system configurations without custom wiring for each deployment.

In a step 1420, a plurality of tiles are integrated into a panel with a panel supervisor controller. The panel represents a complete deployable system suitable for architectural integration into building surfaces or equipment enclosures. Integration involves mechanically mounting tiles to a support structure, establishing electrical connections for power distribution to all tiles, creating data communication pathways between tiles and the panel supervisor, and configuring the panel supervisor with operational parameters. The panel supervisor serves as the highest-level controller within a single panel, coordinating all tiles to achieve system-level objectives such as environmental regulation or power management.

In a step 1430, control responsibilities are partitioned across hierarchical levels with separated timescales. The hierarchical control structure comprises multiple organizational levels, each operating at distinct timescales appropriate to their functional responsibilities. Lower levels operate at faster timescales to handle fast dynamics such as mechanical control, while higher levels operate at slower timescales appropriate for environmental regulation or resource management. The separation of timescales enables stable control by ensuring that fast dynamics settle before slower control actions occur, preventing instabilities that could arise from conflicting control actions at different rates. Partitioning responsibilities prevents individual controllers from being overwhelmed by controlling numerous elements directly and enables each level to focus on appropriate functions.

In a step 1440, bidirectional data flow is established with measurements propagating upward and commands propagating downward through the hierarchy. Downward flow carries commands, setpoints, and operational parameters from higher levels to lower levels, enabling high-level objectives to be translated into specific low-level actions. Upward flow carries measurements, status information, and performance data from lower levels to higher levels, providing feedback for control decisions and fault detection. Data aggregation at each level reduces communication bandwidth by summarizing information from multiple lower-level elements before transmission to the next higher level. The bidirectional data flow enables closed-loop control across the hierarchy while managing communication requirements through appropriate aggregation and filtering.

In a step 1450, system operation is maintained through coordinated control across all hierarchical levels. Maintaining operation involves continuous execution of control functions at each level according to their designated timescales, with lower levels responding to commands from higher levels while providing feedback on their operational status. Coordination ensures that control actions at different levels work toward common objectives rather than conflicting with each other. Stable operation results from the combination of fast low-level control providing rapid response to disturbances, intermediate-level coordination managing groups of lower-level elements, and slow high-level regulation maintaining environmental or performance targets. The hierarchical coordination enables complex systems with many elements to operate effectively without requiring centralized control of every individual element.

The method illustrated in FIG. 14 establishes a scalable control architecture that can accommodate systems ranging from small implementations with few microcells to large deployments with millions of microcells, while maintaining manageable control complexity at each hierarchical level through appropriate partitioning of responsibilities and separation of timescales.

Figure 15:
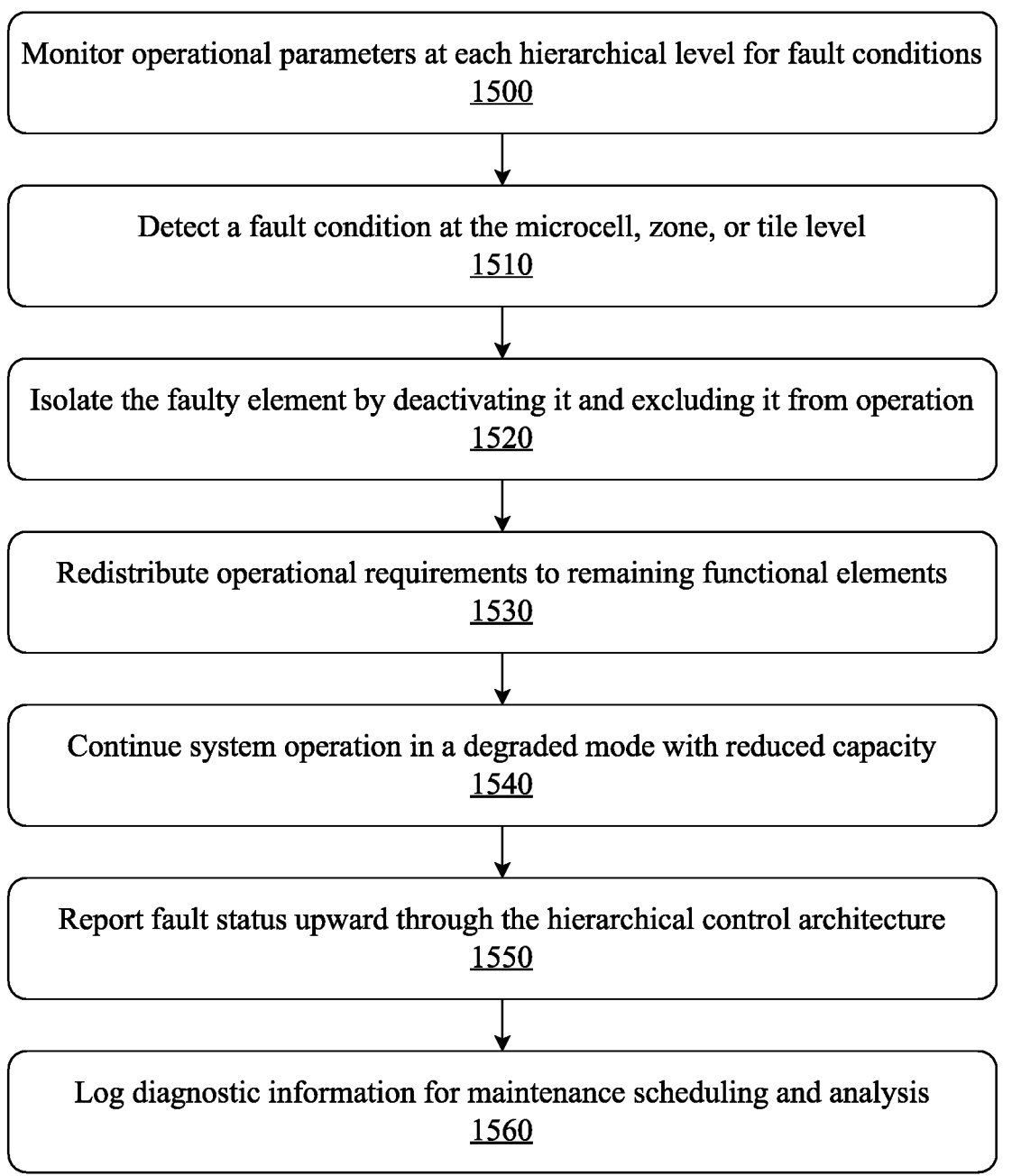
FIG. 15 is a flow diagram illustrating an exemplary method for implementing fault isolation with graceful degradation in hierarchical energy regulation systems.

FIG. 15 is a flow diagram illustrating an exemplary method for implementing fault isolation with graceful degradation in hierarchical energy regulation systems. In a first step 1500, operational parameters are monitored at each hierarchical level for fault conditions. Monitoring involves continuous or periodic measurement of parameters that indicate proper operation, including gap spacing at the microcell level to detect loss of gap control, activation signal integrity at the zone level to identify electrical faults, power consumption at the tile level to detect anomalies in energy usage, and environmental response at the panel level to assess overall system effectiveness. Each hierarchical level monitors parameters appropriate to its scope and timescale, with fast parameters monitored frequently and slow parameters monitored less often. Monitoring thresholds are established to distinguish normal operational variations from fault conditions requiring intervention.

In a step 1510, a fault condition is detected at the microcell, zone, or tile level. Detection occurs when monitored parameters exceed predetermined thresholds or exhibit anomalous behavior indicating malfunction. Faults may include gap control failure where a microcell cannot maintain its target gap spacing, activation failure where electrodes do not generate expected fields, communication failure where data cannot be exchanged between controllers, or performance degradation where operational effectiveness falls below acceptable levels. Detection occurs at the lowest hierarchical level capable of identifying the fault, enabling localized response without requiring higher-level intervention for routine faults. Detection algorithms may employ threshold checking, trend analysis, or pattern recognition to distinguish genuine faults from transient disturbances.

In a step 1520, the faulty element is isolated by deactivating it and excluding it from operation. Isolation prevents the faulty element from affecting neighboring elements or propagating faults upward through the hierarchy. Deactivation involves stopping activation signals to the faulty element and commanding its gap-control subsystem to a safe state, typically opening the gap to prevent contact. Exclusion marks the element as unavailable in control logic so that higher-level controllers do not attempt to command it or rely on data from it. Isolation may occur at the microcell level where individual microcells are deactivated, at the zone level where entire zones are taken offline, or at the tile level where complete tiles are excluded from operation. The isolation process minimizes disturbance to operational elements by executing deactivation in a controlled manner.

In a step 1530, operational requirements are redistributed to remaining functional elements. Redistribution compensates for the lost capacity of isolated elements by adjusting commands to healthy elements. For microcell-level faults, neighboring microcells within the same zone may receive increased activation to maintain zone-level output. For zone-level faults, other zones within the same tile increase their contributions to maintain tile-level performance. For tile-level faults, remaining tiles in the panel operate at higher levels to compensate. Redistribution algorithms account for the capacity limits of functional elements to avoid overloading them, the spatial distribution of faults to maintain uniform coverage where possible, and power budget constraints that may limit total system output. The redistribution process may be gradual to avoid transients or immediate depending on the urgency of maintaining performance.

In a step 1540, operation continues in a degraded mode with reduced capacity. Degraded operation acknowledges that the system cannot achieve the same performance as when fully functional but maintains useful operation rather than shutting down completely. The degree of degradation depends on the number and location of faults, with capacity typically reducing proportionally to the fraction of isolated elements. Continuing operation despite faults provides several benefits including maintaining partial functionality until maintenance can be performed, preventing complete service interruption from localized failures, and enabling graceful shutdown if faults accumulate beyond acceptable levels. Controllers at each level adjust their objectives and constraints to account for reduced capacity, potentially relaxing performance targets or extending response times while keeping the system operational.

In a step 1550, fault status is reported upward through the hierarchical control architecture. Reporting ensures that higher levels are aware of faults occurring at lower levels, enabling coordinated response and informing system-level decisions. Microcell-level faults are reported to zone controllers, zone-level faults to tile controllers, and tile-level faults to panel supervisors. Reported information includes the identity of failed elements, the type and severity of faults, the time of fault occurrence, and the actions taken such as isolation and redistribution. Upward reporting enables each level to assess the impact of faults on its scope of responsibility and adjust its control strategy accordingly. In multi-panel systems, panel-level faults may be further reported to building supervisors for coordination across panels.

In a step 1560, diagnostic information is logged for maintenance scheduling and analysis. Logging creates permanent records of fault events that support post-fault analysis, maintenance planning, and system improvement. Logged information includes timestamps marking when faults occurred, affected elements identifying what failed, operational parameters immediately before and during fault detection, control actions taken in response, and system performance before and after fault isolation. This diagnostic data enables maintenance personnel to identify root causes of failures, predict when additional failures may occur based on patterns, schedule preventive maintenance for degrading elements, and assess the effectiveness of fault isolation and redistribution strategies. Long-term analysis of logged data may reveal systematic issues requiring design modifications or operational changes to improve reliability.

The method illustrated in FIG. 15 enables systems to tolerate faults without catastrophic failure, maintaining partial functionality despite degraded capacity and providing graceful degradation rather than complete shutdown when elements fail.

FIG. 16 is a flow diagram illustrating an exemplary method for deploying and operating multiple panels under building-level coordination. In a first step 1600, a plurality of panels are installed in different building locations. Installation positions panels in walls, ceilings, floors, or other building surfaces where they can interface with the spaces being regulated. Each panel is mechanically mounted to building structures using appropriate mounting hardware that secures the panel while enabling access for maintenance. Panel locations are selected based on spatial distribution of requirements, availability of suitable mounting surfaces, access to electrical and data infrastructure, and coverage needed to regulate the desired volumes. Multiple panels may be distributed throughout a building to provide localized regulation in different rooms or zones, or concentrated in areas with high requirements. Installation includes proper environmental sealing around panel edges to prevent air leakage and ensure effective operation.

In a step 1610, each panel is connected to centralized power distribution and data network infrastructure. Power distribution connections route electrical power from building electrical systems to panel power interfaces, providing the voltages and currents needed for control electronics and activation systems. Data network connections establish communication pathways between panels and central coordination systems, enabling command distribution and telemetry collection. Connections may employ wired interfaces such as dedicated power cables and data buses, or wireless interfaces for data communication where wiring is impractical. The infrastructure is designed to support the aggregate power requirements of all panels while maintaining isolation between panels to prevent faults in one panel from affecting power delivery to others. Data networks provide sufficient bandwidth for the communication requirements of all panels, accounting for both routine status updates and burst traffic during fault events or configuration changes.

In a step 1620, each panel supervisor is configured with location-specific parameters and setpoints. Configuration tailors panel operation to the specific requirements of its location, accounting for the characteristics of the space being regulated, expected environmental loads, available power budget, and operational priorities. Location-specific parameters may include target environmental conditions appropriate for the space type, permissible operating ranges accommodating local constraints, activation schedules aligned with occupancy patterns, and communication addresses enabling proper routing of commands and data. Configuration may be performed through local interfaces during installation, remotely through the data network, or through automated discovery protocols where panels identify their locations and retrieve appropriate configurations. Proper configuration ensures that each panel operates appropriately for its specific context rather than applying uniform settings across diverse locations.

In a step 1630, a building supervisor controller is initialized to coordinate all panels. Initialization establishes the building supervisor as the highest level in the control hierarchy, responsible for system-level coordination across all panels. The building supervisor discovers available panels through the data network, verifies communication with each panel supervisor, retrieves configuration and capability information from panels, and establishes the control framework for coordinated operation. Initialization may involve self-test procedures to verify proper system integration, calibration of control algorithms based on the number and locations of panels, and establishment of default operating modes. Once initialized, the building supervisor continuously monitors all panels and issues coordination commands to optimize overall building-level performance.

In a step 1640, operation is coordinated across multiple panels based on spatial load distribution. Coordination accounts for the spatial distribution of requirements across the building, recognizing that different locations may have different loads at any given time. Panels serving high-demand locations receive commands to operate at higher levels, while panels in low-demand areas operate at reduced levels or standby modes. Coordination prevents situations where some panels are overloaded while others are underutilized, instead distributing effort appropriately across available resources. The building supervisor computes coordination strategies based on load information from sensors, historical patterns, or predictive models, and adjusts panel operations dynamically as conditions change. Coordination may also account for interactions between adjacent spaces where operation of one panel affects conditions near other panels.

In a step 1650, commands are distributed from the building supervisor to individual panel supervisors. Command distribution implements the coordination strategy computed in step 1640 by sending specific operational commands to each panel. Commands may include setpoint adjustments changing target conditions, power limit modifications constraining panel operation within available budgets, mode changes selecting between different operational strategies, or priority assignments establishing relative importance when resources are limited. Distribution employs the data network established in step 1610, routing commands to appropriate panel supervisors based on addressing or routing protocols. Command distribution may be periodic with regular updates, event-driven when significant changes occur, or a combination where routine updates occur periodically with immediate updates for urgent changes. The building supervisor tracks command acknowledgment to verify that panels received and accepted commands.

In a step 1660, operational load is balanced across panels to optimize system-level performance. Load balancing adjusts panel operations to achieve system-level objectives while preventing individual panels from being overloaded. Balancing algorithms consider the capacity of each panel based on its size and configuration, the current utilization of each panel relative to its capacity, the spatial distribution of requirements across locations, and constraints such as power budgets or maximum operating levels. Optimization objectives may include minimizing peak power consumption by smoothing demand across panels, maintaining uniform performance across locations, maximizing total capacity utilization, or prioritizing critical spaces during resource limitations. Load balancing adapts continuously as conditions change, shifting resources from panels with excess capacity to panels approaching limits. Proper balancing prevents premature degradation of individual panels from excessive operation while ensuring that available capacity is effectively utilized.

In a step 1670, the system is scaled by adding additional panels to existing infrastructure. Scaling enables the system to expand as requirements grow or new spaces are added to the building without requiring replacement or modification of existing panels. Additional panels are installed following the same process as initial panels, connected to the existing power distribution and data network infrastructure, configured with location-specific parameters, and registered with the building supervisor. The modular architecture enables seamless integration of new panels, with the building supervisor automatically incorporating them into coordination and load balancing strategies. Scaling may occur incrementally with panels added one at a time, or in groups when multiple spaces are equipped simultaneously. The standardized panel interfaces and hierarchical control architecture ensure that system functionality and performance characteristics remain consistent regardless of the total number of panels deployed.

The method illustrated in FIG. 16 enables deployment of large-scale distributed systems spanning entire buildings or facilities, with coordinated operation across multiple panels optimizing overall performance while maintaining the modularity and scalability inherent in the hierarchical architecture.

Exemplary Computing Environment

Figure 17:
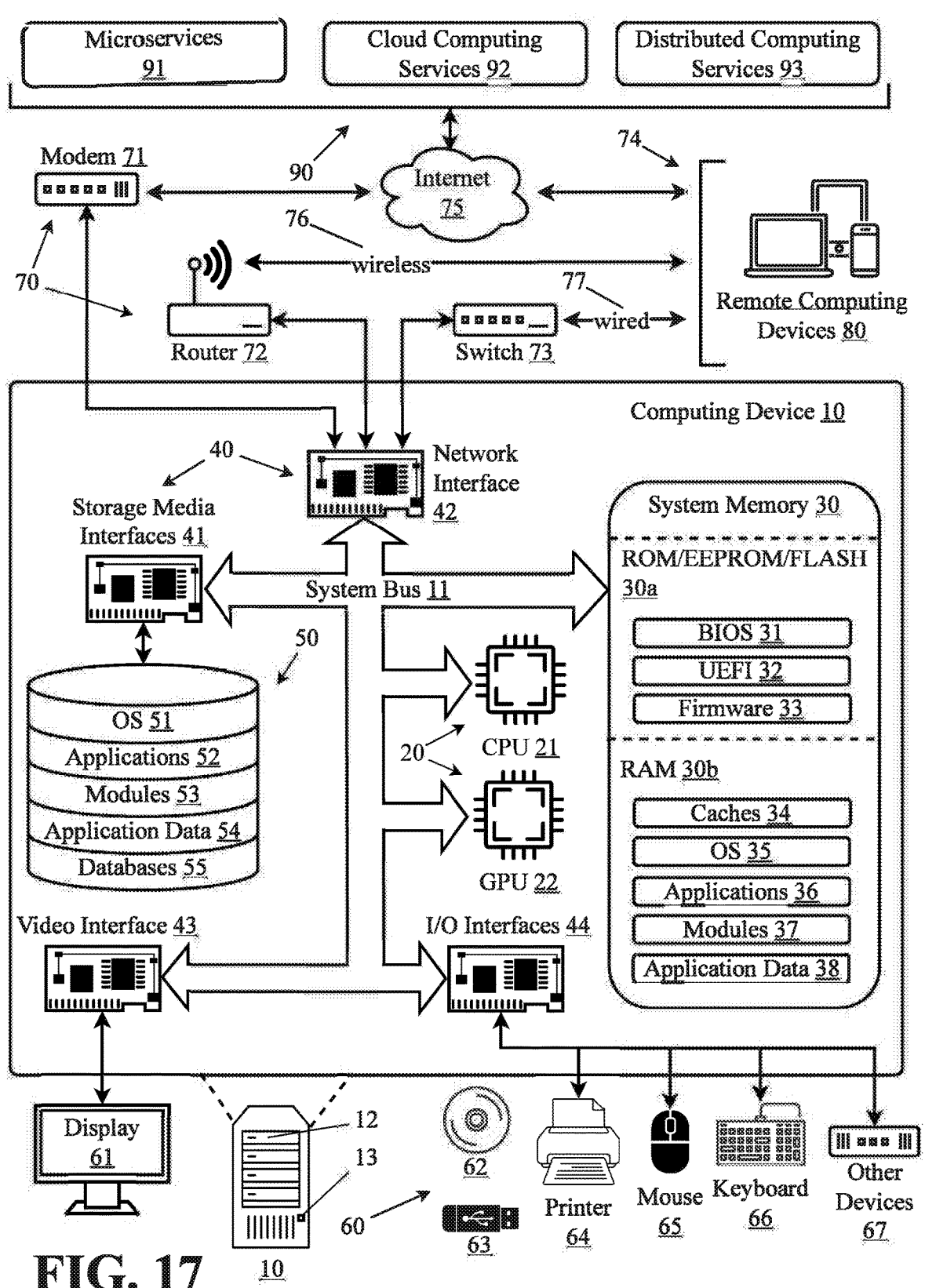
FIG. 17 illustrates an exemplary computing environment on which an embodiment described herein may be implemented.

FIG. 17 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 13 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions based on technologies like complex instruction set computer (CISC) or reduced instruction set computer (RISC). Further, computing device 10 may comprise one or more specialized processors such as a graphics processing unit (GPU) 22 configured to accelerate processing of computer graphics and images via a large array of specialized processing cores arranged in parallel. Further computing device 10 may be comprised of one or more specialized processes such as Intelligent Processing Units, field-programmable gate arrays or application-specific integrated circuits for specific tasks or types of tasks. The term processor may further include: neural processing units (NPUs) or neural computing units optimized for machine learning and artificial intelligence workloads using specialized architectures and data paths; tensor processing units (TPUs) designed to efficiently perform matrix multiplication and convolution operations used heavily in neural networks and deep learning applications; application-specific integrated circuits (ASICs) implementing custom logic for domain-specific tasks; application-specific instruction set processors (ASIPs) with instruction sets tailored for particular applications; field-programmable gate arrays (FPGAs) providing reconfigurable logic fabric that can be customized for specific processing tasks; processors operating on emerging computing paradigms such as quantum computing, optical computing, mechanical computing (e.g., using nanotechnology entities to transfer data), and so forth. Depending on configuration, computing device 10 may comprise one or more of any of the above types of processors in order to efficiently handle a variety of general purpose and specialized computing tasks. The specific processor configuration may be selected based on performance, power, cost, or other design constraints relevant to the intended application of computing device 10.

System memory 30 is processor-accessible data storage in the form of volatile and/or nonvolatile memory. System memory 30 may be either or both of two types: non-volatile memory and volatile memory. Non-volatile memory 30a is not erased when power to the memory is removed, and includes memory types such as read only memory (ROM), electronically-erasable programmable memory (EEPROM), and rewritable solid state memory (commonly known as "flash memory"). Non-volatile memory 30a is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30a may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30b is erased when power to the memory is removed and is typically used for short-term storage of data for processing. Volatile memory 30b includes memory types such as random-access memory (RAM), and is normally the primary operating memory into which the operating system 35, applications 36, program modules 37, and application data 38 are loaded for execution by processors 20. Volatile memory 30b is generally faster than non-volatile memory 30a due to its electrical characteristics and is directly accessible to processors 20 for processing of instructions and data storage and retrieval. Volatile memory 30b may comprise one or more smaller cache memories which operate at a higher clock speed and are typically placed on the same IC as the processors to improve performance.

There are several types of computer memory, each with its own characteristics and use cases. System memory 30 may be configured in one or more of the several types described herein, including high bandwidth memory (HBM) and advanced packaging technologies like chip-on-wafer-on-substrate (CoWoS). Static random access memory (SRAM) provides fast, low-latency memory used for cache memory in processors, but is more expensive and consumes more power compared to dynamic random access memory (DRAM). SRAM retains data as long as power is supplied. DRAM is the main memory in most computer systems and is slower than SRAM but cheaper and more dense. DRAM requires periodic refresh to retain data. NAND flash is a type of non-volatile memory used for storage in solid state drives (SSDs) and mobile devices and provides high density and lower cost per bit compared to DRAM with the trade-off of slower write speeds and limited write endurance. HBM is an emerging memory technology that provides high bandwidth and low power consumption which stacks multiple DRAM dies vertically, connected by through-silicon vias (TSVs). HBM offers much higher bandwidth (up to 1 TB/s) compared to traditional DRAM and may be used in high-performance graphics cards, AI accelerators, and edge computing devices. Advanced packaging and CoWoS are technologies that enable the integration of multiple chips or dies into a single package. CoWoS is a 2.5D packaging technology that interconnects multiple dies side-by-side on a silicon interposer and allows for higher bandwidth, lower latency, and reduced power consumption compared to traditional PCB-based packaging. This technology enables the integration of heterogeneous dies (e.g., CPU, GPU, HBM) in a single package and may be used in high-performance computing, AI accelerators, and edge computing devices.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. In some high-performance computing systems, multiple GPUs may be connected using NVLink bridges, which provide high-bandwidth, low-latency interconnects between GPUs. NVLink bridges enable faster data transfer between GPUs, allowing for more efficient parallel processing and improved performance in applications such as machine learning, scientific simulations, and graphics rendering. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, NoSQL databases, vector databases, key-value databases, document oriented data stores, and graph databases.

Applications (also known as computer software or software applications) are sets of programming instructions designed to perform specific tasks or provide specific functionality on a computer or other computing devices. Applications are typically written in high-level programming languages such as C, C++, Scala, Erlang, GoLang, Java, Scala, Rust, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems facilitated by specifications such as containerd.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network or optical transmitters (e.g., lasers). Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired

77 connection, through router 72 via a wireless connection 76, or through modem 71 via the Internet 75. Furthermore, while not shown here, other hardware that is specifically designed for servers or networking functions may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices or intermediate networking equipment (e.g., for deep packet inspection).

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is containerd, which is widely used in software development and deployment. Containerization, particularly with open-source technologies like Docker and container orchestration systems like Kubernetes, is a common approach for deploying and managing applications. Containers are created from images, which are lightweight, standalone, and executable packages that include application code, libraries, dependencies, and runtime. Images are often built from a Dockerfile or similar, which contains instructions for assembling the image. Dockerfiles are configuration files that specify how to build a Docker image. Systems like Kubernetes also support containerd or CRI-O. They include commands for installing dependencies, copying files, setting environment variables, and defining runtime configurations. Docker images are stored in repositories, which can be public or private. Docker Hub is an exemplary public registry, and organizations often set up private registries for security and version control using tools such as Hub, JFrog Artifactory and Bintray, Gitlab, Github Packages or Container registries. Containers can communicate with each other and the external world through networking. Docker provides a bridge network by default, but can be used with custom networks. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, mainframe computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are serverless logic apps, microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, protobuffers, gRPC or message queues such as Kafka. Microservices 91 can be combined to perform more complex or distributed processing tasks. In an embodiment, Kubernetes clusters with containerd resources is used for operational packaging of system.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over public or private networks or the Internet on a subscription or alternative licensing basis, or consumption or ad-hoc marketplace basis, or combination thereof.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power or support for highly dynamic compute, transport or storage resource variance over time requiring scaling up and down of constituent system resources. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, NVLink or other GPU-to-GPU high bandwidth communications links and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents.

What is claimed is:

1. A hierarchical energy regulation system comprising:
a plurality of microcells organized into a plurality of zones, wherein each microcell comprises:
a substrate with a plurality of surface features;
an opposing membrane defining a gap relative to the substrate;
activation electrodes configured to generate activation fields across the gap; and
gap-control elements configured to maintain the gap at a target value;
a plurality of zone controllers, wherein each zone controller coordinates operation of microcells within a respective zone;
a plurality of tiles, each tile comprising:
multiple zones under coordinated control;
a tile controller in communication with zone controllers within the tile;
a power interface; and
a data interface;
a support structure to which the plurality of tiles are mounted; and
a panel supervisor controller in communication with tile controllers of the plurality of tiles, the panel supervisor controller configured to coordinate operation of all tiles within the panel;

wherein control responsibilities are partitioned across hierarchical levels comprising a microcell level, a zone level, a tile level, and a panel level, each hierarchical level operating at a distinct timescale.

2. The hierarchical energy regulation system of claim 1, wherein the microcell level operates at a faster timescale than the zone level, the zone level operates at a faster timescale than the tile level, and the tile level operates at a faster timescale than the panel level.

3. The hierarchical energy regulation system of claim 1, wherein:

measurements and status information propagate upward from zone controllers to tile controllers and from tile controllers to the panel supervisor controller; and commands and setpoints propagate downward from the panel supervisor controller to tile controllers and from tile controllers to zone controllers.

4. The hierarchical energy regulation system of claim 1, wherein each zone controller is configured to:

distribute activation signals to microcells within the respective zone;

monitor operational status of microcells within the respective zone; and report aggregated status information to a corresponding tile controller.

5. The hierarchical energy regulation system of claim 1, wherein each tile controller is configured to:

manage power distribution across zones within the respective tile;

coordinate activation timing between zones within the respective tile; and aggregate data from zone controllers for transmission to the panel supervisor controller.

6. The hierarchical energy regulation system of claim 1, wherein the panel supervisor controller is configured to:

receive environmental feedback from sensors;

compute operational strategies based on the environmental feedback and setpoints; and distribute commands to tile controllers to implement the operational strategies.

7. A method of operating a hierarchical energy regulation system, the method comprising:

organizing a plurality of microcells into a plurality of zones, wherein each microcell comprises a substrate with a plurality of surface features, an opposing membrane defining a gap relative to the substrate, activation electrodes, and gap-control elements;

assembling a plurality of tiles mounted to a support structure, wherein each tile comprises multiple zones under coordinated control, a tile controller, a power interface, and a data interface;

partitioning control responsibilities across hierarchical levels comprising a microcell level, a zone level, a tile level, and a panel level, wherein each hierarchical level operates at a distinct timescale;

establishing target gap values for microcells within the plurality of zones;

engaging gap-control elements at the microcell level to maintain gaps at the target values through feedback control;

applying electrical signals to the activation electrodes to generate activation fields across the gaps;

coordinating operation across the hierarchical levels by:

executing microcell-level control at a first timescale;

executing zone-level coordination at a second timescale slower than the first timescale;

executing tile-level management at a third timescale slower than the second timescale; and executing panel-level supervision at a fourth timescale slower than the third timescale;

establishing bidirectional data flow through the hierarchy, wherein measurements propagate upward from the microcell level to the panel level and commands propagate downward from the panel level to the microcell level; and maintaining system operation through coordinated control across all hierarchical levels.

8. The method of claim 7, wherein establishing bidirectional data flow further comprises:

aggregating measurements from multiple microcells at the zone level before transmission to the tile level; and aggregating data from multiple zones at the tile level before transmission to the panel level.

9. The method of claim 7, wherein engaging gap-control elements comprises:

measuring current gap spacing using sensors at each microcell;

computing control signals based on differences between measured spacing and target gap values; and applying the control signals to actuators to adjust positions of opposing membranes relative to substrates.

10. The method of claim 7, further comprising:

detecting a fault condition at one of the hierarchical levels;

isolating a faulty element by deactivating the faulty element and excluding the faulty element from operation; and redistributing operational requirements to remaining functional elements.

11. The method of claim 7, wherein coordinating operation across the hierarchical levels comprises:

establishing gap control at the microcell level before initiating zone-level coordination;

achieving zone-level stability before initiating tile-level management; and achieving tile-level stability before initiating panel-level supervision.

12. The method of claim 7, wherein executing panel-level supervision comprises:

receiving environmental measurements from sensors;

comparing the environmental measurements to setpoints; and adjusting commands distributed to tile controllers based on differences between the environmental measurements and the setpoints.

* * * * *